United States Patent
Iwata et al.

(10) Patent No.: US 7,164,167 B2
(45) Date of Patent: Jan. 16, 2007

(54) SEMICONDUCTOR STORAGE DEVICE, ITS MANUFACTURING METHOD AND OPERATING METHOD, AND PORTABLE ELECTRONIC APPARATUS

(75) Inventors: Hiroshi Iwata, Nara (JP); Akihide Shibata, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 304 days.

(21) Appl. No.: 10/480,893

(22) PCT Filed: Nov. 18, 2002

(86) PCT No.: PCT/JP02/12028

§ 371 (c)(1),
(2), (4) Date: Dec. 15, 2003

(87) PCT Pub. No.: WO03/044868

PCT Pub. Date: May 30, 2003

(65) Prior Publication Data

US 2004/0164359 A1  Aug. 26, 2004

(30) Foreign Application Priority Data

Nov. 21, 2001 (JP) ............................. 2001-356549

(51) Int. Cl.
*H01L 29/788* (2006.01)
*H01L 29/76* (2006.01)

(52) U.S. Cl. .................. 257/315; 257/314; 257/316
(58) Field of Classification Search .................. None
See application file for complete search history.

(56) References Cited

U.S. PATENT DOCUMENTS 4,881,108 A   11/1989   Yoshikawa
5,408,115 A * 4/1995   Chang ........................ 257/324
5,614,748 A * 3/1997   Nakajima et al. ........... 257/316
5,838,041 A * 11/1998  Sakagami et al. .......... 257/324

(Continued)

FOREIGN PATENT DOCUMENTS

JP   63-204770   8/1988

(Continued)

OTHER PUBLICATIONS

Durlam et al., Nonvolatile RAM based on Magnetic Tunnel Junction Elements, 2000 IEEE International Solid-State Circuits Conference Digest of Technical Papers, Feb. 8, 2000; pp. 130-131.

*Primary Examiner*—Evan Pert
*Assistant Examiner*—Victor A. Mandala, Jr.
(74) *Attorney, Agent, or Firm*—Birch, Stewart, Kolasch & Birch, LLP

(57) ABSTRACT

The present invention provides a semiconductor storage device having: a first conductivity type region formed in a semiconductor layer; a second conductivity type region formed in the semiconductor layer in contact with the first conductivity type region; a memory functional element disposed on the semiconductor layer across the boundary of the first and second conductivity type regions; and an electrode provided in contact with the memory functional element and on the first conductivity type region via an insulation film, and a portable electronic apparatus comprising the semiconductor storage device. The present invention can fully cope with scale-down and high-integration by constituting a selectable memory cell substantially of one device.

33 Claims, 36 Drawing Sheets

U.S. PATENT DOCUMENTS

| | | | |
|---|---|---|---|
| 5,929,480 A * | 7/1999 | Hisamune | 257/320 |
| 6,314,021 B1 * | 11/2001 | Maeda et al. | 365/185.01 |
| 6,335,554 B1 * | 1/2002 | Yoshikawa | 257/316 |
| 6,518,619 B1 * | 2/2003 | Verhaar et al. | 257/316 |
| 6,522,347 B1 * | 2/2003 | Tsuji et al. | 715/848 |
| 6,642,586 B1 * | 11/2003 | Takahashi | 257/390 |
| 6,927,133 B1 * | 8/2005 | Takahashi | 438/267 |
| 2002/0040992 A1 * | 4/2002 | Manabe et al. | 257/314 |
| 2004/0108512 A1 | 6/2004 | Iwata et al. | |
| 2004/0160828 A1 | 8/2004 | Iwata et al. | |

FOREIGN PATENT DOCUMENTS

| | | |
|---|---|---|
| JP | 5-81072 | 11/1993 |
| JP | 6-232412 A | 8/1994 |
| JP | 8-191110 | 7/1996 |
| JP | 9-097849 | 4/1997 |
| JP | 9-116119 | 5/1997 |
| JP | 9-252059 A | 9/1997 |
| JP | 11-274331 | 10/1999 |
| JP | 11-274331 A | 10/1999 |
| JP | 2001-77218 A | 3/2001 |
| JP | 2001-110918 A | 4/2001 |
| JP | 2001-156188 | 6/2001 |
| JP | 2001-156188 A | 6/2001 |
| JP | 2001-156189 | 6/2001 |
| JP | 2001-156188 * | 8/2001 |
| JP | 2001-230332 A | 8/2001 |
| JP | 2001-237330 A | 8/2001 |
| JP | 2001-512290 A | 8/2001 |
| JP | 2001156188 * | 8/2001 |
| JP | 2002-164446 | 6/2002 |
| WO | WO-02-067320 A | 2/2002 |

* cited by examiner

EFFECT OF VARIABLE RESISTANCE

SEMICONDUCTOR STORAGE DEVICE, ITS MANUFACTURING METHOD AND OPERATING METHOD, AND PORTABLE ELECTRONIC APPARATUS

This application is the national phase under 35 U.S.C. § 371 of PCT International Application No. PCT/JP02/12028, which has an International filing date of Nov. 18, 2002, which designated the United States of America.

This nonprovisional application claims priority under 35 U.S.C. § 119(a) on Patent Application No. 2001-356549 filed in JAPAN on Nov. 21, 2001, which is herein incorporated by reference.

TECHNICAL FIELD

The present invention relates to a semiconductor storage device, its manufacturing method and operating method, and a portable electronic apparatus. More particularly, the present invention relates to a semiconductor storage device which is a device having the function of converting a change in a charge amount into a current amount, its manufacturing method and operating method, and a portable electronic apparatus using such a semiconductor storage device.

BACKGROUND ART

Conventionally, as a nonvolatile memory using a resistance value of a variable resistor as storage information, rewriting the storage information by changing the resistance value, and reading out the storage information by detecting the resistance value, there is an MRAM (Magnetic Random Access Memory) (M. Durlam et al., Nonvolatile Ram Based on Magnetic Tunnel Junction Elements, International Solid-State Circuits Conference Digest of Technical Papers, pp. 130–131, February 2000).

FIG. 36(a) is a schematic sectional view of one memory cell constituting such an MRAM and FIG. 36(b) is an equivalent circuit diagram.

The memory cell is constituted in such a manner that a variable resistor 911 and a selection transistor 912 are connected to each other via a metal wire 917 and a contact plug 918. In addition, a bit line 914 is connected to one end of the variable resistor 911.

The variable resistor 911 is constituted by MTJ (Magnetic Tunnel Junction) and is sandwiched by a rewrite word line 913 extended in a direction orthogonal to the bit line 914 and the bit line at the crossing point of the lines.

The selection transistor 912 is constituted by a pair of diffusion regions 920 formed on a semiconductor substrate 919 and a gate electrode. One of the diffusion regions 920 is connected to the variable resistor 911 via the metal wire 917 and the contact plug 918, and the other diffusion region is connected to a source line 915. The gate electrode constitutes a selection word line 916.

A rewriting operation of the MRAM is performed in such a manner that a composite magnetic field generated by current flowing in the bit line 914 and the rewrite word line 913 changes the resistance value of the variable resistor 911. On the other hand, a reading operation is performed in such a manner that the selection transistor 912 is turned on and a current value flowing in the variable resistor 911, that is, the resistance value of the variable resistor 911 is detected.

As described above, a memory cell of the MRAM is constituted by two devices: the variable resistor 911 which is a device having three terminals; and the selection transistor 912 which is a device having three terminals. Consequently, it is limited and difficult to realize further scale-down and increase in capacity of a memory.

DISCLOSURE OF THE INVENTION

An object of the present invention is to provide a semiconductor storage device capable of fully coping with scale-down and high-integration by constituting a selectable memory cell substantially of one device, its manufacturing method and operating method, and a portable electronic apparatus having such a semiconductor storage device.

According to the present invention, there is provided a semiconductor storage device comprising: a first conductivity type region formed in a semiconductor layer; a second conductivity type region formed in contact with the first conductivity type region in the semiconductor layer; a memory functional element disposed on the semiconductor layer across the boundary of the first and second conductivity type regions; and an electrode provided in contact with the memory functional element and on the first conductivity type region via an insulation film.

There is also provided a semiconductor storage device comprising: a first conductivity type region formed in a semiconductor layer; two second conductivity type regions formed on both sides of the first conductivity type region in the semiconductor layer; two memory functional elements each disposed on the semiconductor layer across the boundaries of the first and second conductivity type regions; and electrodes provided in contact with each of the memory functional elements and on the first conductivity type region via an insulation film.

Further, there is provided a semiconductor storage device comprising: a channel region formed in a, semiconductor layer; variable resistance regions provided on both sides of the channel region; two diffusion regions provided on both sides of the channel region via the variable resistance regions; a gate electrode provided on the channel region via a gate insulation film; and two memory functional elements disposed on both sides of the gate electrode each across the variable resistance regions and a part of the diffusion regions.

There is also provided a semiconductor storage device comprising: a gate electrode formed on a semiconductor layer via a gate insulation film; a channel region provided under the gate electrode; diffusion regions disposed on both sides of the channel region and having a conductivity type different from the conductivity type of the channel region; and memory functional elements for holding charges, formed on both sides of the gate electrode so as to overlap with the diffusion regions.

Further, there is provided a semiconductor storage device comprising at least one memory cell including: a semiconductor layer disposed on a semiconductor substrate, a well region provided in the semiconductor substrate, or an insulator; a single gate electrode formed on the semiconductor substrate or the semiconductor layer via a gate insulation film; a channel region disposed under the gate electrode; two diffusion regions formed on both sides of the channel region; and two memory functional elements formed on both sides of the gate electrode so as to overlap with the diffusion regions.

There is also provided a semiconductor storage device comprising at least one memory cell including: a semiconductor layer disposed on a semiconductor substrate, a well region provided in the semiconductor substrate, or an insulator; a gate insulation film formed on the semiconductor layer which is disposed on the semiconductor substrate, the well region provided in the semiconductor substrate, or the insulator; a single gate electrode formed on the gate insulation film; a channel region disposed immediately below the gate electrode; two diffusion regions disposed on both sides of the channel region; and sidewall insulation films formed on both sides of the gate electrode so as to overlap with the diffusion regions, wherein the sidewall insulation films have the function of holding charges.

Further, there is provided a semiconductor storage device comprising: a semiconductor substrate; a first conductivity type well region formed in the semiconductor substrate; a gate insulation film formed on the well region; a plurality of word lines formed on the gate insulation film; a plurality of second conductivity type diffusion regions formed on both sides of each of the word lines; charge holding films having the function of accumulating or trapping charges, formed on both sides of the plurality of word lines on the word lines, the well region, and the diffusion regions directly or via an insulation film on at least a part of the diffusion region or so as to extend from a part of the well region to a part of the diffusion region; and a plurality of bit lines connected to the diffusion regions and extending in a direction which crosses the word lines.

There is also provided a semiconductor storage device comprising: a gate electrode formed on a semiconductor layer via a gate insulation film; memory functional elements formed on both sides of the gate electrode and having the function of holding charges; two diffusion regions each disposed on the side opposite to the gate electrode of the memory functional elements; and a channel region disposed under the gate electrode, wherein the memory functional element includes a film having the function of holding charges, and at least a part of the film having the function of holding charges is formed so as to overlap with a part of the diffusion region.

Further, there is provided a semiconductor storage device comprising: a first conductivity type semiconductor layer; a gate insulation film formed on the first conductivity type semiconductor layer; a gate electrode formed on the gate insulation film; memory functional elements formed on both sides of the gate electrode and having the function of holding charges; and two second conductivity type diffusion regions each disposed on the side opposite to the gate electrode of the memory functional elements, wherein the memory functional element includes a film having the function of holding charges, at least a part of the film having the function of holding charges overlaps with at least a part of the diffusion region, and the first conductivity type semiconductor layer has a first conductivity type high-concentration region having a concentration higher than that of a portion in the vicinity of the surface of the first conductivity type semiconductor layer under the gate electrode, under the memory functional element and in the vicinity of the diffusion region.

There is also provided a semiconductor storage device comprising: a gate insulation film; a gate electrode formed on the gate insulation film; memory functional elements formed on both sides of the gate electrode and having the function of holding charges; two diffusion regions each disposed on the side opposite to the gate electrode of the memory functional elements; and a channel region disposed under the gate electrode, wherein when a length of the gate electrode in a channel length direction is A, a channel length between the diffusion regions is B, and a distance from an end of one of the memory functional elements to an end of the other memory functional element is C, a relation of $A<B<C$ is satisfied.

Further, there is provided a semiconductor storage device comprising: a gate insulation film; a gate electrode formed on the gate insulation film; memory functional elements formed on both sides of the gate electrode and having the function of holding charges; two N-type diffusion regions each disposed on the side opposite to the gate electrode of the memory functional element; and a channel region disposed under the gate electrode, wherein magnitude of a voltage applied to one of the diffusion regions and magnitude of a voltage applied to the other diffusion region are reversed between the time of changing a storage state by injecting electrons into the memory functional element and the time of reading out the storage state of the memory functional element.

There is also provided a semiconductor storage device comprising: a gate insulation film; a gate electrode formed on the gate insulation film; memory functional elements formed on both sides of the gate electrode and having the function of holding charges; two P-type diffusion regions each disposed on the side opposite to the gate electrode of the memory functional element; and a channel region disposed under the gate electrode, wherein magnitude of a voltage applied to one of the source and drain regions and magnitude of a voltage applied to the other region are reversed between the time of changing a storage state by injecting holes into the memory functional element and the time of reading out the storage state of the memory functional element.

Further, there is provided a manufacturing method of a semiconductor storage device, comprising the steps of: forming a gate insulation film and a gate electrode on a semiconductor substrate; depositing an insulation film having the function of accumulating or trapping charges on the whole surface of the obtained substrate; and forming a sidewall insulation film on a sidewall of the gate electrode by selectively etching the insulation film.

According to another aspect, there is provided an operating method of a semiconductor storage device comprising: a single gate electrode formed on a P-type semiconductor layer disposed on a P-type semiconductor substrate, a P-type well region formed in the semiconductor substrate, or an insulator; a channel region disposed under the single gate electrode; two N-type source/drain regions positioned on both sides of the channel region; and a memory functional element existing in the vicinity of the source/drain regions, wherein one of the source/drain regions is set to a reference voltage, the gate electrode is set to a voltage lower than the reference voltage, the semiconductor layer formed on the semiconductor substrate, the well region formed in the semiconductor substrate, or the insulator is set to a voltage higher than the reference voltage, and the other source/drain region is set to a voltage higher than the semiconductor layer formed on the semiconductor substrate, the well region formed in the semiconductor substrate, or the insulator, thereby injecting holes into the memory functional element.

Further, there is provided an operating method of a semiconductor storage device comprising: a single gate electrode formed on an N-type semiconductor layer disposed on an N-type semiconductor substrate, an N-type well region formed in the semiconductor substrate, or an insulator; a channel region under the single gate electrode; two P-type source/drain regions positioned on both sides of the channel region; and a memory functional element existing in the vicinity of the source/drain regions, wherein one of the source/drain regions is set to a reference voltage, the gate electrode is set to a voltage higher than the reference voltage, the semiconductor layer disposed on the semiconductor substrate, the well region formed in the semiconductor substrate, or the insulator is set to a voltage lower than the reference voltage, and the other source/drain region is set to a voltage lower than the semiconductor layer disposed on the semiconductor substrate, the well region formed in the semiconductor substrate, or the insulator, thereby injecting electrons into the memory functional element.

There is also provided a portable electronic apparatus comprising the semiconductor storage device.

BEST MODE FOR CARRYING OUT THE INVENTION

Hereinafter, description will be given of a semiconductor storage device, its manufacturing method and a portable electronic apparatus of the present invention with reference to the drawings in detail. In the following description, conductivity types may be reversed and the constituent features described in each of embodiments may be applied to other embodiments.

Embodiment 1

A semiconductor storage device of Embodiment 1 is substantially constituted by a single three-terminal device having a variable resistor.

Figure 1:
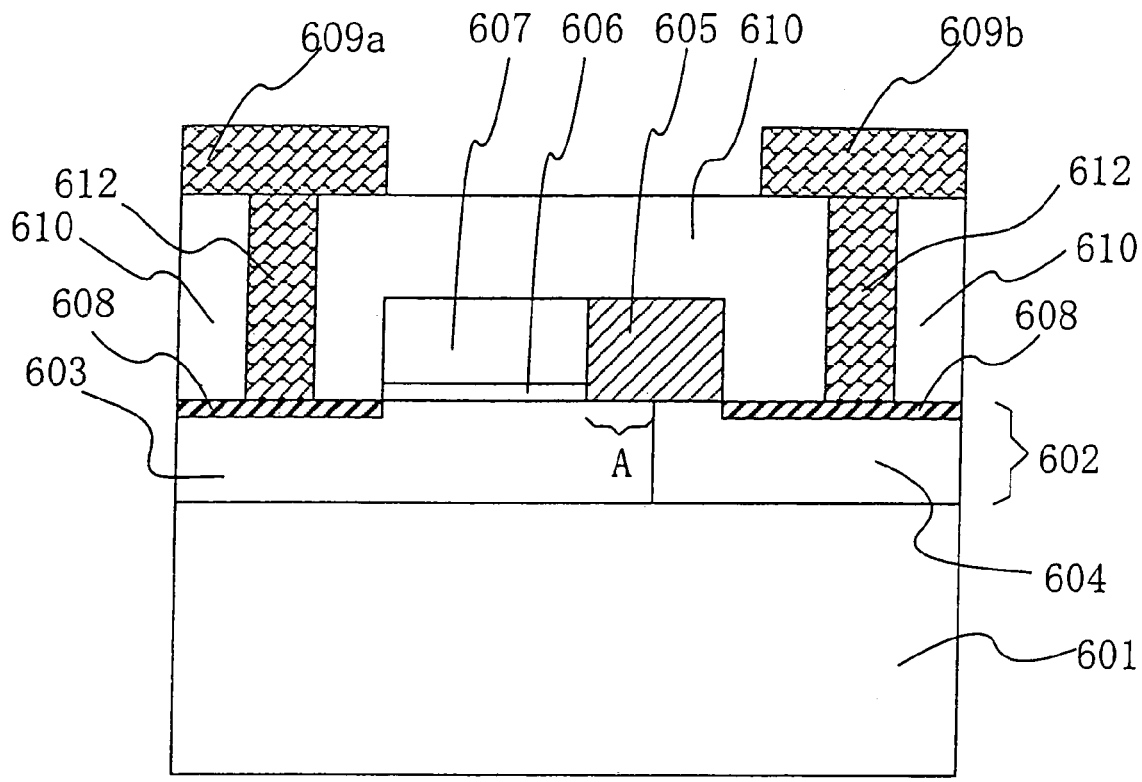
FIG. 1 is a schematic sectional view and an equivalent circuit of a main part of a semiconductor storage device (Embodiment 1) of the present invention.
Figure 1B:
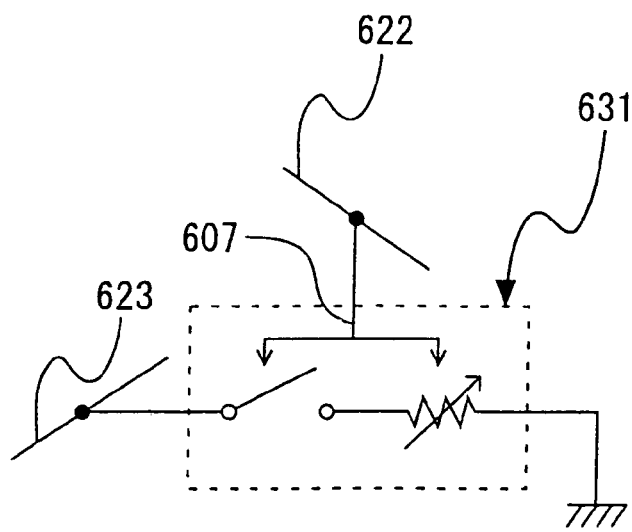

FIG. 1(a) is a schematic sectional view of a memory cell of a storage device formed on a glass panel of a liquid crystal TFT display device, as an example of the semiconductor storage device of the present invention. The storage device is used for adjusting an image. FIG. 1(b) is an equivalent circuit diagram of the memory cell.

As shown in FIG. 1(a), the memory cell has: a P-type diffusion region 603 formed in a semiconductor layer 602 on a glass panel 601; an N-type diffusion region 604 formed in contact with the P-type diffusion region 603 in the semiconductor layer 602; a memory functional element 605 disposed on the semiconductor layer 602 across the boundary of the P-type diffusion region 603 and the N-type diffusion region 604; and a single electrode 607, which is in contact with the memory functional element 605, formed on the P-type diffusion region 603 via an insulation film 606 so as to be insulated from the P-type diffusion region 603. Further, a refractory metal silicide film 608 is formed on the surface of the P-type diffusion region 603. A wire 609a is connected to the refractory metal silicide film 608. The refractory metal silicide film 608 is also formed on the surface of the N-type diffusion region 604. A wire 609b is connected to the refractory metal silicide film 608. The wires 609a and 609b are connected to the refractory metal silicide 608 via contact plugs 612 filling contact holes opened in an interlayer insulation film 610.

As shown in FIG. 1(b), a portion in the vicinity of the surface of the P-type diffusion region 603 and under the electrode 607 has a switch function. A portion in the vicinity of the surface of the P-type diffusion region 603 and under the memory functional element 605 serves as a variable resistor A. The electrode 607 has the function of an input terminal for changing over the switch. The switch and the variable resistor A are formed under the electrode 607 and the memory functional element 605 formed adjacent to the electrode 607 (formed on the sidewall of the electrode 607). That is, the switch and the variable resistor A are formed so as to be adjacent to each other in a position defined by the boundary between the electrode 607 and the memory functional element 605, and are substantially integral. Therefore, the switch, the variable resistor and the electrode 607 are constituted by one device 631.

In the case of constituting a memory cell array by arranging a plurality of memory cells, it is sufficient to connect the electrode 607 to a word line 622 and to connect one end of the device 631 to a bit line 623.

The memory cell can be read/rewritten by applying predetermined voltages to the P-type diffusion region 603, the N-type diffusion region 604, and the electrode 607 functioning as a selection word line.

For example, by setting the voltage of the P-type diffusion region 603 as a reference potential, a voltage in the positive direction with respect to the reference potential is applied to the N-type diffusion region 604. At this time, by setting the electrode 607 in a non-selection state (for example, a state where the reference voltage is applied), the portion under the electrode 607 remains in the P-type. Consequently, the PN junction between the P-type diffusion region 603 and the N-type diffusion region 604 is reverse-biased and only a PN reverse-direction current flows between the wires 609a and 609b. The current value can be almost ignored. On the other hand, when the electrode 607 is set to a selection state (for example, a voltage in the positive direction with respect to the reference voltage is applied), the portion under the electrode 607 is inverted to the N-type, so that a current according to the resistance value of the variable resistor A flows. Therefore, by detecting the current, memory information can be read out.

The resistance value of the variable resistor A can be changed, that is, rewritten according to an amount of charges accumulated in the memory functional element 605. In order to accumulate charges in the memory functional element 605, by setting the P-type diffusion region 603 to a reference voltage and applying a reverse bias voltage which is very large as compared with that used at the time of reading (for example, three times or more as large as the potential difference at the time of reading) to the N-type diffusion region 604, an interband tunnel current is used. Specifically, electrons are accumulated in the memory functional element 605 when a positive voltage with respect to the reference voltage is applied to the electrode 607, and holes are accumulated in the memory functional element 605 when a negative voltage is applied to the electrode 607. By setting the P-type diffusion region 603 to a reference voltage, applying a relatively large reverse bias (for example, about twice or three times as large as that at the time of reading) to the N-type diffusion region 604, and simultaneously applying a positive voltage to the electrode 607, charges may be accumulated in the memory functional element 605 by channel hot electrons. Alternatively, charges may be accumulated in the memory functional element 605 by both of them.

In the case where the N-type diffusion region 604 and the P-type diffusion region 603 have reverse conductivity types, by reversing all of the signs of the above applied voltages, rewriting operation can be performed similarly.

As described above, the memory cell of this embodiment is constituted by substantially one device, and the device has only three terminals. It is therefore possible to realize scale-down and high-integration of the semiconductor storage device.

The memory functional element 605 includes, at least, a region for holding charges or a film having the function of accumulating and holding charges. Further, the memory functional element 605 preferably includes a region which suppresses escape of charges or a film having the function of suppressing escape of charges. For example, in the memory functional element 605, the faces in contact with the P-type diffusion region 603, N-type diffusion region 604 and electrode 607 are constituted by a region which suppresses escape of charges, or the like so that the region for holding charges is not in direct contact with the P-type diffusion region 603, N-type diffusion region 604 and electrode 607, thereby enabling the reliability of storage and retention time to be dramatically improved. It is very important from the viewpoint of improving reading speed that the region for holding charges, or the like in the memory functional element 605 is disposed across the boundary of the P-type diffusion region 603 and the N-type diffusion region 604.

Preferably, the electrode 607 is formed only on a sidewall of the memory functional element 605 or the top of the memory functional element 605 is not covered. With such arrangement, also in the case of achieving scale-down by disposing the contact plug 612 and the electrode 607 or the contact plug 612 and the memory functional element 605 so as to be close to each other or overlapped with each other, the electrode 607 and the wire 609b can be prevented from being short-circuited.

The refractory metal silicide film 608 can be formed of silicide of a high refractory metal such as titanium, tantalum, molybdenum or tungsten. Connection between the P-type diffusion region 603 and N-type diffusion region 604 and the refractory metal silicide film 608 may be ohmic contact or Schottky contact.

Figure 2:
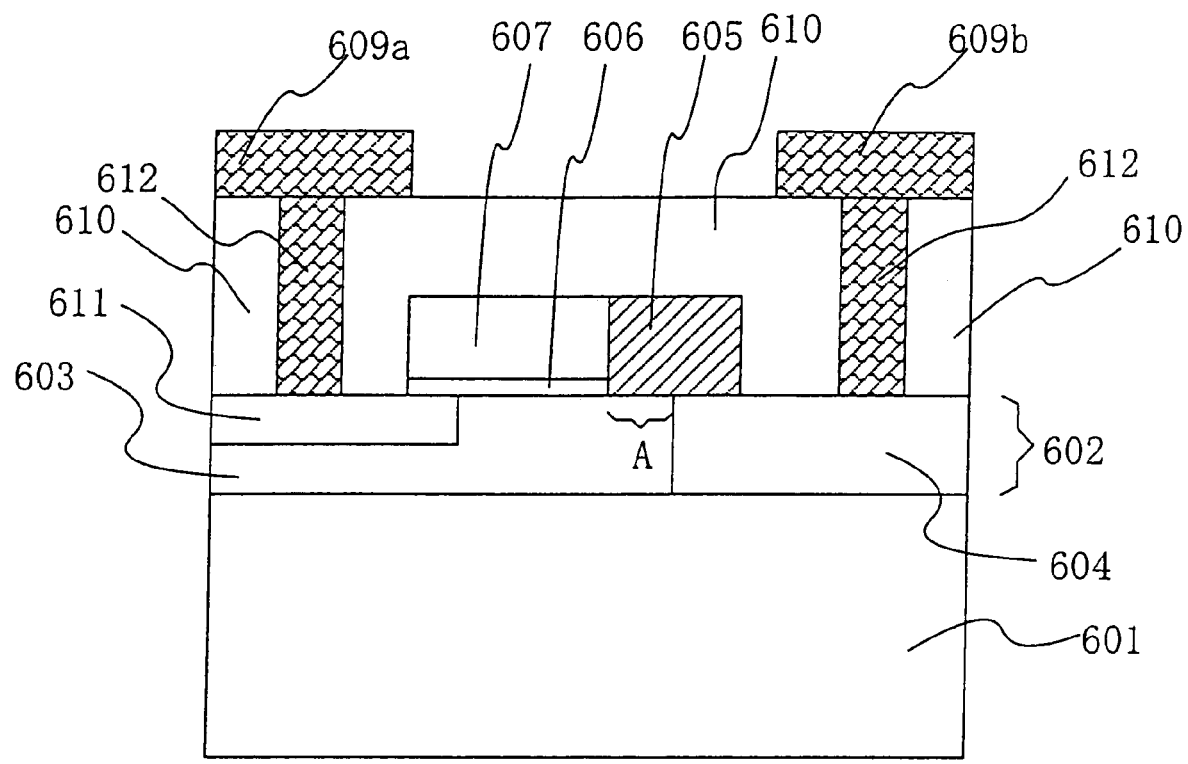
FIG. 2 is a schematic sectional view of a main part showing a modification of the semiconductor storage device (Embodiment 1) of the present invention.

As shown in FIG. 2, the wire 609a and the P-type diffusion region 603 may be connected to each other via an N-type diffusion region 611 which is formed in the P-type diffusion region 603 without forming the refractory metal silicide film 608.

Embodiment 2

Figure 3:
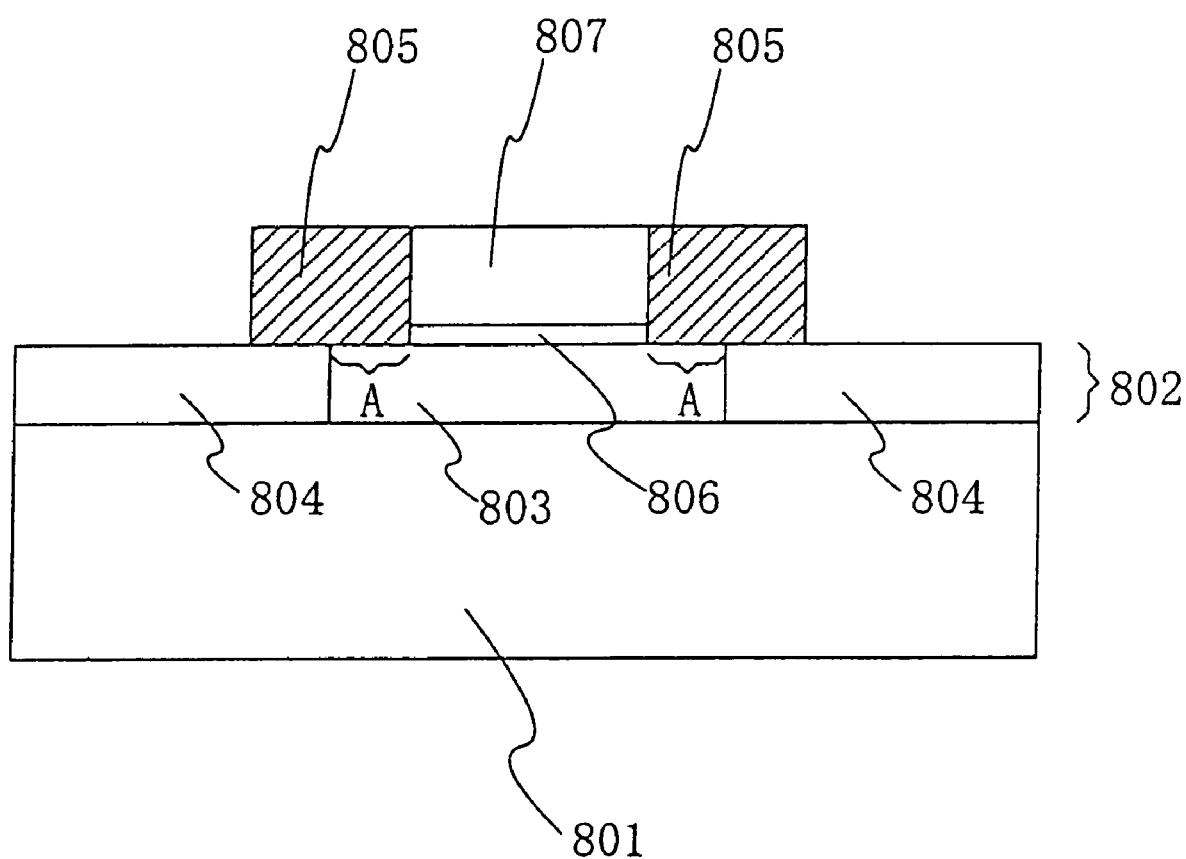
FIG. 3 is a schematic sectional view of a main part of a semiconductor storage device (Embodiment 2) of the present invention.

In a semiconductor storage device of the present invention, as shown in FIG. 3, memory functional films 805 may be formed on both sides of an electrode 807. Specifically, the semiconductor storage device may have a configuration substantially the same as that of the memory cell of Embodiment 1 except that the components are provided so as to be symmetrical with respect to the electrode 607 of the memory cell shown in Embodiment 1 as a center.

With such a configuration, the degree of integration can be further improved as compared with Embodiment 1.

By the electrode 807, storage informations of the two memory functional elements 805 (resistance informations of the variable resistors A according to amounts of charges accumulated in the memory functional elements 805) can be independently read out as amounts of currents flowing in two N-type diffusion regions 804. For example, a reference voltage is applied to one of the two N-type diffusion regions 804 and a positive voltage is applied to the electrode 807, thereby forming an inversion layer in a P-type diffusion region 803. At this time, further, a positive voltage sufficient to deplete a part of the inversion layer (which becomes a depletion layer) is applied to the other N-type diffusion region 804. By this application, the variable resistor A on the side where the inversion layer is depleted substantially loses the function of a variable resistor due to depletion. It is therefore possible to read out only the information of the variable resistor A on the side of one of the N-type diffusion regions 804 as the amount of current flowing between the two N-type diffusion regions 804.

By such a method, the charges are independently accumulated in read out each of the two memory functional elements 805, thereby enabling one memory cell to store 2-bit (four-value) information.

Moreover, by making the amount of charges accumulated in the memory functional elements have multiple values (three or larger values), the information amount can be further increased. For example, by storing three-value information in each of the memory functional elements 805, information of nine values can be stored per one memory cell. When four values are stored in each memory functional element, 16 values (four bits) can be stored. When eight values are stored in each memory functional element, 64 values (six bits) can be stored.

Embodiment 3

Figure 4:
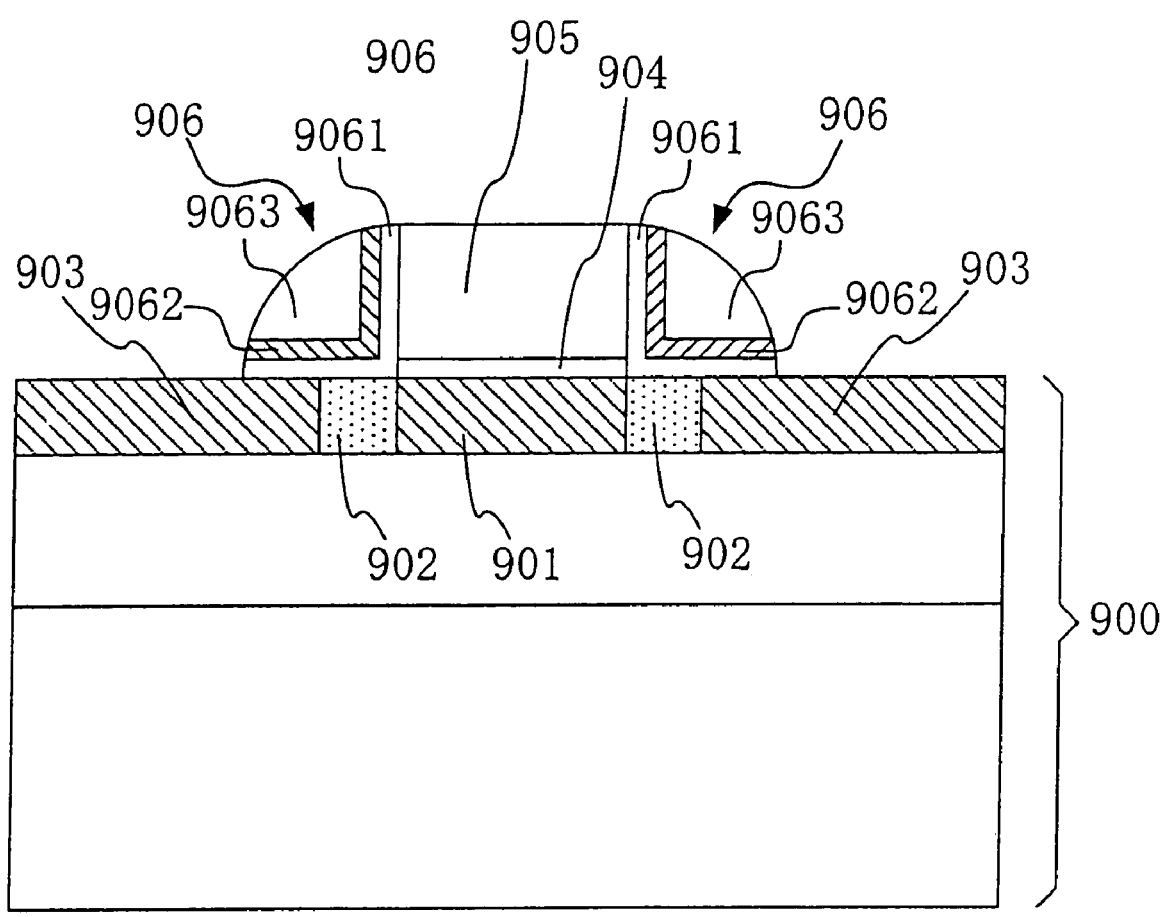
FIG. 4 is a schematic sectional view of a main part of a semiconductor storage device (Embodiment 3) of the present invention.

In a memory cell of Embodiment 3, as shown in FIG. 4, a logic LSI and a nonvolatile memory are mixedly mounted on an SOI substrate 900 to constitute an FPGA (Field Programmable Gate Array). Variable resistance regions 902 are separately formed.

Specifically, the memory cell is constituted by a channel region 901 formed by an N-type silicon layer, the variable resistance regions 902 formed on both sides of the channel region 901, N-type diffusion regions 903 provided on both sides of the channel region 901 via the variable resistance regions 902, a gate electrode 905 provided on the channel region 901 via a gate insulation film 904, and two memory functional elements 906 disposed on both sides of the gate electrode 905 and across the variable resistance region 902 and a part of the diffusion region 903.

The variable resistance region 902 is a silicon layer in which a P-type impurity is dominantly doped, that is, a P-type impurity is doped at concentration higher than that of an N-type impurity. Since the variable resistance region 902 is sandwiched between the channel region 901 and the diffusion region 903, it is depleted. The depletion may be either complete depletion or partial depletion.

The memory functional element 906 is formed by an ONO film (a silicon oxide film 9061, a silicon nitride film 9062 and a silicon oxide film 9063) and uses, as a film having the function of accumulating and holding charges, an L-shaped silicon nitride film.

The channel region 901 and the diffusion region 903 are not necessarily of the same conductivity type. An important thing is to dope the variable resistance region 902 with an impurity of a conductivity type opposite to that of the diffusion region more than an impurity of the same conductivity type.

In the memory cell, the resistance of the variable resistance region 902 can be changed by charges accumulated in the memory functional element 906. Concretely, according to the charges accumulated in the memory functional element 906, the property of the P type is enhanced or the property of the N type is enhanced in the variable resistance region 902. By applying a positive voltage to the gate electrode 905, due to a roundabout electric field generated from the sidewall of the gate electrode 905, a barrier between the variable resistance region 902 and the diffusion 903 is lowered, and current flows between the diffusion region 903 and the channel region 901. The current changes according to the resistance value of the variable resistance region 902, thereby producing a memory effect.

For example, by setting the voltage of one of the diffusion regions 903 as a reference potential, a voltage in the positive direction is applied to the gate electrode 905. At this time, the voltage applied to the other diffusion region 903 is applied in the positive direction with respect to the reference potential. The voltage applied to the other diffusion region 903 is set to be high until the electric field from the other diffusion region 903 becomes dominant more than the roundabout electric field from the sidewall of the gate electrode 905 and the variable resistance region 902 is depleted on the side of the other diffusion region 903. Under such voltage application conditions, the variable resistance region 902 on the other diffusion region 903 side to which the positive voltage is applied changes to a depletion layer on which the influence of the electric field of the diffusion region is dominant, and the variable resistance function is lost. Therefore, only the information of the variable resistance region 902 on the side of one of the diffusion regions 903 (to which the reference voltage is applied) is used as storage information, that is, the storage information in the variable resistance region 902 can be read out independently as an amount of current flowing between the two regions 903. When the N type is dominant in the variable resistance region 902, that is, when the diffusion region is of the P type, by reversing all of the signs of the applied voltages, a reading operation can be similarly read.

In this embodiment, the region in which current flows under the gate electrode is defined as a channel region.

Embodiment 4

A memory cell as a component of a semiconductor storage device of Embodiment 4 is a nonvolatile memory cell capable of storing two bits, in which, as shown in FIG.

5(c), a gate electrode 3 having a gate length which is almost the same as that in a normal transistor is formed on a semiconductor substrate 1 via a gate insulation film 2 and a charge holding film 4 serving as a memory functional element having a sidewall spacer (sidewall insulation film) shape is formed on the sidewalls of the gate insulation film 2 and the gate electrode 3. The surface of the semiconductor substrate under the gate electrode is a channel region 6. On both sides of the channel region 6, source/drain regions, which are impurity diffused regions of the conductivity type opposite to the conductivity type of the channel region, that is, the conductivity type of the surface of the semiconductor substrate in this embodiment, are formed. The source/drain region is constituted by a high-concentration impurity diffusion region 7 and a low-concentration impurity diffusion region 8. The low-concentration impurity diffusion region 8 is disposed in the vicinity of the channel region 6.

The memory functional element is formed on the source/drain regions. Preferably, at least a part of the source/drain region positioned under the memory functional element is the low-concentration impurity diffusion region 8. Preferably, the low-concentration impurity diffusion region 8 is set so as to be depleted or its conductivity type is reversed in accordance with the amount of charges accumulated in the memory functional element.

In the memory cell, the memory functional element in the memory transistor is formed independently of the gate insulation film. In other words, a memory function of the memory functional element and a transistor operation function of the gate insulation film are separated from each other. Therefore, the charge holding film 4 as a memory functional element can be formed of a material suitable for the memory function.

The high-concentration impurity diffusion region 7 is offset from the gate electrode 3, thereby enabling easiness of inversion of the low-concentration impurity diffusion region 8 under the charge holding film 4 which becomes a memory functional element when voltage is applied to the gate electrode 3 to be largely changed by an amount of charges accumulated in the charge holding film 4 as a memory functional element, so that the memory effect can be increased.

In the memory cell, by injection of electrons into the memory functional element (which is defined as writing in the case of an N-channel type device), the low-concentration impurity diffusion region 8 is depleted or inverted. Consequently, a structure equivalent to that of a MOSFET in which the source/drain regions are offset from the gate electrode is seemingly obtained, and an amount of current between the source/drain regions decreases extremely. On the other hand, by injection of holes into the memory functional element (which is defined as erasure in the case of the N-channel type device), since the low-concentration impurity diffusion region 8 is originally formed, as compared with an initial state (a state where electrons and holes are not accumulated in the memory functional element or a heat balance state), the current between the source/drain regions does not largely change.

Therefore, in the memory cell, excessive erasure which is a big issue in a nonvolatile memory (such as an EERPOM or FLASH) does not occur, and there is a big advantage such that it is unnecessary to provide a peripheral circuit as a countermeasure against excessive erasure.

The memory cell can be formed by a process similar to that of a normal logic transistor.

Figure 5A:
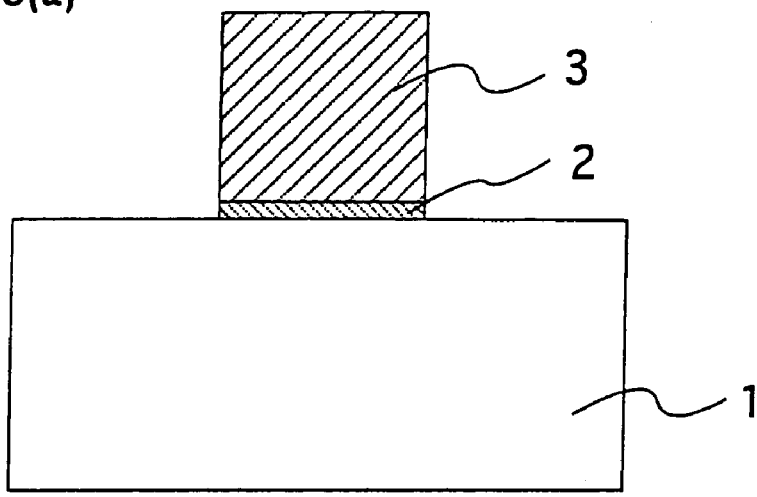
FIG. 5 is a schematic sectional view of a main part for describing the flow of a manufacturing method of a semiconductor storage device (Embodiment 4) of the present invention.

First, as shown in FIG. 5(a), on the semiconductor substrate 1, the gate insulation film 2 which is a silicon oxynitride film having a thickness of about 1 to 6 nm and a gate electrode material film made of polysilicon, a laminated film of polysilicon and a refractory metal silicide, or a laminated film of polysilicon and a metal, having a thickness of about 50 to 400 nm are formed and patterned in a desired shape, thereby forming the gate electrode 3.

As the materials of the gate insulation film and the gate electrode, it is sufficient to use materials which are used in a logic process according to a scaling rule of the age as described above. The present invention is not limited to the above materials.

Figure 5B:
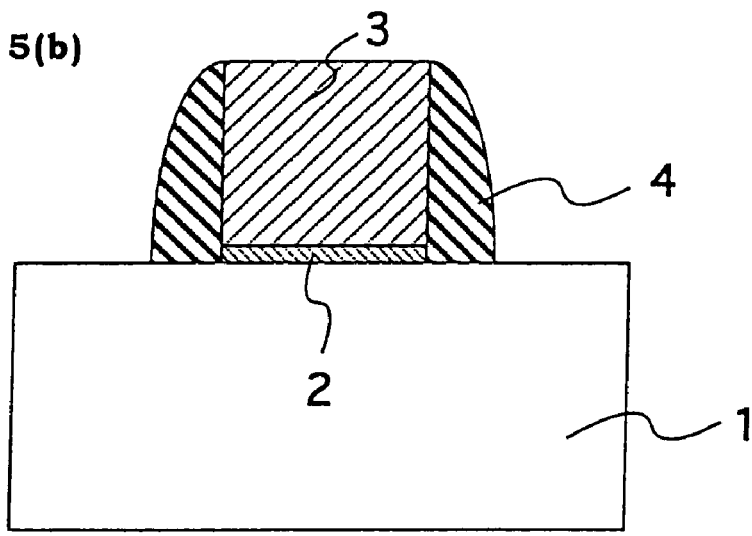

Subsequently, completely separately from the gate insulation film 2, as shown in FIG. 5(b), a silicon nitride film having a thickness of about 20 to 100 nm is formed on the whole surface of the obtained semiconductor substrate 1 and etched back by anisotropic etching, thereby forming the charge holding film 4 optimum for storage as a sidewall spacer on the sidewalls of the gate electrode. More preferably, in place of the silicon nitride film, a silicon oxide film having a thickness of about 2 to 20 nm and a silicon nitride film having a thickness of about 2 to 100 nm are sequentially deposited and etched back by anisotropic etching, thereby forming the charge holding film 4 optimum for storage in a sidewall spacer shape on the sidewall of the gate electrode.

Figure 5C:
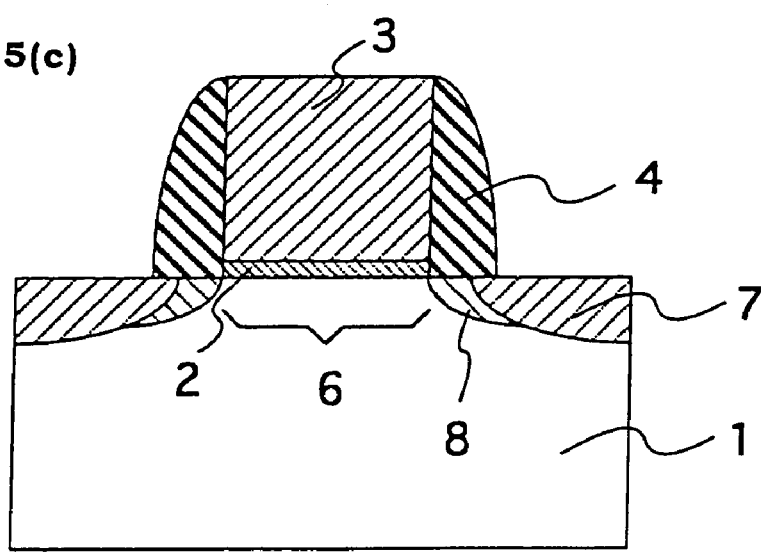

After that, as shown in FIG. 5(c), by implanting ions while using the gate electrode 3 and the charge holding film 4 as a mask, source/drain regions (the high-concentration impurity diffusion region 7 and the low-concentration impurity diffusion region 8) are formed. The low-concentration impurity diffusion region 8 may be formed by ion implantation before the process of forming the memory functional element 4. Preferably, the low-concentration impurity diffusion region 8 has the conductivity type opposite to that of an impurity for forming a channel and has an impurity concentration in the range from $1 \times 10^{16}/cm^3$ to $1 \times 10^{18}/cm^3$, more preferably, from $1 \times 10^{16}/cm^3$ to $5 \times 10^{17}/cm^3$.

By disposing the gate insulation film 2 and the charge holding film 4 as a memory functional element so as to be separated from each other, a memory cell transistor having a short channel effect of the same degree can be formed by a manufacturing process which is the same as that of a normal transistor. Therefore, a logic circuit part can be constituted by a part of transistors formed on the same chip by the above-described procedure and a memory part (for example, a nonvolatile memory) can be constituted by the other transistors. In this case, when the logic circuit part is operated in a voltage range in which charges are not injected into the memory functional element, a change in the characteristics of a transistor can be prevented. In the memory part, by applying a voltage sufficient to inject charges to the memory functional element, rewriting can be performed. That is, both a logic circuit and a nonvolatile memory can be formed by an extremely simple process.

Except for a variable resistor-type 2-device/cell-type nonvolatile memory (MRAM) described as the prior art, there is an EEPROM as a typical nonvolatile memory.

Figure 6A:
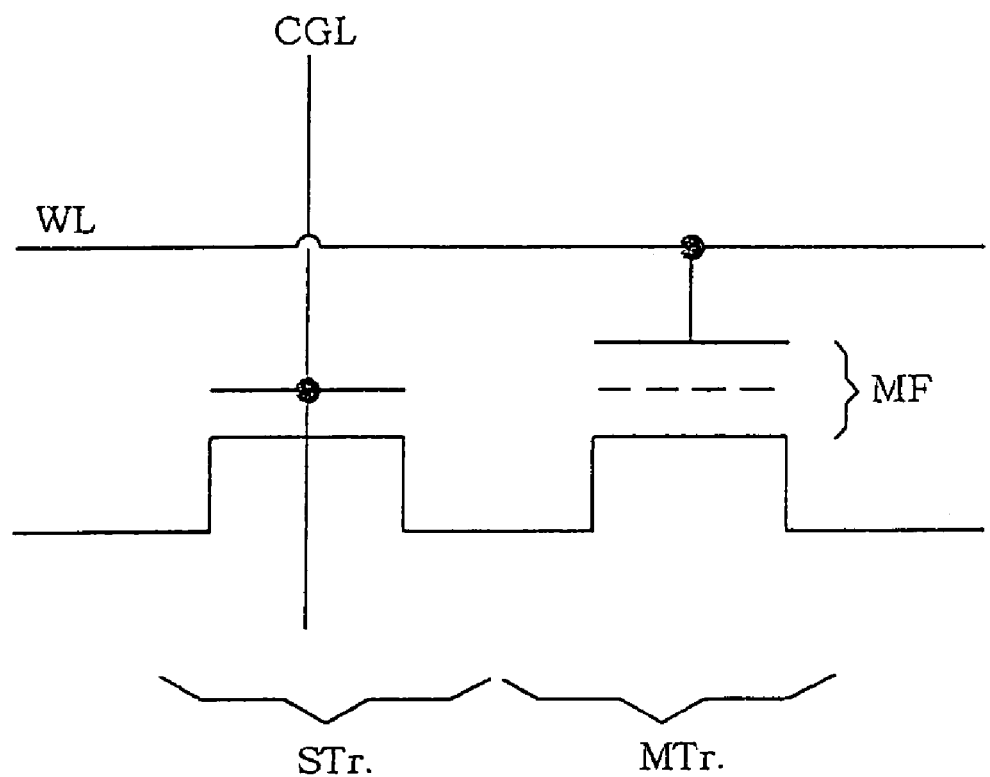
FIG. 6 is a circuit diagram for describing the function of a charge holding film of the semiconductor storage device (Embodiment 4) of the present invention.
Figure 6B:
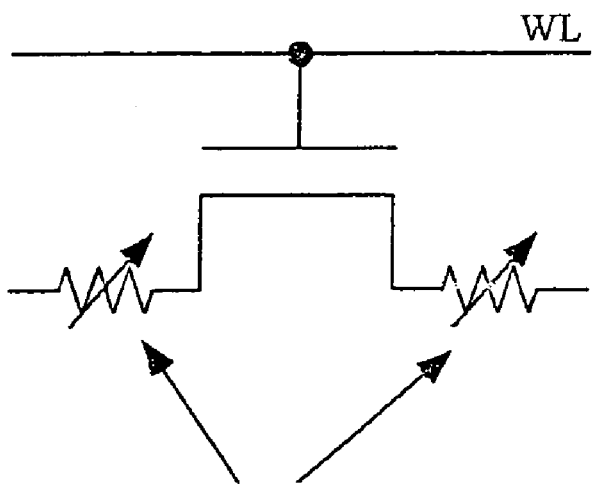

In an EEPROM, as shown in FIG. 6(a), a memory cell is constituted by two transistors of a selection transistor (STr) connected to a control gate line (CGL) and a memory transistor (MTr) connected to a word line (WL) and having a charge holding film (MF). In contrast, as shown in FIG. 6(b), the memory cell of the above structure having the functions of a selection transistor and a memory transistor can be constituted by one gate electrode (that is, one word line WL) by an effect of two variable resistors of the two memory functional elements. Specifically, it can be regarded that, in a portion between the source/drain regions and at both ends of the channel region, the variable resistors disposed under the memory functional elements on both sides of the gate electrode are connected to the channel region. In accordance with the amount of charges held in the memory functional element, by applying a voltage to the gate electrode, the memory functional element changes resistance of the diffusion region disposed under the memory functional element and changes the amount of current from one of the diffusion regions to the other diffusion region. One memory cell is constituted by only four terminals: one terminal connected to the semiconductor substrate; two terminals connected to two diffusion regions; and one terminal connected to the gate electrode. Further, the semiconductor storage device is either read, written or erased by application of only four kinds of voltages: a voltage applied to the semiconductor substrate; a voltage applied to the gate electrode; and voltages respectively applied to the two diffusion regions.

With the configuration, in order to select one memory cell, it is sufficient to select one word line connected to the gate electrode or having the function of the gate electrode itself. It is unnecessary to form two transistors, so that further high-integration can be realized. In other words, in contract to FIG. 6(a) in which the number of gate electrodes, that is, control gate lines and word lines increases and the cell area is not reduced, in the present invention, one cell can be operated by one word line. For example, when the word lines are formed with the minimum processing dimensions (the minimum wiring width and the minimum wiring interval) and laid in the memory cell region, in the case where one word line is sufficient to constitute one memory cell, an effect such that the cell occupation area can be reduced to 1/n as compared with the case where n pieces of word lines are necessary. In FIG. 6(a) as an example, two word lines are necessary to constitute a memory cell and one memory cell stores 1-bit (binary) information. In contrast, in FIG. 6(b), one memory cell is constituted by one word line, and two-bit (since there are the charge holding films on both sides of one gate electrode (word line)) and 4-value information is stored per one memory cell. That is, there is an effect such that the occupation area of the memory cell can be reduced to ½ (two word lines to one word line) and the occupation area can be reduced to ¼ per 1-bit.

Embodiment 5

In place of the memory functional element (charge holding film 4) formed by the silicon nitride film in Embodiment 4, as shown in FIGS. 7(a) to 7(e), various kinds of memory functional elements can be employed.

Figure 7A:
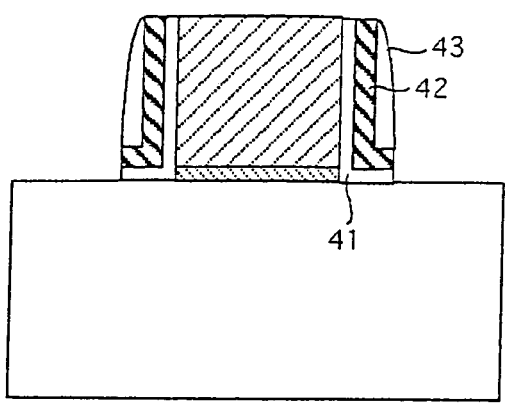
FIG. 7 is a schematic sectional view of a main part showing a semiconductor storage device (Embodiment 5) of the present invention.

For example, as shown in FIG. 7(a), the memory functional element is formed by an ONO film including a silicon oxide film 41 having a thickness of about 1 to 20 nm, a silicon nitride film 42 having a thickness of about 2 to 200 nm and a silicon oxide film 43 having a thickness of about 5 to 200 nm.

Figure 7D:
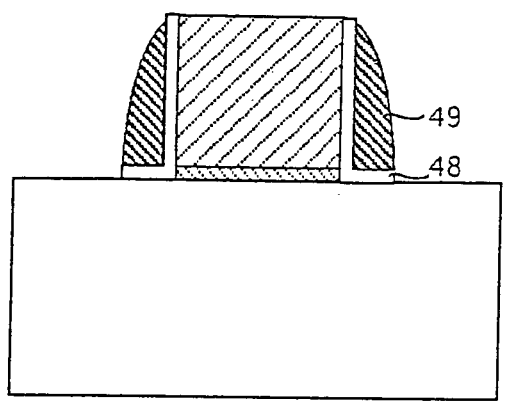
Figure 7B:
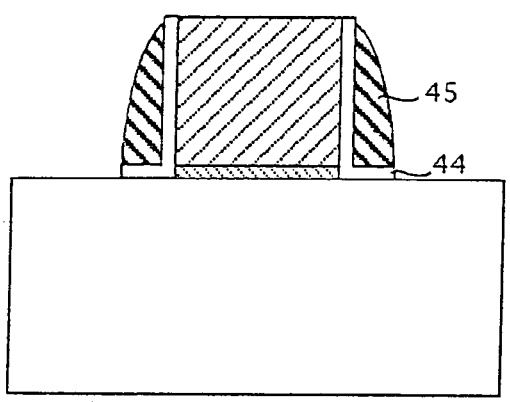

The memory functional element may be formed by an ON film including, as shown in FIG. 7(b), a silicon oxide film 44 having a thickness about 1 to 20 nm and a silicon nitride film 45 having a thickness of about 2 to 200 nm.

Figure 7E:
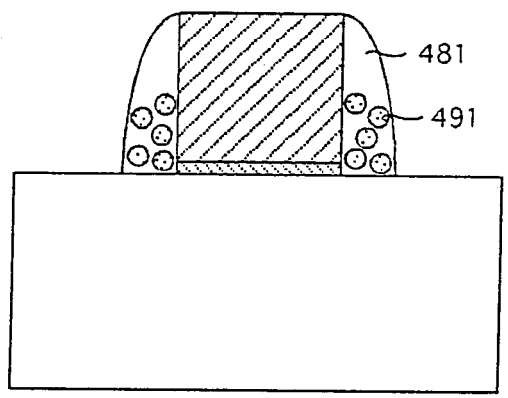
Figure 7C:
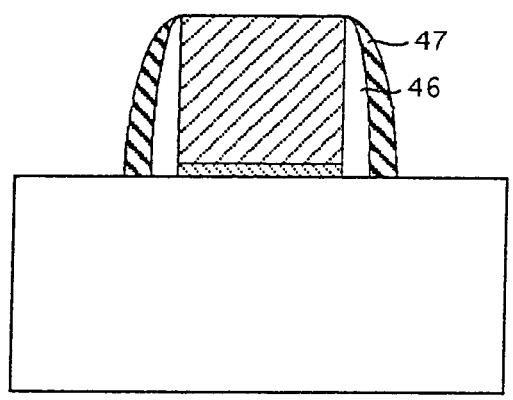

Further, the memory functional element may be formed by an ON film including, as shown in FIG. 7(c), a silicon oxide film 46 having a thickness of about 1 to 20 nm and a silicon nitride film 47 having a thickness of about 5 to 200 nm, and the silicon nitride film 47 may be in contact with the semiconductor substrate. The silicon oxide film 46 and the silicon nitride film 47 may be interchanged with each other.

The memory functional element may be formed by, as shown in FIG. 7(d), a floating gate conductive film 49 made of polysilicon having a thickness of about 10 to 200 nm via an insulation film 48 which is a silicon oxide film having a thickness of about 1 to 20 nm. In the case of using a conductive film, although not shown, it is preferable to cover the surface of the memory film with an insulation film.

Further, the memory functional element may be formed by, as shown in FIG. 7(e), an insulation film 481 made of an insulation material such as a silicon oxide film, a silicon nitride film or a high dielectric constant film having a thickness of about 5 to 200 nm. In the insulation film 481, one or more floating gate conductive films 491 in a dot shape (having a diameter of about 1 to 8 nm) made of a conductor such as silicon are dispersed.

When the memory functional element having any of the above-described configurations, particularly, the memory functional element made by the silicon nitride film is used, it is very preferable since the memory functional element can be easily introduced to a mass production factory. However, the present invention is not limited to the film configurations and materials. The semiconductor storage device of the present invention can be basically obtained by a laminated structure of a film having the charge holding function or a material having the charge holding function (for example, a silicon nitride film, silicate glass containing impurity such as phosphorus or boron, silicon carbide, alumina, hafnium oxide, zirconium oxide, tantalum oxide, zinc oxide, ferroelectric film, or the like) and the insulation film, or an insulator containing a material having the charge holding function.

Embodiment 6

Figure 8:
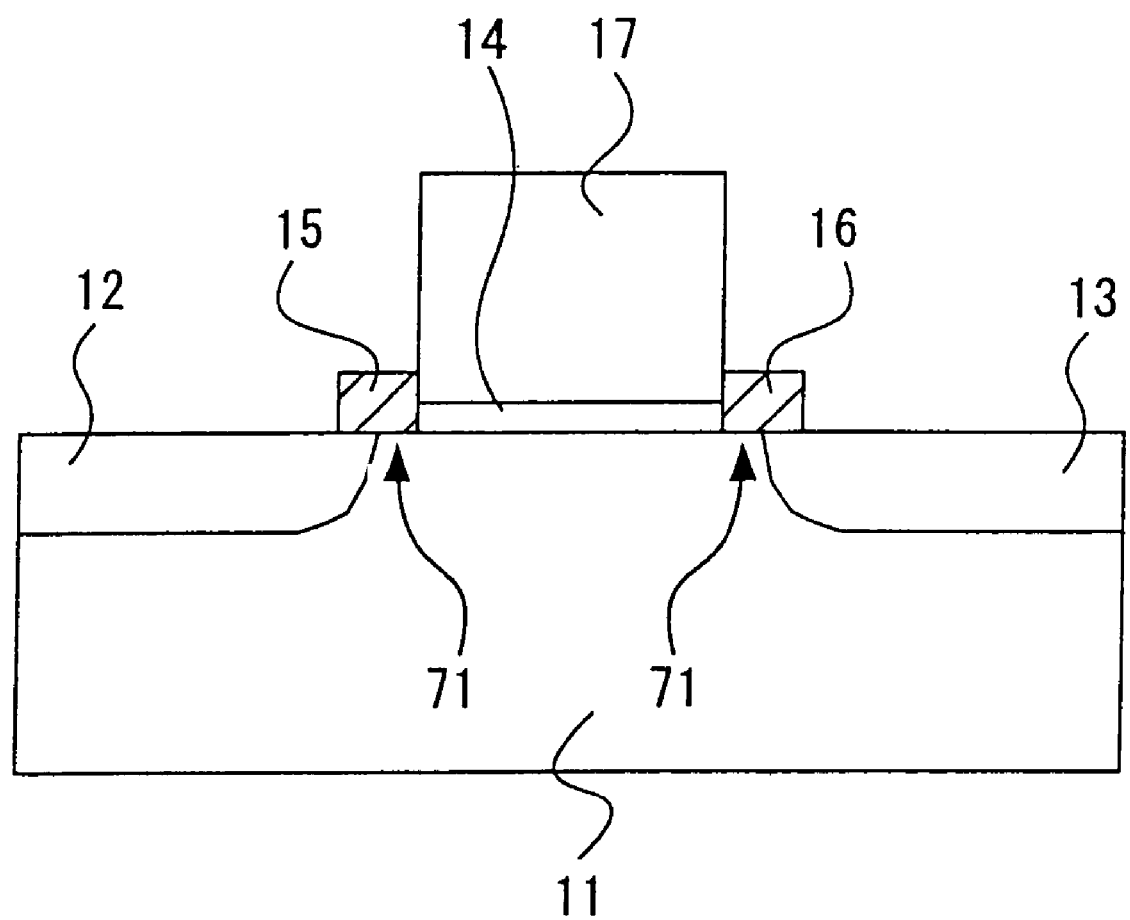
FIG. 8 is a schematic sectional view of a main part showing a semiconductor storage device (Embodiment 6) of the present invention.

In a memory cell as a component of a semiconductor storage device of Embodiment 6, as shown in FIG. 8, an N-type first diffusion region 12 and an N-type first diffusion region 13 are formed on the surface of a P-type well 11 formed in a semiconductor substrate, and a channel region is formed in the uppermost layer part of the well 11 between the diffusion regions 12 and 13. On the channel region, a gate electrode 17 is formed via a gate insulation film 14 including a silicon oxide film or a silicon oxynitride film having a thickness of about 1 to 6 nm. The gate electrode 17 does not overlap with the diffusion regions 12 and 13, and there are small channel regions (71 in FIG. 8) which are not covered with the gate electrode 17. At both ends of the gate electrode 17, charge holding films 15 and 16 as memory functional elements made by a silicon nitride film having a thickness of about 10 to 200 nm (the width in the horizontal direction of the semiconductor substrate) are provided for storing information by accumulating or trapping charges. The channel regions 71 which are not covered with the gate electrode 17 are covered with the charge holding films 15 and 16. It is important herein that the diffusion regions 12 and 13 and the charge holding films as the memory functional elements overlap each other at least partially.

Next, description will be given of the operation principle of the semiconductor storage device. The operation principle can be applied not only to the semiconductor storage device of this embodiment but also to semiconductor storage devices of other embodiments of the present invention.

The principle of a writing operation of the semiconductor storage device will be described with reference to FIGS. 9(a) and 9(b).

Writing denotes herein injection of electrons into a charge holding film.

Figure 9:
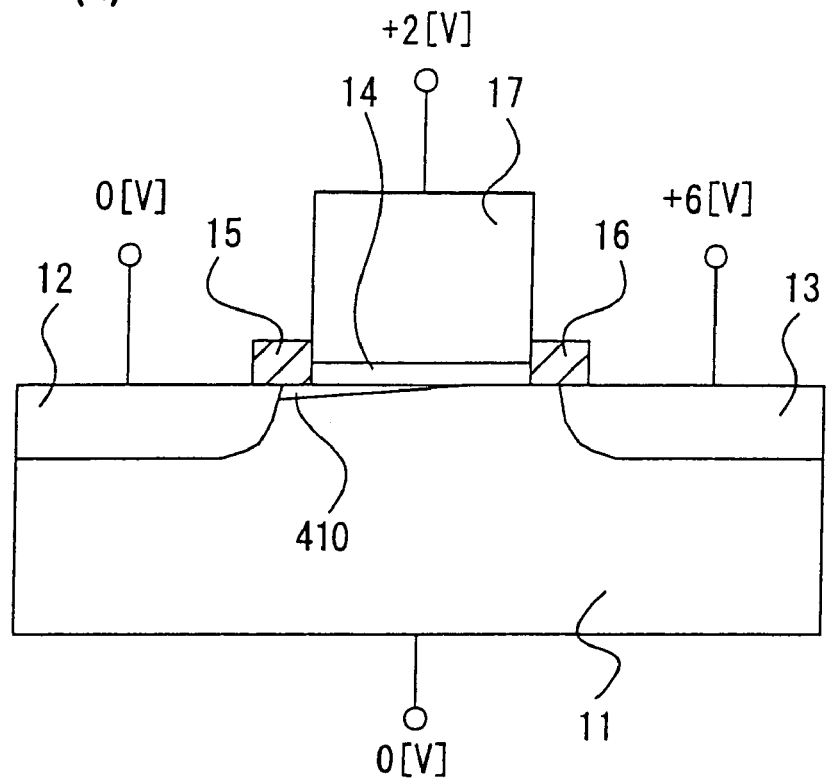
FIG. 9 is a schematic sectional view of a main part for describing a writing operation of the semiconductor storage device (Embodiment 6) of the present invention.
Figure 9B:
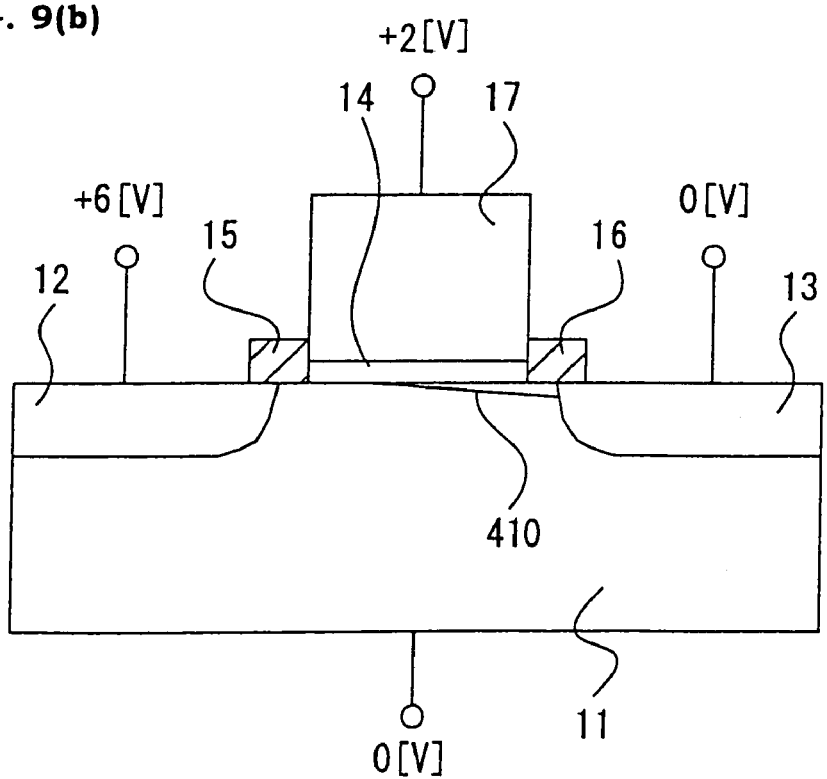

In order to inject electrons into the charge holding film 16 as the memory functional element (to write), as shown in FIG. 9(*a*), the first diffusion region 12 is used as a source electrode, and the second diffusion region 13 is used as a drain electrode. For example, it is sufficient to apply 0V to the first diffusion region 12 and the well 11, +6V to the second diffusion region 13, and +2V to the gate electrode 17. Under such voltage conditions, an inversion layer 410 extends from the first diffusion region 12 (source electrode) but does not reach the second diffusion region 13 (drain electrode), and a pinch-off point occurs. Electrons are accelerated from the pinch-off point to the second diffusion region 13 (drain electrode) by a high electric field and become so-called hot electrons. The hot electrons are injected into the charge holding film 16, thereby performing writing.

Since hot electrons are not generated in the vicinity of the charge holding film 15, writing is not performed. Also in the case where the diffusion regions 12 and 13 and the charge holding film as a memory functional element do not overlap each other at all, generation of hot electrons is suppressed and it becomes difficult to perform writing in a practical application voltage range (the voltage difference of 20V or less).

In such a manner, by injecting electrons into the charge holding film 16 as a memory functional element, writing can be performed.

On the other hand, in order to inject electrons into the charge holding film 15 as a memory functional element (to perform writing), as shown in FIG. 9(*b*), the second diffusion region 13 is used as a source electrode, and the first diffusion region 12 is used as a drain electrode. For example, it is sufficient to apply 0V to the second diffusion region 13 and the well 11, +6V to the first diffusion region 12, and +2V to the gate electrode 17. As described above, by interchanging the source and drain regions of the case of injecting electrons into the charge holding film 16, electrons are injected into the charge holding film 15 to perform writing.

Figure 10:
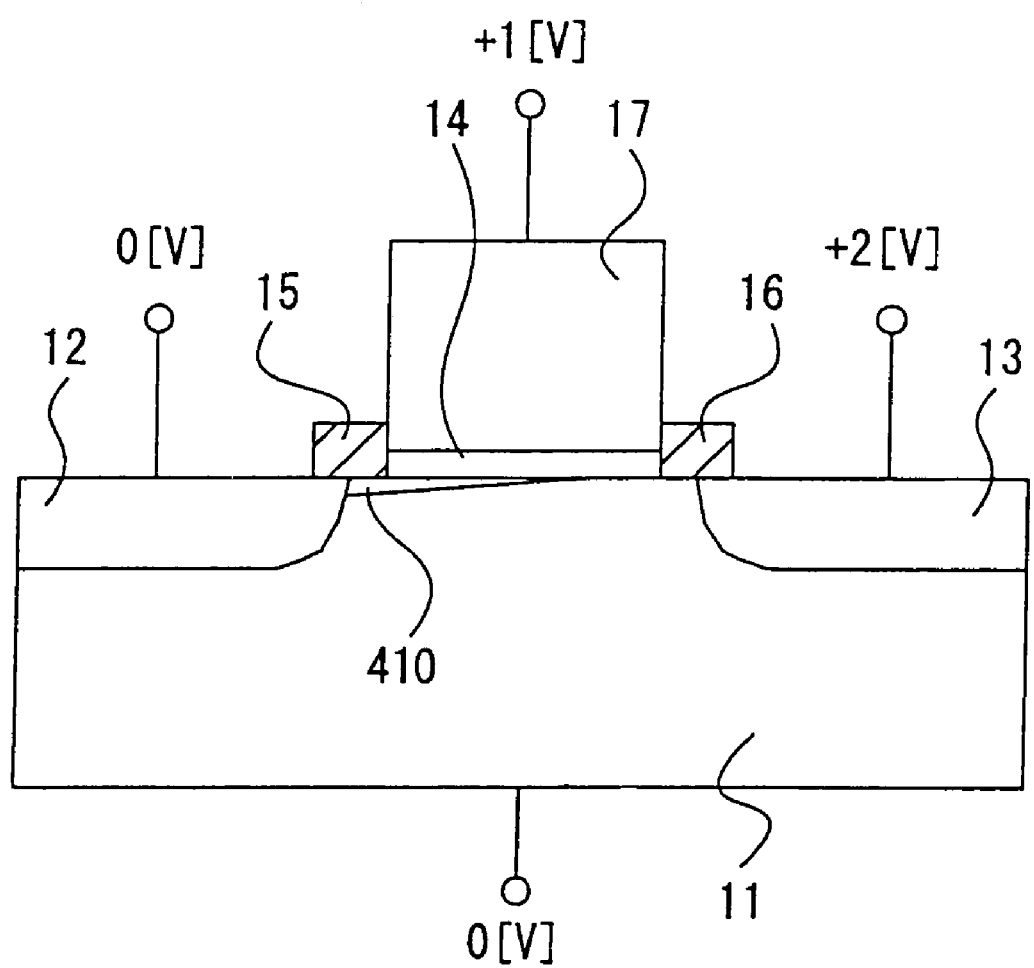
FIG. 10 is a schematic sectional view of a main part for describing a reading operation of the semiconductor storage device (Embodiment 6) of the present invention.

The principle of a reading operation of the semiconductor storage device will now be described with reference to FIG. 10.

In the case of reading information stored in the charge holding film 15 as a memory functional element, the first diffusion region 12 is used as a source electrode, the second diffusion region 13 is used as a drain electrode, and the transistor is operated in a saturation region. For example, it is sufficient to apply 0V to the first diffusion region 12 and the well 11, +2V to the second diffusion region 13, and +1V to the gate electrode 17. In the case where no electrons are accumulated in the charge holding film 15, drain current easily flows. On the other hand, in the case where electrons are accumulated in the region 15, the inversion layer 410 is not easily formed in the vicinity of the charge holding film 15 and drain current does not easily flow. Therefore, by detecting the drain current, information stored in the charge holding film 15 can be read out. The presence/absence of charge accumulation in the charge holding film 16 does not exert an influence on the drain current since a pinch-off occurs in the vicinity of the drain. Consequently, by operating the transistor in the saturation region (by bringing out a pinch-off in the vicinity of the drain) at the time of reading, irrespective of the storage state of the charge holding film 16, storage information of the charge holding film 15 can be detected with high sensitivity. This is a big factor which enables 2-bit operation.

As obvious from the above description, the roles of the source electrode and the drain electrode are interchanged between the case of injecting electrons into the charge holding film 15 as a memory functional element (writing) and the case of reading out storage information of the charge holding film 15. In other words, the relation between the magnitude of the voltage applied to one of the first and second diffusion regions (source and drain regions) and that of the voltage applied to the other diffusion region is changed between the case of changing the storage state by injecting electrons into the memory functional element and the case of reading out the storage state of the memory functional element. Consequently, an effect of improving resistance to read disturbance can be also obtained as follows.

For example, in the case where the second diffusion region 13 is set as a source electrode and the first diffusion region 12 is set as a drain electrode in order to read out storage information of the charge holding film 15 (that is, the roles of the source and drain electrodes are unchanged between the writing operation and the reading operation), a very small amount of electrons are injected to the charge holding film 15 for each reading operation. This is because electrons have relatively high energy on the drain electrode side even by a small drain voltage in the reading operation. Consequently, in the case of performing a number of reading operations without performing the rewriting operation, there is a possibility in that storage information of the charge holding film 15 is rewritten.

However, when the roles of the source and drain electrodes are interchanged between the writing operation and the reading operation, the charge holding film 15 becomes on the source electrode side in the reading operation. Consequently, there is no possibility of such erroneous writing. Therefore, resistance to read disturbance increases.

In the case of reading out information stored in the charge holding film 16, the second diffusion region 13 is set as a source electrode, the first diffusion region 12 is set as a drain electrode, and the transistor is operated in a saturation area. For example, it is sufficient to apply 0V to the second diffusion region 13 and the well 11, +2V to the first diffusion region 12, and +1V to the gate electrode 17. By interchanging the source and drain regions from those in the case of reading out information stored in the charge holding film 15, the information stored in the charge holding film 16 can be read out.

In the case where the channel region 71 which is not covered with the gate electrode 17 is left, in the channel region which is not covered with the gate electrode 17, an inversion layer is dissipated or formed according to the presence/absence of excessive electrons in the charge holding films 15 and 16. As a result, a large hysteresis (change in threshold) is obtained. However, when the channel region 71 which is not covered with the gate electrode 17 is too wide, the drain current largely decreases and reading speed largely decreases. Particularly, in the case where the charge holding films 15 and 16 and the first and second diffusion regions do not overlap with each other at all, reading speed decreases to the extent that the device does not function as a practical storage device. Therefore, it is preferable to determine the width of the channel region 71 which is not covered with the gate electrode 17 so as to obtain a sufficient hysteresis and reading speed.

Even in the case where the diffusion regions 12 and 13 reach the ends of the gate electrode 17, that is, even when the diffusion regions 12 and 13 and the gate electrode 17 overlap each other, the threshold of the transistor is hardly changed by the writing operation. However, parasitic resistance largely changes at ends of the source and drain and the drain current largely decreases (by one digit or more) (in this embodiment, since the concentration of the diffusion regions 12 and 13 is high and the concentration in the vicinity of a channel is not decreased like in Embodiment 4, the conductivity type is not inverted and the threshold hardly changes). Therefore, reading can be performed by detecting a drain current and the function of a memory can be obtained. In the case where a higher memory hysteresis effect is necessary, it is preferred that the diffusion regions 12 and 13 and the gate electrode 17 do not overlap each other.

Moreover, in the case where the diffusion regions 12 and 13 are offset from the ends of the gate electrode 17 (that is, they do not overlap each other), as compared with a normal logic transistor, a short channel effect can be prevented more strongly and the gate length can be further shortened. Since the structure is adapted to suppress the short channel effect, as compared with a logic transistor, a thicker gate insulation film can be employed and reliability can be improved.

At any rate, by making the charge holding films 15 and 16 and the first and second diffusion regions overlap each other, the resistance of the channel region 71 which is not covered with the gate electrode 17 largely changes in accordance with the presence/absence of charges accumulated in the charge holding films 15 and 16. Thus, the resistance of the two variable resistors in FIG. 6(b) in Embodiment 4 can be independently changed.

The principle of an erasing operation of the semiconductor storage device will now be described.

As a first method, in the case of erasing information stored in the charge holding film 15 as a memory functional element, it is sufficient to apply a positive voltage (for example, +6V) to the first diffusion region 12, 0V to the well 11, a reverse bias to the PN junction between the first diffusion region 12 and the well 11 and, further, a negative voltage (for example, −5V) to the gate electrode 17. In the PN junction in the vicinity of the gate insulation film, due to the influence of the gate electrode to which the negative voltage is applied, particularly, the gradient of the potential becomes steep. Consequently, hot holes are generated on the well region 11 side of the PN junction by an interband tunnel. The hot holes are attracted by the gate electrode 17 having the negative potential and, as a result, holes are injected to the charge holding film 15. In such a manner, information of the charge holding film 15 is erased. At this time, it is sufficient to apply 0V to the second diffusion region 13.

In the case of erasing information stored in the charge holding film 16, it is sufficient to interchange the potential of the first diffusion region and the potential of the second diffusion region with each other.

Figure 11:
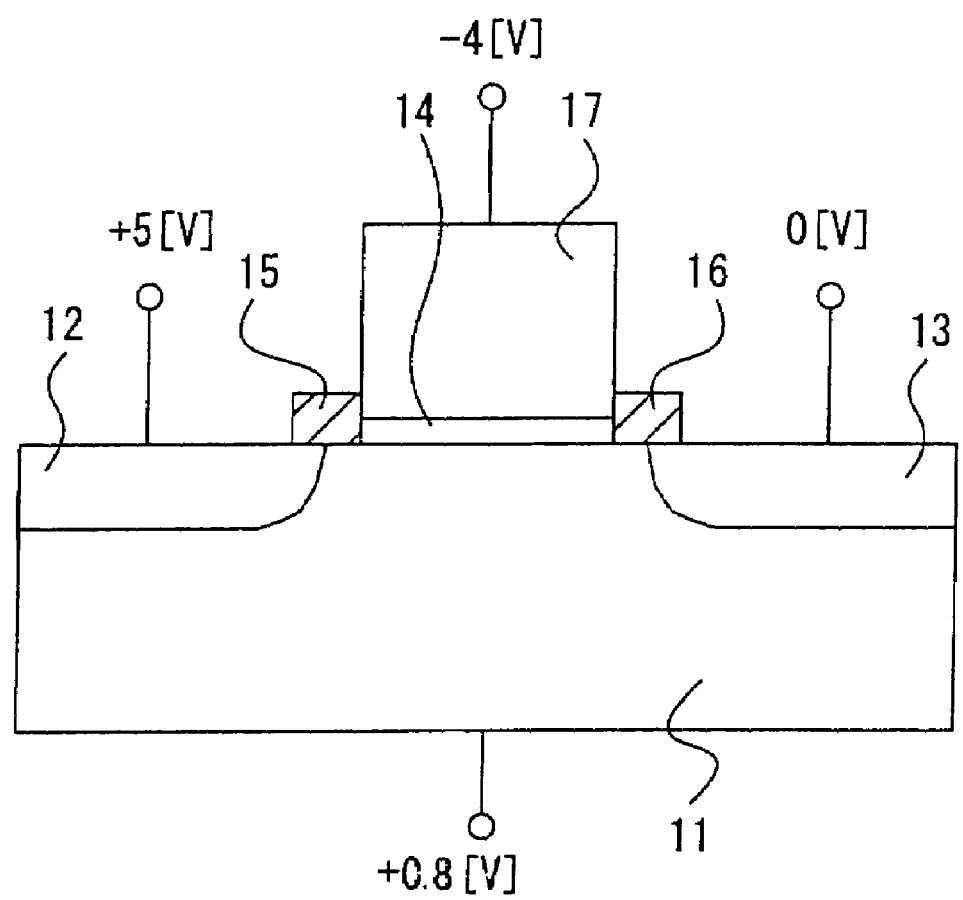
FIG. 11 is a schematic sectional view of a main part for describing an erasing operation of the semiconductor storage device (Embodiment 6) of the present invention.

As a second method, in the case of erasing information stored in the charge holding film 15 as a memory functional element as shown in FIG. 11, it is sufficient to apply a positive voltage (for example, +5V) to the first diffusion region 12, 0V to the second diffusion region 13, a negative voltage (for example, −4V) to the gate electrode 17, and a positive voltage (for example, 0.8V) to the well 11. A forward voltage is applied between the well 11 and the second diffusion region 13 and electrons are injected into the well 11. The injected electrons are diffused to the PN junction of the well 11 and the first diffusion region 12 and are accelerated by a strong electric field, thereby becoming hot electrons. The hot electrons make electron-hole pairs generated in the PN junction. The hot holes generated in the PN junction are attracted by the gate electrode 17 having a negative potential and, as a result, holes are injected into the charge holding film 15.

According to the second method, even in the case where only a voltage which is insufficient to generate hot holes by the interband tunnel is applied in the PN junction between the well 11 and the first diffusion region 12, by the electrons injected from the second diffusion region 13, hot holes can be generated. Therefore, the voltage at the time of the erasing operation can be decreased.

In the case of erasing information stored in the charge holding film 15, in the first erasing method, +6V has to be applied to the first diffusion region 12. In the second erasing method, +5V is sufficient. As described above, according to the second method, the voltage at the time of erasure can be reduced. Thus, power consumption can be reduced and deterioration in the semiconductor storage device by hot carriers can be suppressed.

By the operating methods, 2-bit (four-value) writing and erasing can be performed selectively per one transistor. Consequently, the occupation area per one bit can be reduced and the manufacturing cost of the semiconductor storage device can be decreased. In the multi-valued technology used in a flash memory or the like, extremely precise threshold control is required. In the case of applying the operating method to the semiconductor storage device of the present invention, it is unnecessary to perform such threshold control.

In the operating methods, by interchanging the source electrode and the drain electrode, writing and erasing of two bits per one transistor is performed. It is also possible to fix the source electrode and the drain electrode and make the device operate as a 1-bit memory. In this case, one of the source and drain regions can be set to a common fixed voltage and the number of bit lines connected to the source and drain regions can be reduced to the half.

Although the reading, writing and erasing operations have been described with respect to the case of an N-channel device, in the case of a P-channel device, by reversing the signs of all of application voltages, similar operations can be performed.

Embodiment 7

Figure 12:
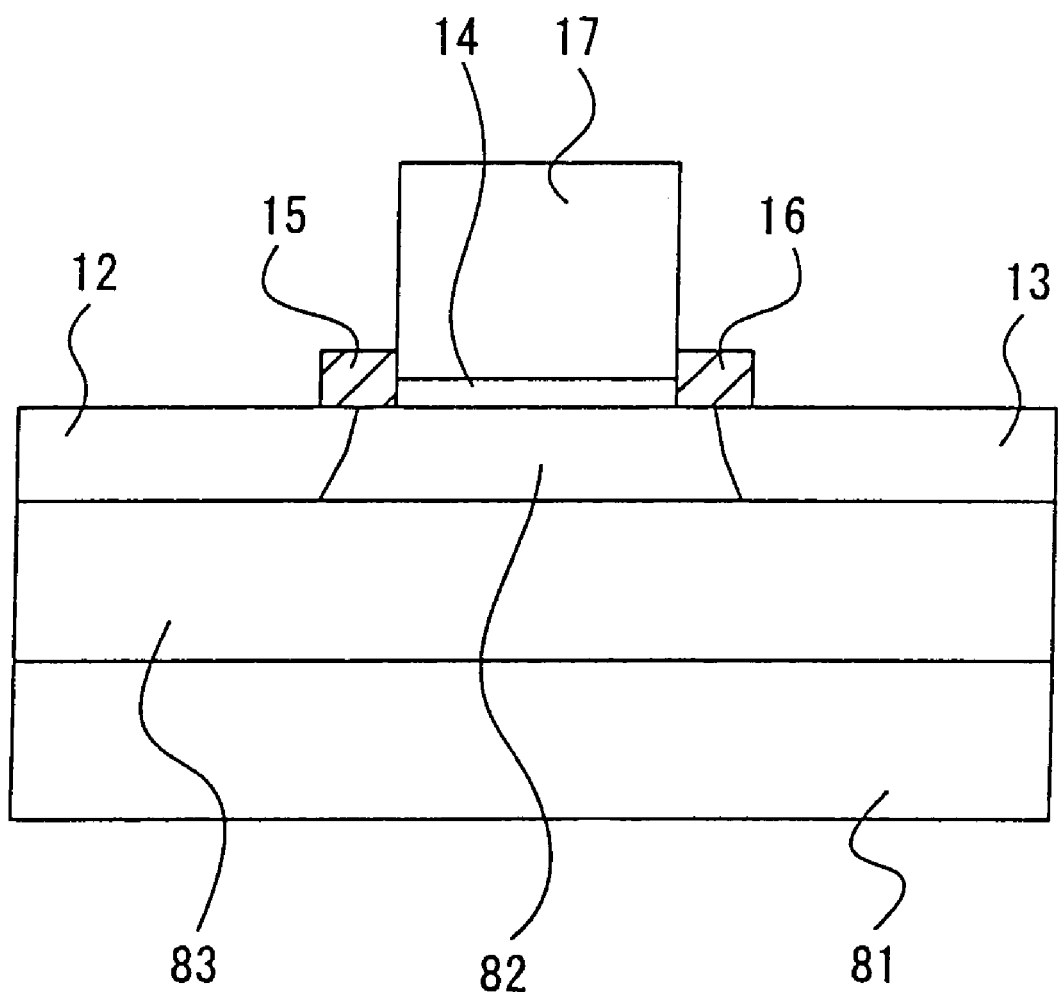
FIG. 12 is a schematic sectional view of a main part showing a semiconductor storage device (Embodiment 7) of the present invention.

A semiconductor storage device of Embodiment 7 has, as shown in FIG. 12, substantially the same configuration as that of the semiconductor storage device in Embodiment 6 except that the semiconductor substrate is replaced with an SOI (Silicon on Insulator) substrate.

In the semiconductor storage device, a buried oxide film 83 is formed on a semiconductor substrate 81. Further, an SOI layer is formed on the buried oxide film 83. In the SOI layer, the diffusion regions 12 and 13 are formed and the region other than the diffusion regions 12 and 13 is a body region 82.

The semiconductor storage device also produces effects similar to those of the semiconductor storage device of Embodiment 6. Further, the junction capacitance between the diffusion regions 12 and 13 and the body region 82 can be considerably reduced, so that higher processing speed of the device and lower power consumption can be realized.

Embodiment 8

Figure 13:
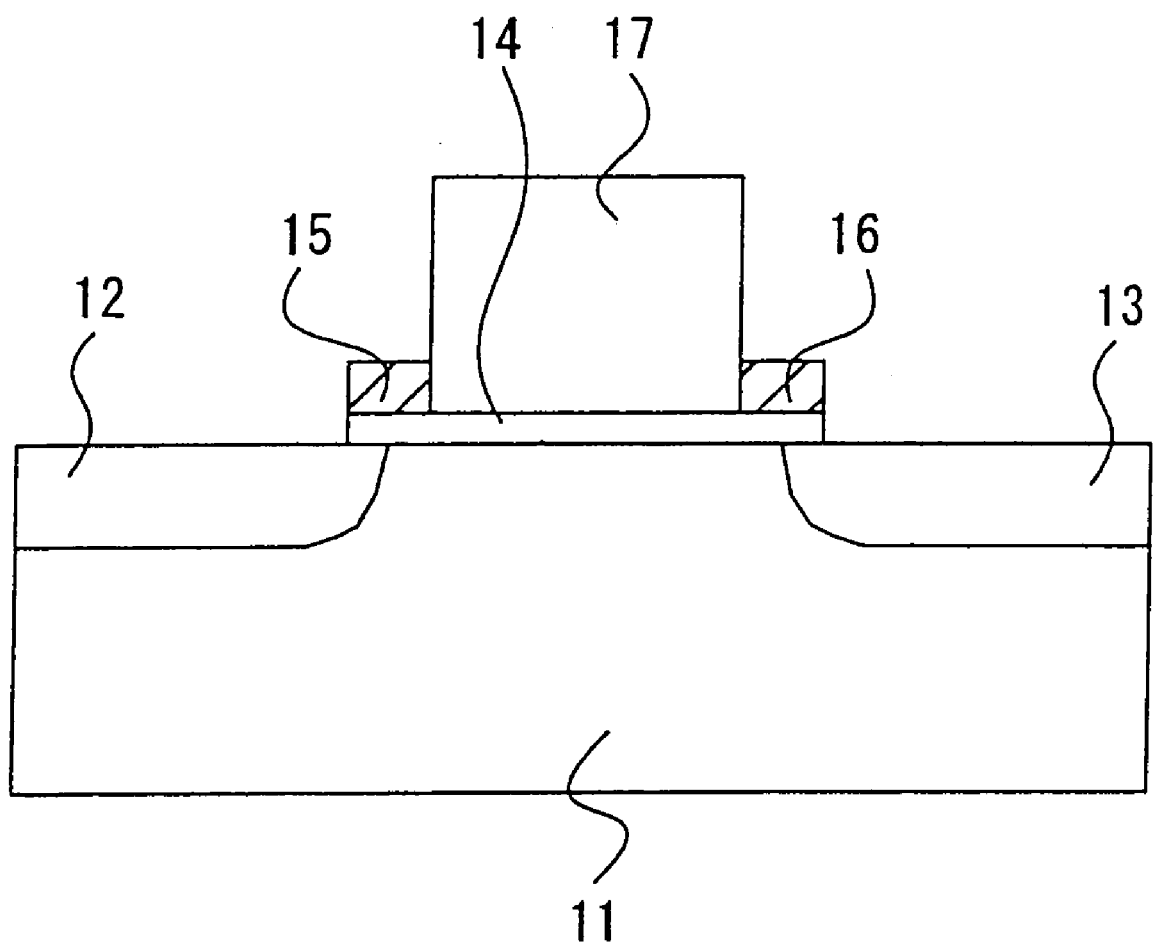
FIG. 13 is a schematic sectional view of a main part showing a semiconductor storage device (Embodiment 8) of the present invention.

A semiconductor storage device of Embodiment 8 has, as shown in FIG. 13, a configuration substantially the same as that of the semiconductor storage device of Embodiment 6 except that the gate insulation film 14 extends between the charge holding films 15, 16 and the well 11 and the diffusion regions 12, 13.

Specifically, the charge holding film is in contact with, at least in the vicinity of the gate electrode, the diffusion region and/or the well region or the body region (in the case where the SOI substrate is used) via the insulation film.

The semiconductor storage device also produces effects similar to those of the semiconductor storage device of Embodiment 6. Further, by the gate insulation film 14 between the charge holding films 15, 16 and the well 11 and the diffusion regions 12, 13, leakage of the held charges is suppressed and the retention characteristic can be improved. In addition, the whole surface of the channel region is covered with the gate insulation film 14. Consequently, by suppressing interface scattering of carriers in inversion layer, drain current is increased and, further, reading speed can be improved.

The insulation film under the charge holding film may be designed and formed separately from the gate insulation film. The gate electrode may be so designed that priority is given on suppression of a short channel effect, and the insulation film under the charge holding film may be formed thicker or thinner than the gate insulation film. The charge holding film is not limited to a silicon nitride film but may be a film having the above-described configuration and made of the material.

Embodiment 9

Figure 14:
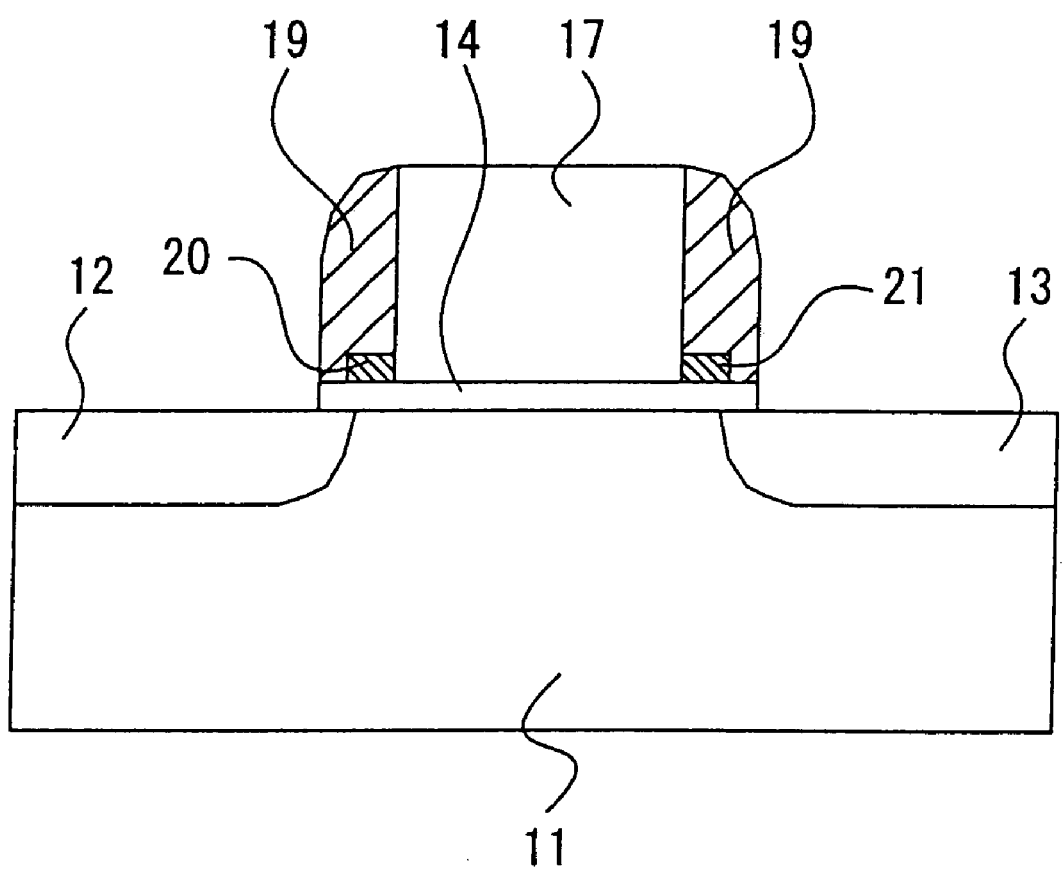
FIG. 14 is a schematic sectional view of a main part showing a semiconductor storage device (Embodiment 9) of the present invention.

A semiconductor storage device of Embodiment 9 is, as shown in FIG. 14, substantially the same as that of Embodiment 8 except that a charge holding film 19 which is a silicon nitride film serves as an insulation film on the gate sidewall of the gate electrode 17.

In the semiconductor storage device, a portion in which charges are actually accumulated or trapped and storage is maintained is regions 20 and 21 in the charge holding films 19.

The semiconductor storage device also produces effects similar to those of the semiconductor storage device of Embodiment 8. Further, since the sidewall of the gate electrode 17 is covered with the charge holding film 19 as the gate sidewall insulation film, when ions are implanted to form the diffusion regions 12 and 13 while using the charge holding film 19 as a mask, it is easy to control the positions of the end portions of the diffusion regions 12 and 13. For example, it is easy to slightly leave the channel region which is not covered with the gate electrode 17, and to cover the channel region which is not covered with the gate electrode 17 with the charge holding film 19. Therefore, the semiconductor storage device having a large hysteresis (change in threshold) can be easily produced.

The insulation film under the charge holding film 19 may be designed separately from the gate insulation film. It is also possible to design and form the gate electrode while giving priority on suppression of a short channel effect and to form the insulation film under the charge holding film so as to be thicker or thinner than the gate insulation film.

Embodiment 10

Figure 15:
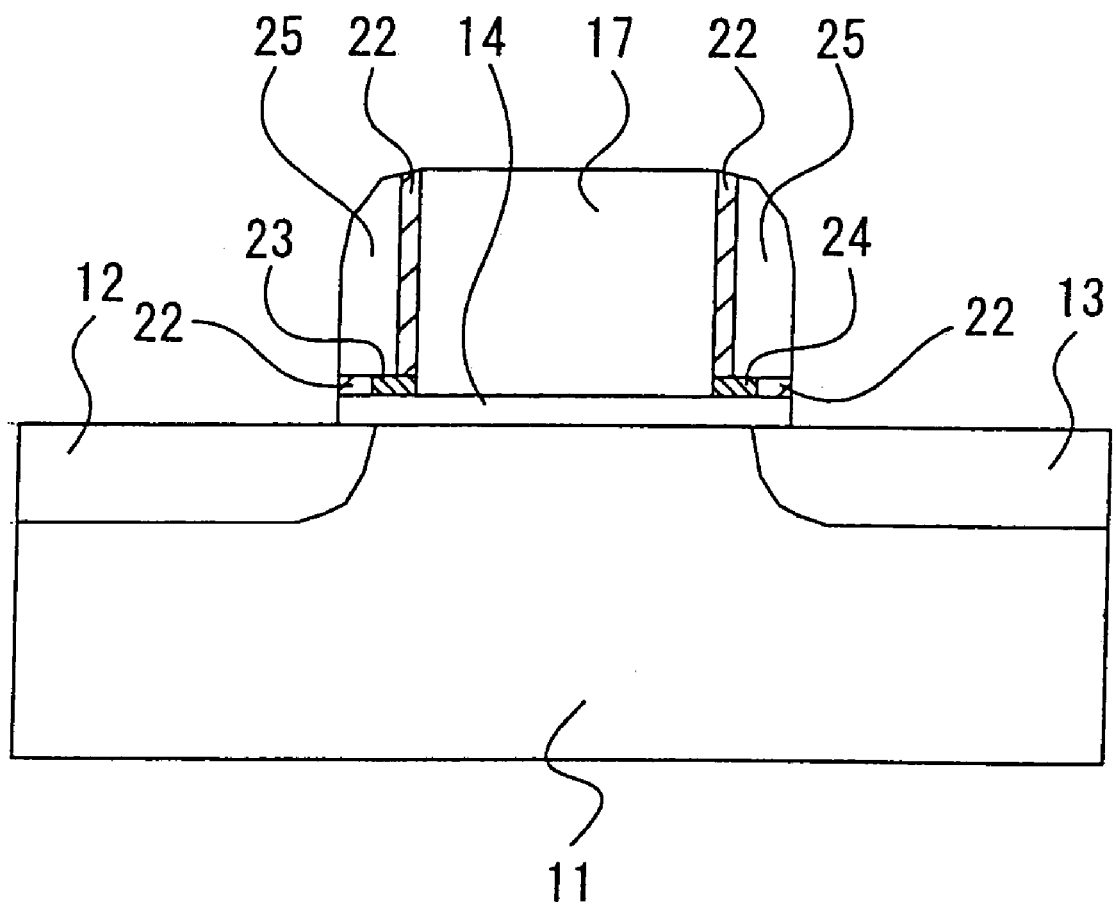
FIG. 15 is a schematic sectional view of a main part showing a semiconductor storage device (Embodiment 10) of the present invention.

A semiconductor storage device of Embodiment 10 is substantially the same as the semiconductor storage device of Embodiment 9 except that, as shown in FIG. 15, a charge holding film 22 is formed in an L shape on the gate insulation film 14 and is covered with a gate sidewall insulation film 25 which is a silicon oxide film.

In the semiconductor storage device, portions in which charges are actually accumulated or trapped and storage is held are regions 23 and 24 in the charge holding film 22.

The semiconductor storage device of this embodiment produces effects similar to those of the semiconductor storage device of Embodiment 9. The charge holding film 22 is sandwiched between the gate insulation film 14 and a gate sidewall insulation film 25, thereby forming an ONO film structure. The structure increases efficiency of injecting electrons/holes, so that operation speed can be increased.

Figure 16:
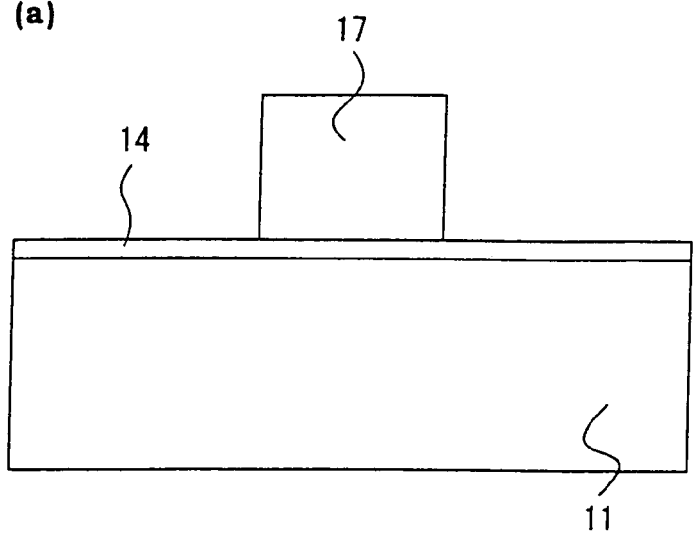
FIG. 16 is a schematic sectional view of a main part for describing the flow of a manufacturing method of the semiconductor storage device (Embodiment 10) of the present invention.

A manufacturing method of the semiconductor storage device will be described with reference to FIG. 16. Formation of a device isolation region and the like will be omitted.

First, as shown in FIG. 16(a), on the P-type well 11, the gate insulation film 14 which is made by a silicon oxide film or a silicon nitrooxide film having a thickness of about 1 to 6 nm, or a high-dielectric-constant film having a thickness of about 1 to 100 nm is formed. Further, the gate electrode 17 is patterned.

Figure 16B:
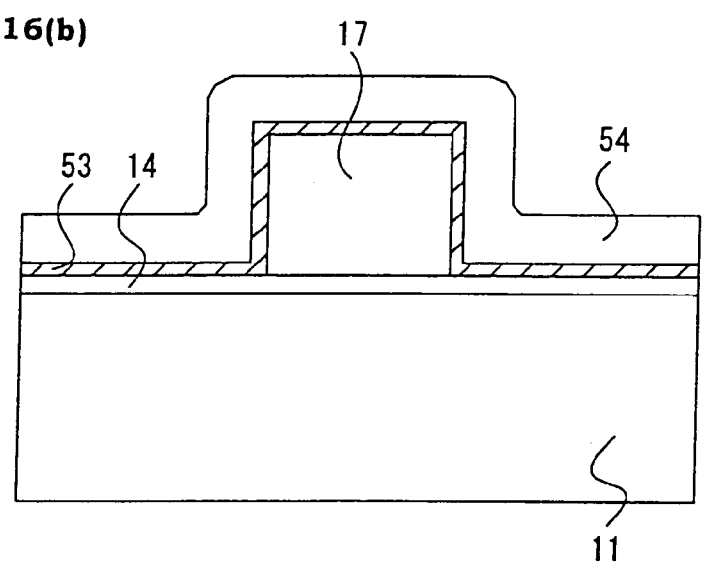

As shown in FIG. 16(b), on the whole surface of the semiconductor substrate obtained, a silicon nitride film 53 having a thickness of about 5 to 20 nm and a silicon oxide film 54 having a thickness of about 20 to 100 nm are deposited in this order by CVD.

In a patterning process (etching process) in which the gate insulation film exposed at the time of performing the process of patterning the gate electrode 17 of FIG. 16(a) is damaged, the exposed gate insulation film except for the gate insulation film under the gate electrode is removed and, after that, a silicon oxide film or a silicon oxynitride film formed by oxidation or CVD or a high dielectric constant film formed by CVD or the like may be formed under the silicon nitride film 53 in advance.

Figure 16C:
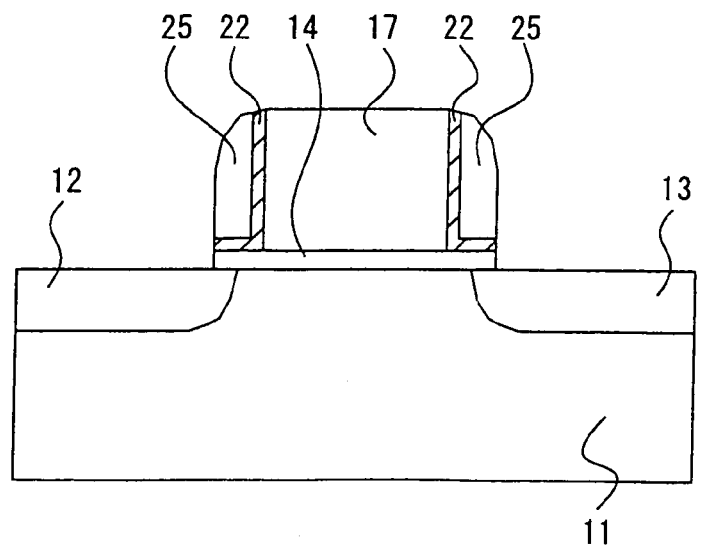

Subsequently, as shown in FIG. 16(c), the silicon oxide film 54 and the silicon nitride film 53 are selectively etched back toward the gate electrode 17 and the semiconductor substrate. By the etching, the charge holding film 22 made by the silicon nitride film 53 having an L shape and the gate sidewall insulation film 25 covering the charge holding film 22 are formed. After that, the diffusion regions 12 and 13 are formed.

As described above, the semiconductor storage device of this embodiment can be manufactured by simple processes of only the insulation film forming process and the etch back process.

Embodiment 11

Figure 17:
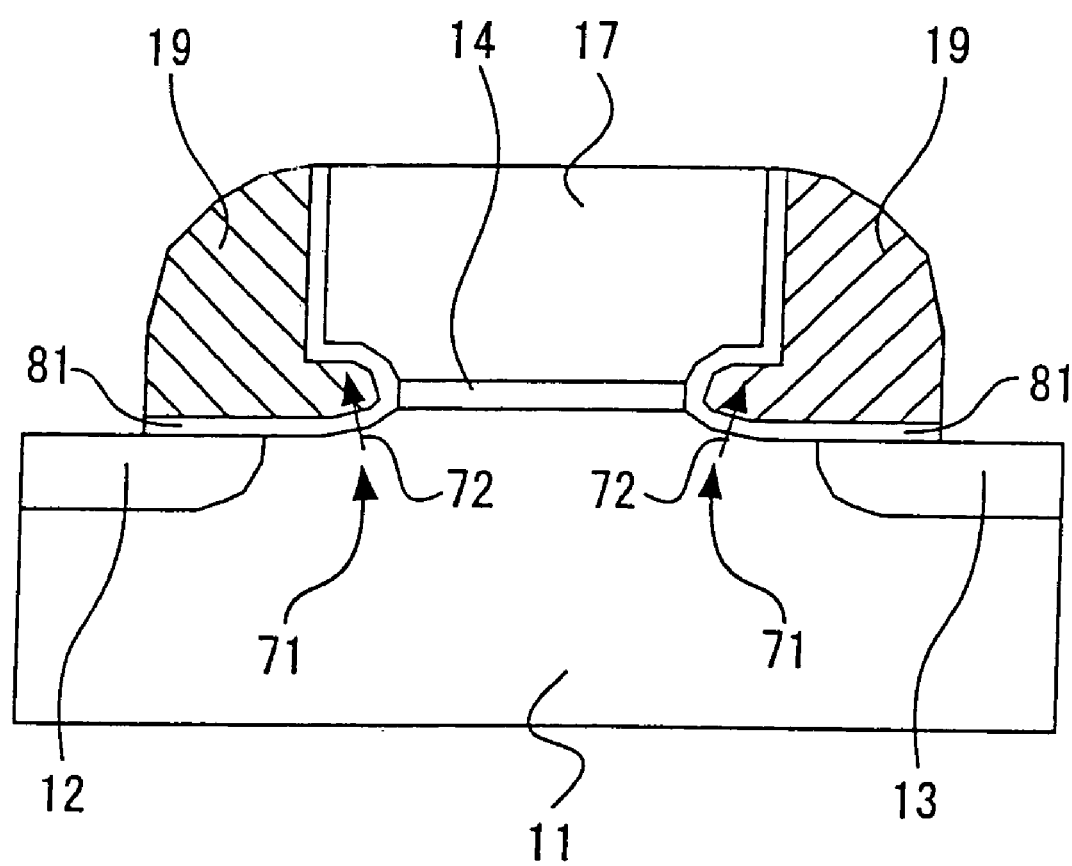
FIG. 17 is a schematic sectional view of a main part showing a semiconductor storage device (Embodiment 11) of the present invention.

A semiconductor storage device of Embodiment 11 is substantially the same as that of Embodiment 9 except that, as shown in FIG. 17, the gate electrode 17 has recesses at its both lower ends, at least a part of the charge holding film 19 which is made by a silicon nitride film is buried in each of the recesses, and the charge holding film 19 and the gate electrode 17 are partitioned by the silicon oxide film 81.

The semiconductor storage device also produces effects similar to those of the semiconductor storage device of Embodiment 9.

Further, at the time of an erasing operation, hot holes generated around regions indicated by arrows 71 in FIG. 17 are attracted by the gate electrode having the negative potential. As shown by arrows 72, the hot holes are efficiently injected into the charge holding film 19. Consequently, the erasing operation can be performed at higher speed.

In the semiconductor storage device, a portion in which charges are actually accumulated or trapped and storage is held is mainly a portion (around the tip of each of the arrows 72) in the charge holding film 19, which is buried in the recess of the gate electrode.

A manufacturing method of the semiconductor storage device will be described with reference to FIG. 18. Formation of a device isolation region and the like will be omitted.

First, as shown in FIG. 18(a), the gate insulation film 14 and the gate electrode 17 are formed on the P-type well 11 and, after that, the whole surface is oxidized, thereby forming a silicon oxide film 51. The thickness of the silicon oxide film at this time can be set to, for example, 5 nm to 20 nm. In this case, a bird's beak is formed in a wedge shape in each of both lower ends of the gate electrode 17.

Figure 18:
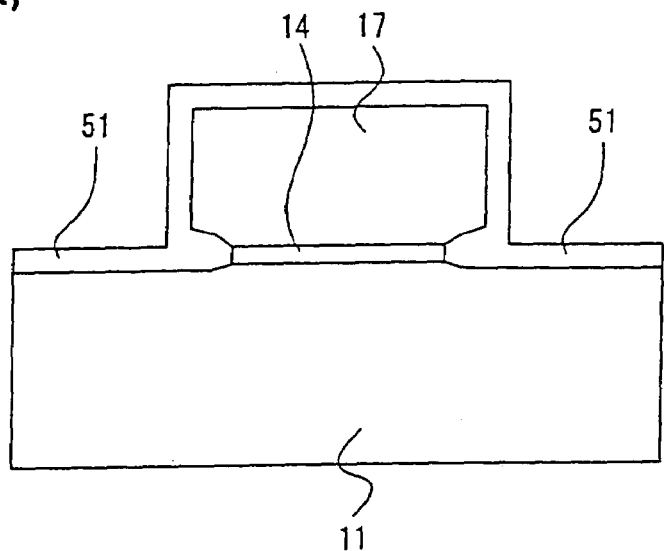
FIG. 18 is a schematic sectional view of a main part for describing the flow of a manufacturing method of the semiconductor storage device (Embodiment 11) of the present invention.
Figure 18B:
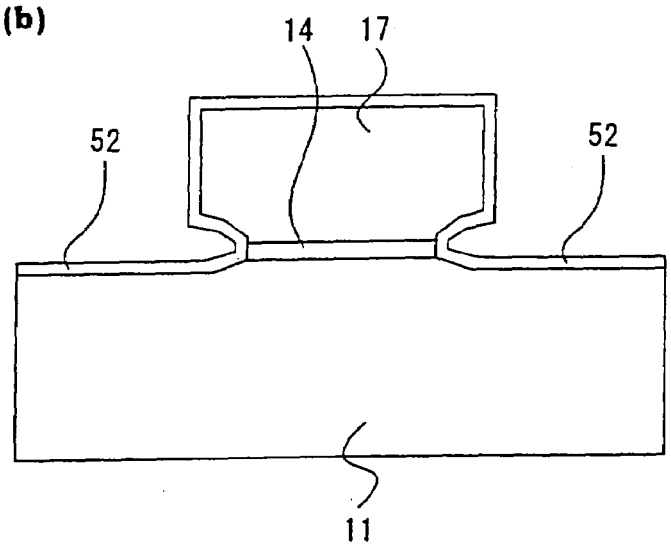
Figure 18C:
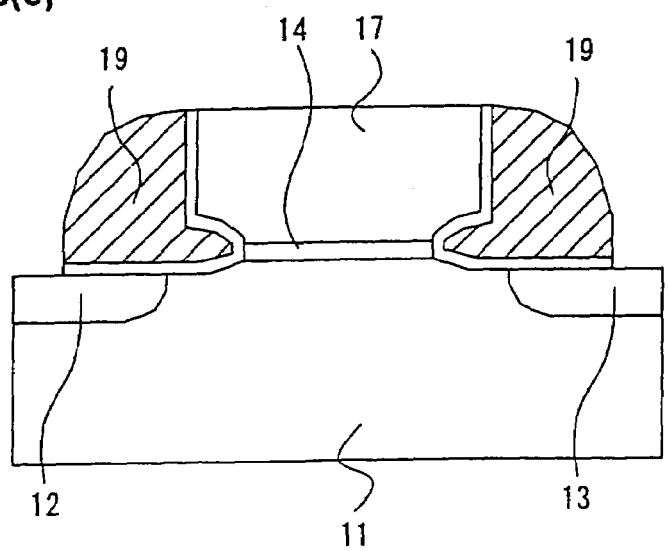

Next, as shown in FIG. 18(*b*), after the silicon oxide film 51 is removed by isotropic etching, the whole surface is re-oxidized to thereby form a silicon oxide film 52. The silicon oxide film 52 is an insulation film which partitions the charge holding film from the gate electrode, the channel region (well region) and the diffusion regions (source/drain regions). Although the thickness of the silicon oxide film at this time is not particularly limited, it is preferably 4 nm to 20 nm from the viewpoint of realizing both the rewriting characteristic and the retention characteristic of the semiconductor storage device.

Next, as shown in FIG. 18(*c*), a silicon nitride film is deposited on the whole surface (to a thickness of, for example, 20 nm to 200 nm) and, after that, etched back, thereby forming the charge holding film 19 serving as a gate sidewall insulation film. After that, by performing impurity ion implantation and heat treatment while using the charge holding film 19 as a mask, the diffusion regions 12 and 13 are formed. In such a manner, the semiconductor storage device is completed (upper wirings and the like are omitted).

Embodiment 12

Figure 19:
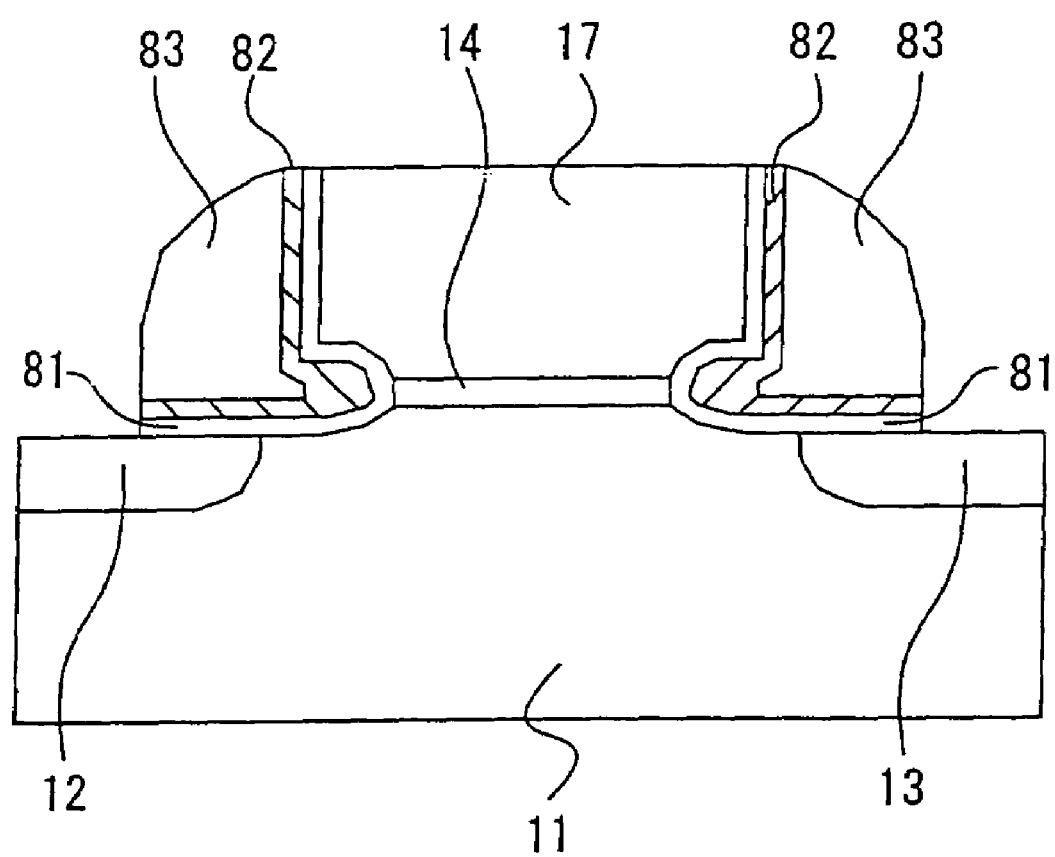
FIG. 19 is a schematic sectional view of a main part showing a semiconductor storage device (Embodiment 12) of the present invention.

A semiconductor storage device of Embodiment 12 is substantially the same as the semiconductor storage device of Embodiment 11 except that, as shown in FIG. 19, the charge holding film 82 which is a silicon nitride film at least a part of which is buried in the recess of the gate electrode 17 is sandwiched between the silicon oxide films 81 and 83.

The semiconductor storage device also produces effects similar to those of the semiconductor storage device of Embodiment 11. The charge holding film 82 has an ONO film structure that it is sandwiched between the silicon oxide films 81 and 83, so that the efficiency of injecting electrons and holes is increased and the operation speed can be increased.

The semiconductor storage device can be formed in such a manner that, for example, in the manufacturing method of the semiconductor storage device of Embodiment 11, after that state of FIG. 18(*b*), a silicon nitride film (for example, 5 nm to 15 nm) and a silicon oxide film (for example, 20 nm to 200 nm) are deposited in this order, and the silicon oxide film and the silicon nitride film are etched back.

Embodiment 13

Figure 20:
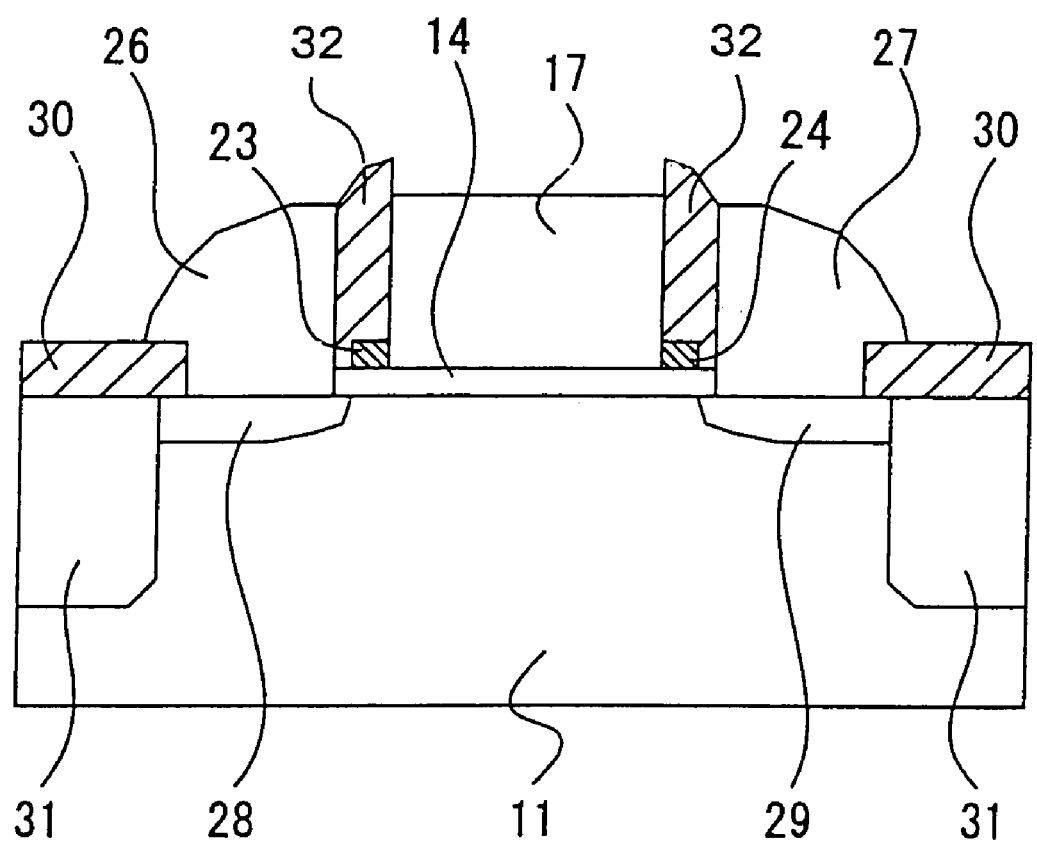
FIG. 20 is a schematic sectional view of a main part showing a semiconductor storage device (Embodiment 13) of the present invention.

In a semiconductor storage device of Embodiment 13, as shown in FIG. 20, on the P-type well 11 formed in the semiconductor substrate having device isolation regions 31, the gate electrode 17 is formed via the gate insulation film 14 which is a silicon oxide film having a thickness of about 1 to 6 nm. On the sidewall of the gate electrode 17, a charge holding film 32 which is a silicon nitride film having a thickness of about 20 to 100 nm is formed. The form of the charge holding film is not limited to this embodiment but is various as described above. On the sidewalls of the charge holding film 32, further, sidewalls 26 and 27 made of polysilicon are formed. Into the surface of the wells 11 immediately under the sidewalls 26 and 27, an N-type impurity is soaked, thereby forming N-type regions 28 and 29, respectively. The sidewall 26 and the N-type region 28 are integrated to constitute a first diffusion region. Similarly, the sidewall 27 and the N-type region 29 constitute a second diffusion region. The surface of the device isolation region 31 is covered with a silicon nitride film 30.

Portions in which charges are actually accumulated or trapped to hold storage in the semiconductor storage device are the regions 23 and 24 in the charge holding films 32.

In the semiconductor storage device, the diffusion region has a risen structure made of polysilicon, so that it is very easy to realize a shallow junction. Therefore, a short channel effect can be suppressed extremely effectively and scale-down of the device can be achieved.

Although not shown, a margin at the time of providing a contact in the diffusion region can be made smaller as compared with the case where the risen structure is not provided. Therefore, the junction area between the diffusion region and the well can be made considerably small and the junction capacitance can be reduced. Thus, high-speed operation can be achieved and power consumption can be suppressed.

Further, when the semiconductor storage device is operated at a voltage which is low to the degree that writing is not performed, a logic circuit can be constituted as a normal field effect transistor realizing lower power consumption, higher speed operation, and scale-down. That is, a device having a common structure can be used as a device as a component of a logic circuit and a device as a component of a memory circuit. Therefore, the process of forming both a logic circuit and a memory circuit can be much simplified.

A forming method of the semiconductor storage device will be described with reference to FIG. 21 and FIG. 22.

Figure 21:
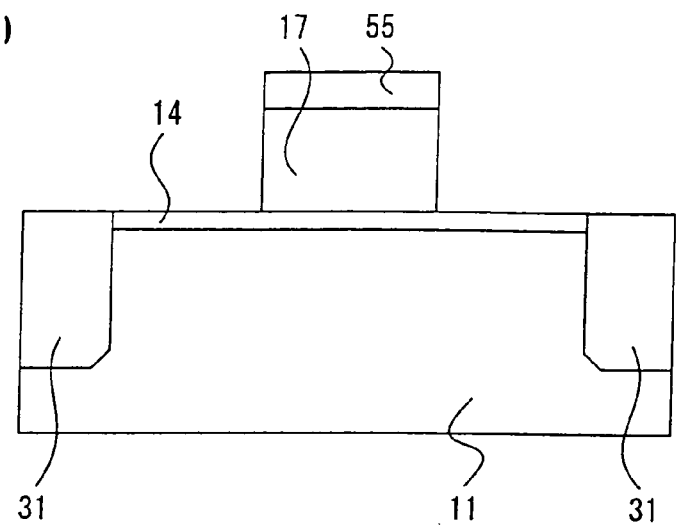
FIG. 21 and FIG. 22 are schematic sectional views of a main part for describing the flow of a manufacturing method of the semiconductor storage device (Embodiment 13) of the present invention.
Figure 21B:
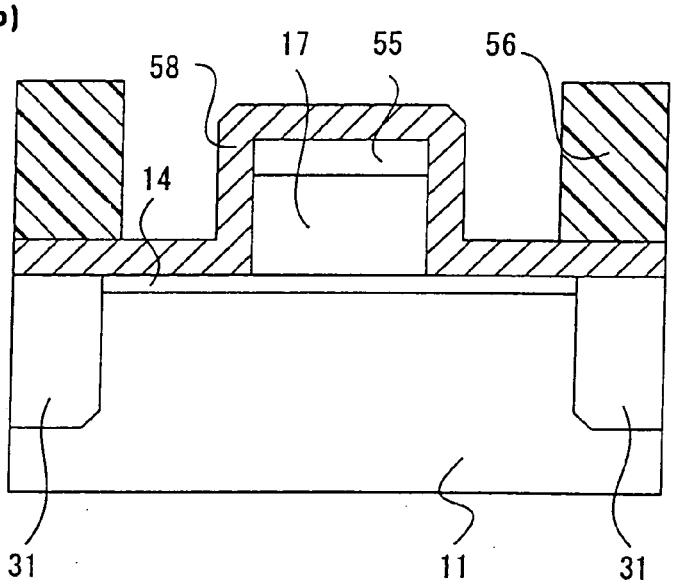
Figure 21C:
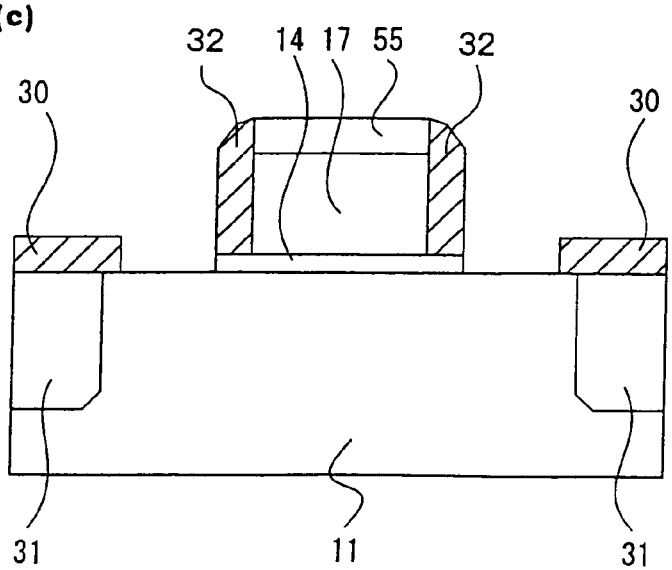

First, as shown in FIG. 21(*a*), the P-type well 11 is formed in the semiconductor substrate and, subsequently, the device isolation regions 31 are formed by using, for example, STI method. On the obtained well 11, the gate insulation film 14 which is a silicon oxide film having a thickness of about 1 to 6 nm is formed. After that, a polysilicon film which will become a gate electrode and an insulation film 55 are deposited in this order. After that, by using a resist pattern in a predetermined shape as a mask, the polysilicon film and the insulation film 55 are patterned. Alternately, it is also possible to pattern only the insulation film 55 by using the resist pattern as a mask, remove the resist pattern and, after that, etch the polysilicon film by using the insulation film 55 as a mask. By the above operation, the gate electrode 17 having a cap formed by the insulation film 55 is formed.

As shown in FIG. 21(*b*), a silicon nitride film 58 is deposited on the whole surface of the obtained semiconductor substrate, and the device isolation regions 31 are masked with a resist pattern 56.

Subsequently, as shown in FIG. 21(*c*), by using the resist pattern 56 as a mask, the silicon nitride film 58 is etched back, thereby forming the charge holding film 32 by the silicon nitride film on the sidewalls of the gate electrode 17 and the insulation film 55 and leaving the silicon nitride film 30 on the device isolation regions 31. The silicon nitride film 30 protects the semiconductor substrate and the device isolation regions 31 in an etching process to be performed later. Particularly, it is important in an etch back process for forming the sidewalls 26 and 27 by polysilicon, an etching process for removing the insulation film 55, and an etching process for forming a contact hole in the diffusion region, which will be described later.

Figure 22:
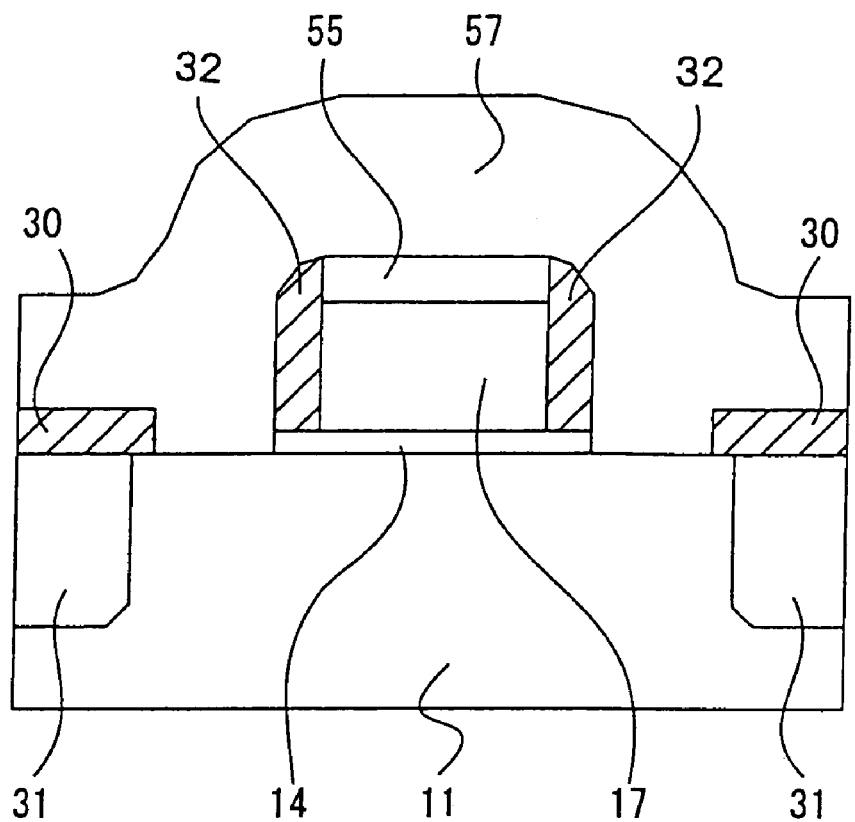

As shown in FIG. 22(*d*), a polysilicon film 57 is deposited on the whole surface of the obtained semiconductor substrate.

Next, the polysilicon film 57 is etched back until the insulation film 55 is exposed. At this time, preferably, a part of the polysilicon film 57 extends onto the silicon nitride film 30 and completely covers the device isolation regions 31.

Figure 22E:
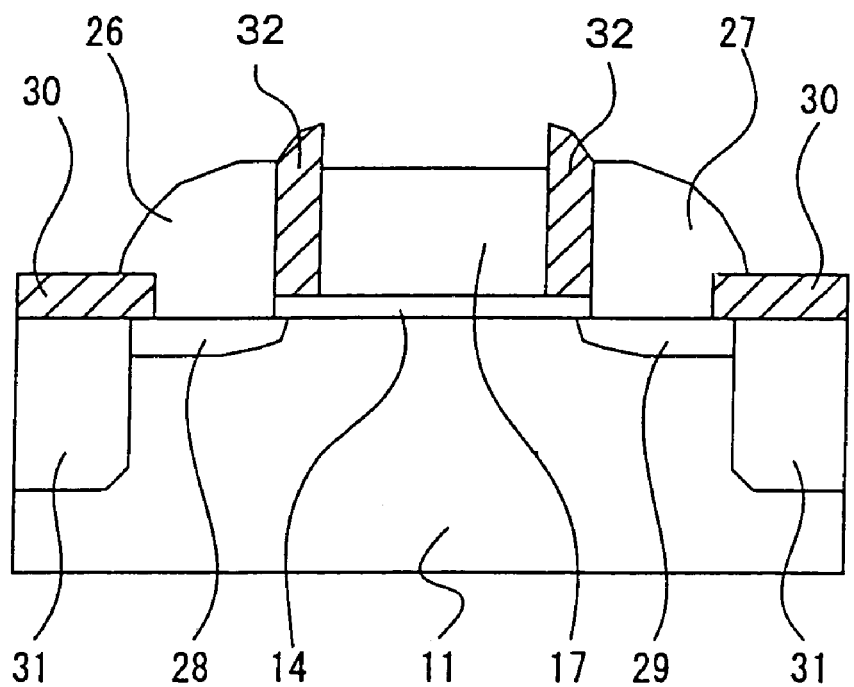

After that, as shown in FIG. 22(e), the insulation film 55 is removed by isotropic etching. At the time of etching, the silicon nitride film 30 serves as a stopper so that the device isolation regions 31 can be prevented from being over-etched. Subsequently, a resist pattern of a predetermined shape is used as a mask and a part of the polysilicon film 57 is removed by anisotropic etching, thereby forming the sidewalls 26 and 27 which are separated from each other. When an impurity is implanted into the sidewalls 26 and 27, each of the sidewalls 26 and 27 constitutes a diffusion region (source or drain region).

Next, impurity ions are implanted into the gate electrode 17 and the sidewalls 26 and 27 and annealing for activating the impurity is performed. The impurity ions are diffused into the well 11 to form the regions 28 and 29 which become integrated with the sidewalls 26 and 27, respectively, thereby forming diffusion regions.

According to the semiconductor storage device, while realizing storage of two bits per one transistor, a short channel effect is extremely suppressed and scale-down can be realized. In addition, both higher-speed operation and lower power consumption can be achieved.

Further, the semiconductor storage device can be used as it is as a transistor serving as a component in a logic circuit. Consequently, the process of forming both a logic circuit and a memory circuit can be simplified very much.

In addition, by solid phase diffusing the impurity ions injected in the sidewalls 26 and 27 into the well 11, a junction having a sharp profile between the source/drain regions and the well region can be formed. Specifically, a sharp profile junction can be formed by the source/drain regions having an impurity concentration of $10^{20}$ cm$^{-3}$ or higher and the well having an impurity concentration of $10^{18}$ cm$^{-3}$ or higher. A drain withstand voltage when 1V is applied to the gate electrode can be set to 3V or less. Consequently, only by setting the gate electrode to 3V, one of the N-type source and drain regions and the well to the GND, and the other one of the N-type source and drain regions to 3V, electrons can be injected into the charge holding film in the vicinity of the source/drain region which is set to 3V. In contrast, only by setting −2V to the gate electrode, one of the N-type source/drain regions to GND, the well to 0.8V (a voltage almost equal to a built-in potential of a PN junction or a voltage slightly higher than the built-in potential of the PN junction), and the other N-type source/drain region to 3V, holes can be injected to the charge holding film in the vicinity of the source/drain regions which are set to 3V. As described above, by designing the junction between the source/drain regions and the well region to have a sharp profile, the drain withstand voltage can be set to be low. By the effect, a write/erase voltage can be set to be low.

Embodiment 14

A new writing/erasing method of the semiconductor storage device of the present invention will be described.

In the writing/erasing method, as will be described below, electric field between a bit line and a word line is used. Consequently, for example, the structure of Embodiment 13 is effective, but the method can be also applied to the structures of the other embodiments. In this case, by providing a word line connected to a gate electrode or having the function of the gate electrode itself and a bit line connected to the source/drain region so as to cross each other, a strong electric field can be applied only to a selected charge holding film.

A selected bit line is set to a reference potential (for example, 0V). In this case, +VDD is applied to a selected word line, +2/3VDD is applied to a not-selected bit line, and +1/3VDD is applied to a not-selected word line. By the application, an electric field difference VDD is applied to a charge holding film having the selected word line and the selected bit line as counter electrodes, and the electric field difference 1/3VDD is applied to all of the other charge holding films. When the charge holding film in which writing/erasing can be performed with the electric field difference VDD and writing/erasing does not occur with the electric field difference 1/3VDD is used, random-access writing/erasing can be realized. In this method, writing/erasing is performed directly with tunnel current, so that writing/erasing can be performed with low current and it produces an effect of realizing low power consumption.

Figure 23A:
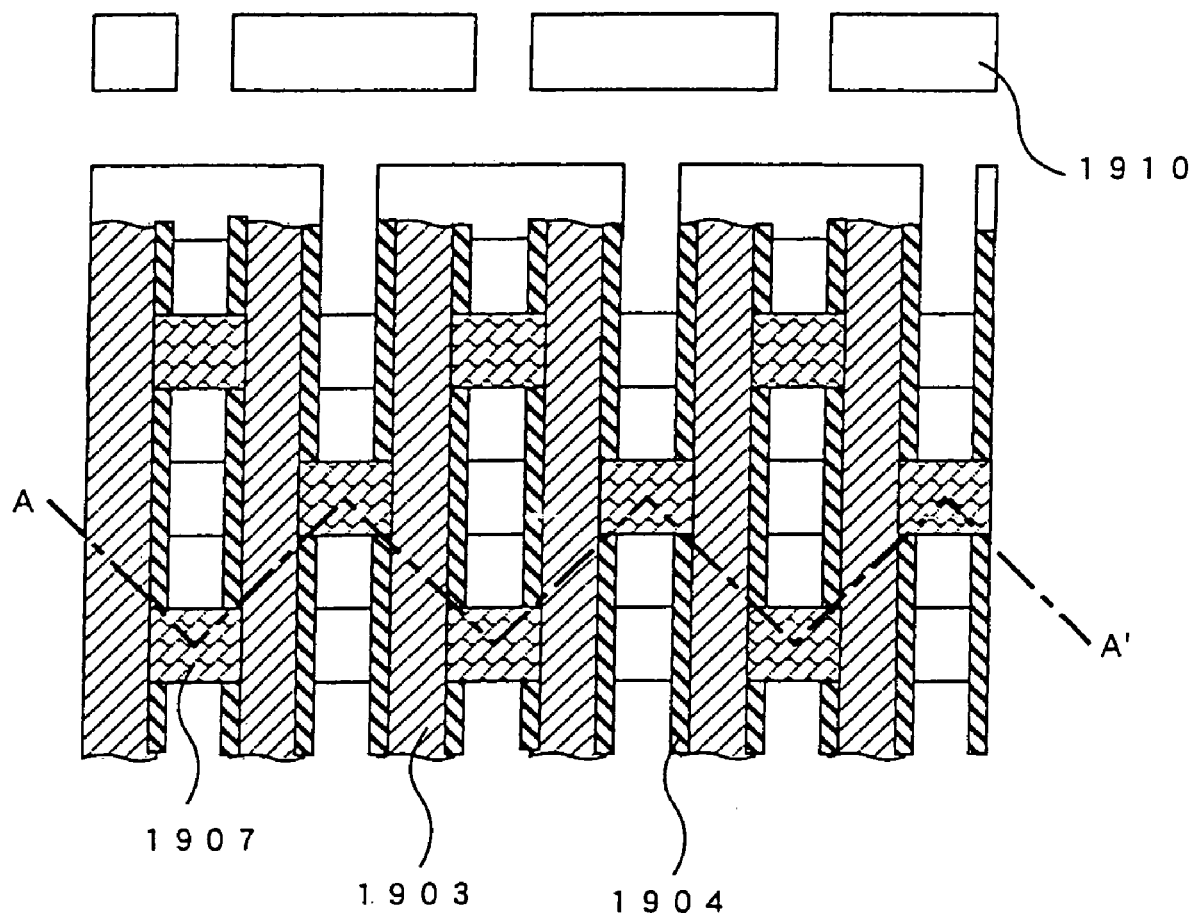
FIG. 23 is a schematic sectional view of a main part of a semiconductor storage device (Embodiment 14) of the present invention.
Figure 23B:
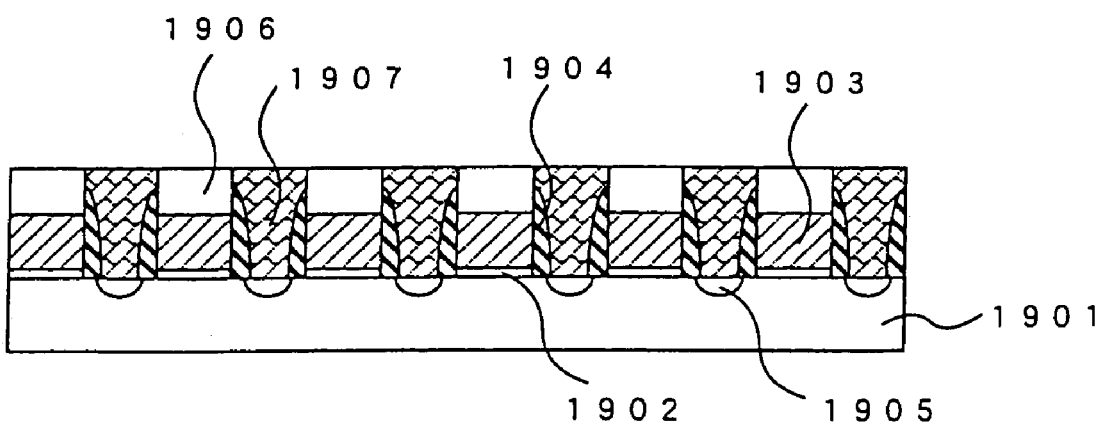

A large-scale integrated memory using a bulk substrate is constituted by, as shown in FIGS. 23(a) and 23(b), a first conductivity type well region 1901 formed in a semiconductor substrate (the semiconductor substrate surface), a gate insulation film 1902 formed on the well region 1901, a plurality of word lines 1903 formed on the gate insulation film, a plurality of second conductivity type diffusion regions 1905 formed on both sides of the plurality of word lines 1903, a charge holding film 1904 formed on, at least, a part of the diffusion regions or a part of the well region and a part of the diffusion regions on both sides of the plurality of word lines on the word line, well region and diffusion region directly or via an insulation film, and having the function of accumulating or trapping charges, and a plurality of bit lines (not shown) connected to the plurality of diffusion regions and extending in the direction which crosses the word lines. In FIG. 23(a), reference numeral 1910 denotes a device isolation region. FIG. 23(b) is a sectional view taken along line A–A' of FIG. 23(a). Preferably, the charge holding film 1904 is sandwiched between a terminal (which may be a bit line itself) 1907 connecting a bit line (not shown) and the second conductivity type diffusion region (source/drain region) 1905 and the word line (gate electrode) 1903. In this case, by applying an electric field directly across the gate electrode and the terminal, electrons or holes can be injected or moved between selected two nodes. As compared with injection of hot electrons or hot holes, writing/erasing efficiency can be further improved.

In the case where memory cells are not provided at high density as shown in FIG. 23, an interlayer insulation film is interposed between the terminal 1907 for connecting the second conductivity type diffusion region (source/drain region) 1905 and the charge holding film 1904. As the writing/erasing method in this case, the method of Embodiment 6 is used more preferably than the method described in Embodiment 14.

Embodiment 15

Figure 24:
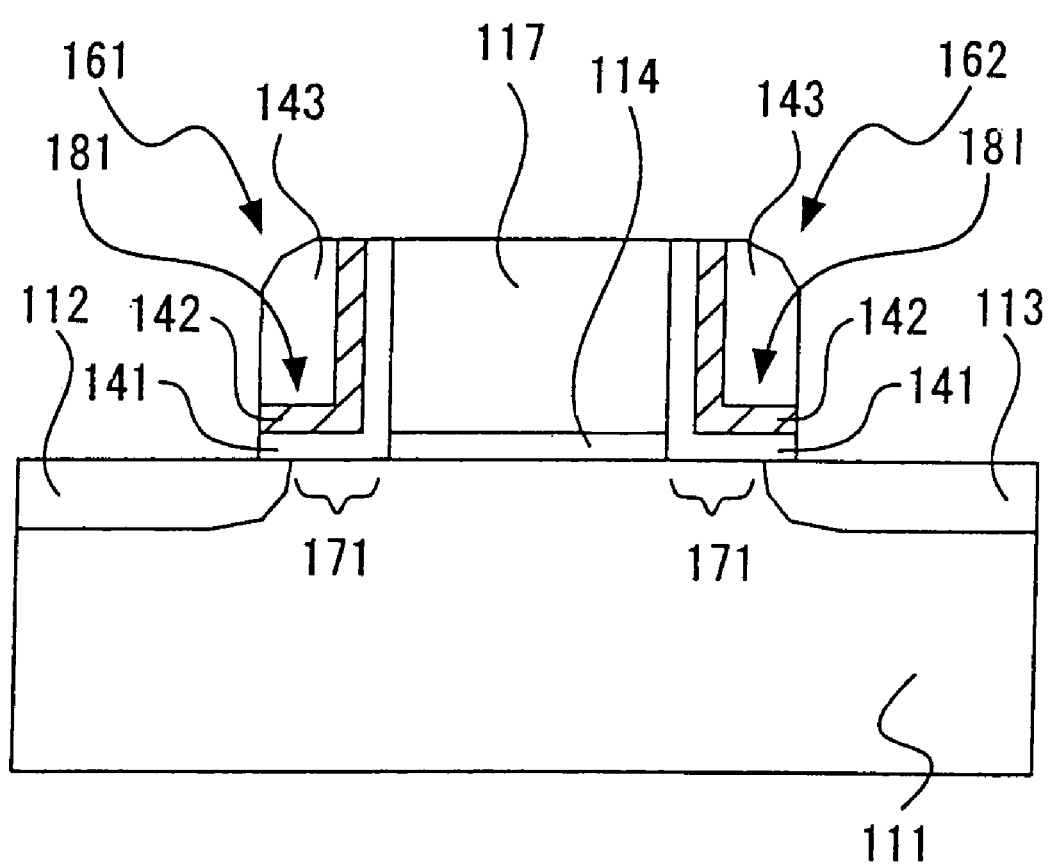
FIG. 24 is a schematic sectional view of a main part of a semiconductor storage device (Embodiment 15) of the present invention.

In a semiconductor storage device of Embodiment 15, each of memory functional elements 161 and 162 is constituted by a region for holding charges (a region for storing charges, which may be a film having the function of holding charges) and a region which suppresses escape of charges (which may be a film having the function of suppressing escape of charges). For example, as shown in FIG. 24, each of the memory functional elements has an ONO structure. Specifically, a silicon nitride film 142 is sandwiched between a silicon oxide film 141 and a silicon oxide film 143, thereby constituting the memory functional elements 161 and 162. Herein, the silicon nitride film has the function of holding charges. The silicon oxide films 141 and 143 play the role of a film having the function of suppressing escape of charges accumulated in the silicon nitride film.

The regions (silicon nitride film 142) for holding charges in the memory functional elements 161 and 162 overlap with diffusion regions 112 and 113, respectively. Overlap denotes herein that at least a part of the region (silicon nitride film 142) for holding charges exists over the region of at least a part of the diffusion regions 112 and 113. Reference numeral 111 denotes a semiconductor substrate, reference numeral 114 denotes a gate insulation film, reference numeral 117 denotes a gate electrode, and reference numeral 171 denotes an offset region (between the gate electrode and the diffusion region). Although not shown, the uppermost surface portion of the semiconductor substrate 111 under the gate insulation film 114 is a channel region.

An effect produced by overlap between the region 142 for holding charges and the diffusion regions 112 and 113 in the memory functional elements 161 and 162 will be described.

Figure 25:
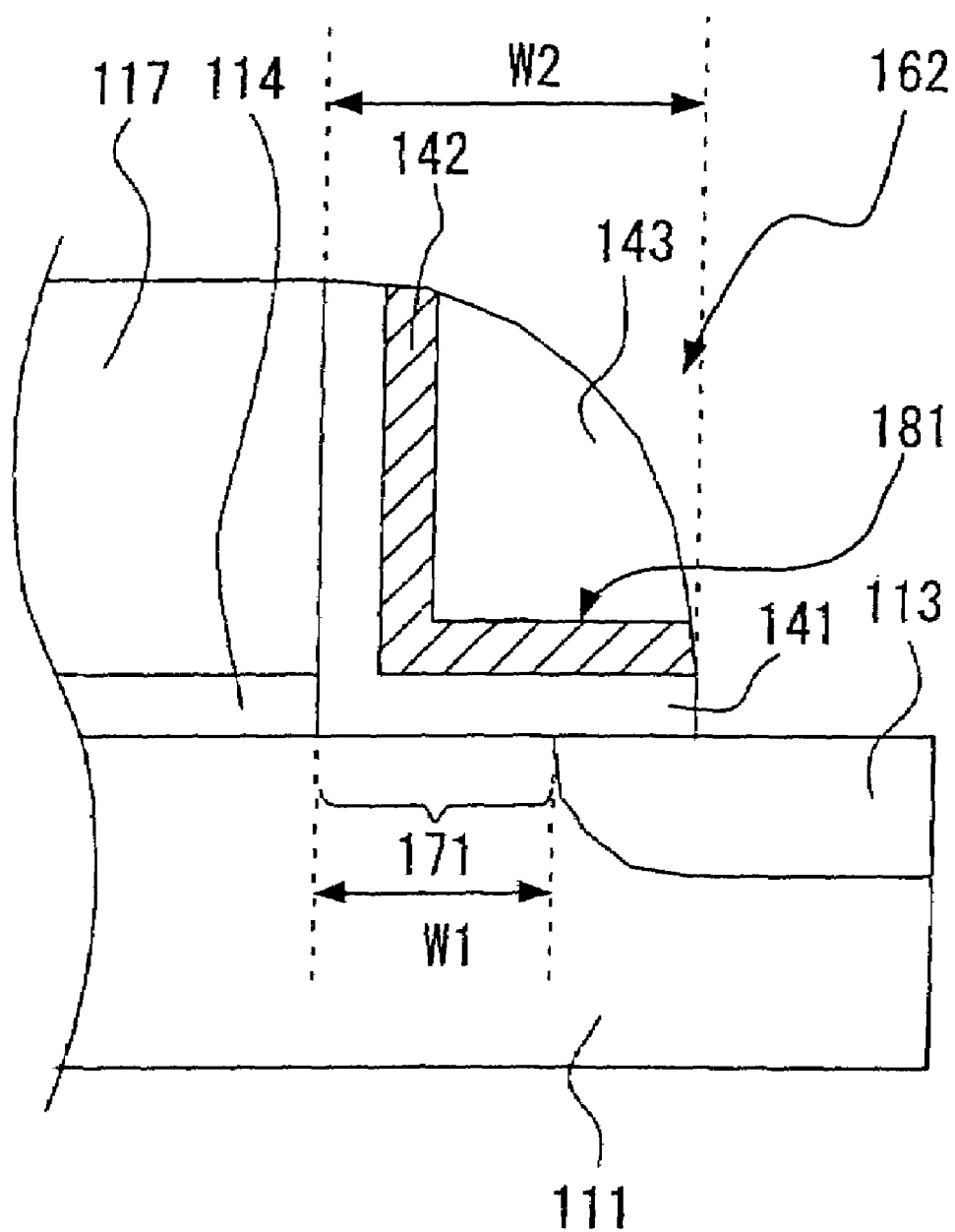
FIGS. 25 and 26 are enlarged schematic sectional views of the main part of FIG. 24.

FIG. 25 is an enlarged view of a portion around the memory functional element 162 on the right side in FIG. 24. W1 denotes an offset amount between the gate electrode 114 and the diffusion region 113. W2 denotes the width of the memory functional element 162 in a cutting plane in the channel length direction of the gate electrode. Since an end on the side far from the gate electrode 117 of the silicon nitride film 142 in the memory functional element 162 coincides with the end of the memory functional element 162 on the side far from the gate electrode 117, the width of the memory functional element 162 is defined as W2. The amount of overlap between the memory functional element 162 and the diffusion region 113 is expressed as W2−W1. Particularly, it is important that the silicon nitride film 142 in the memory functional element 162 overlaps with the diffusion region 113, that is, the relation of W2>W1 is satisfied.

Figure 26:
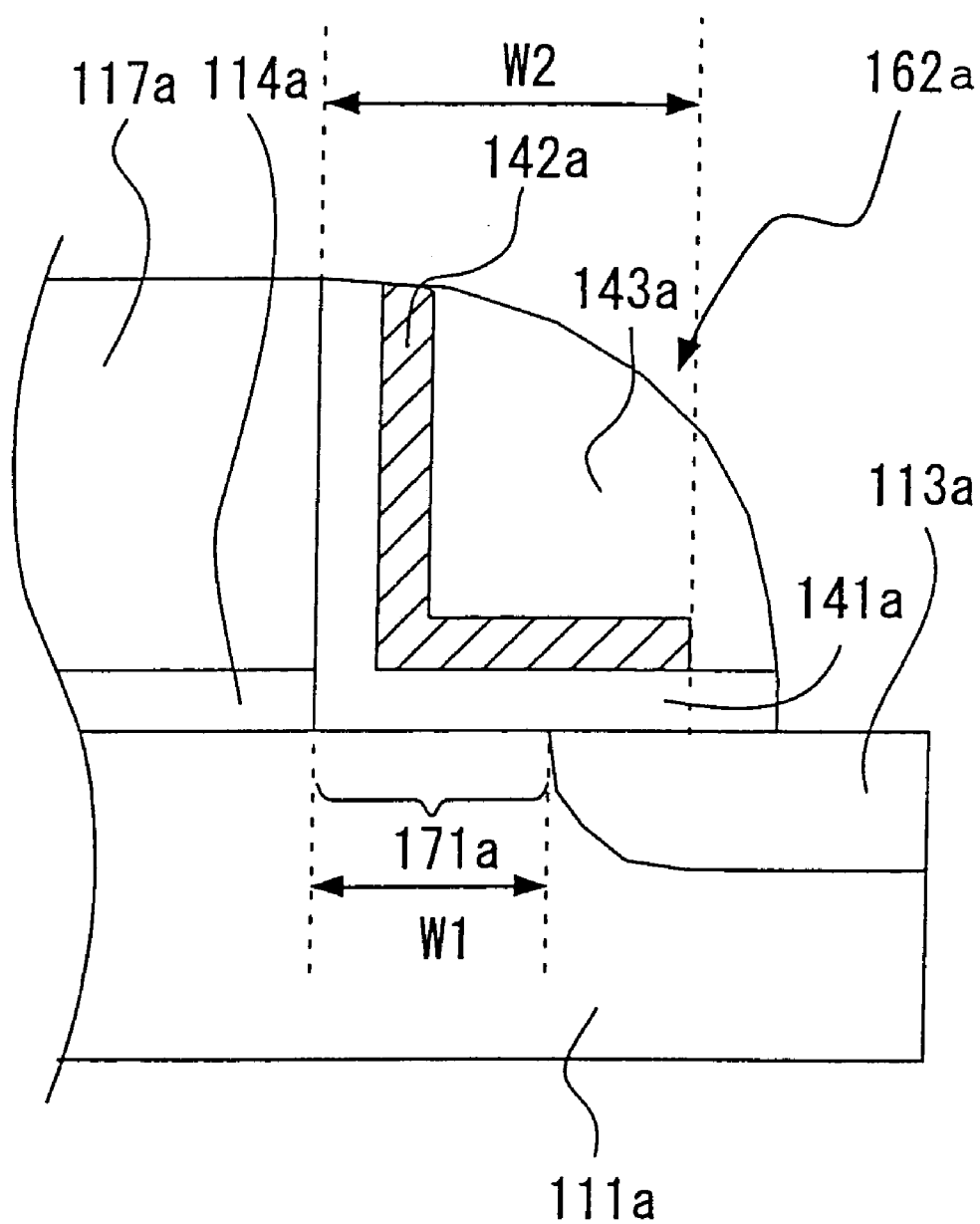

As shown in FIG. 26, in the case where an end on the side far from the gate electrode of a silicon nitride film 142a in a memory functional element 162a does not coincide with the end of the memory functional element 162a on the side far from the gate electrode, it is sufficient to define W2 as a width from the end of the gate electrode to the end far from the gate electrode of the silicon nitride film 142a.

Figure 27:
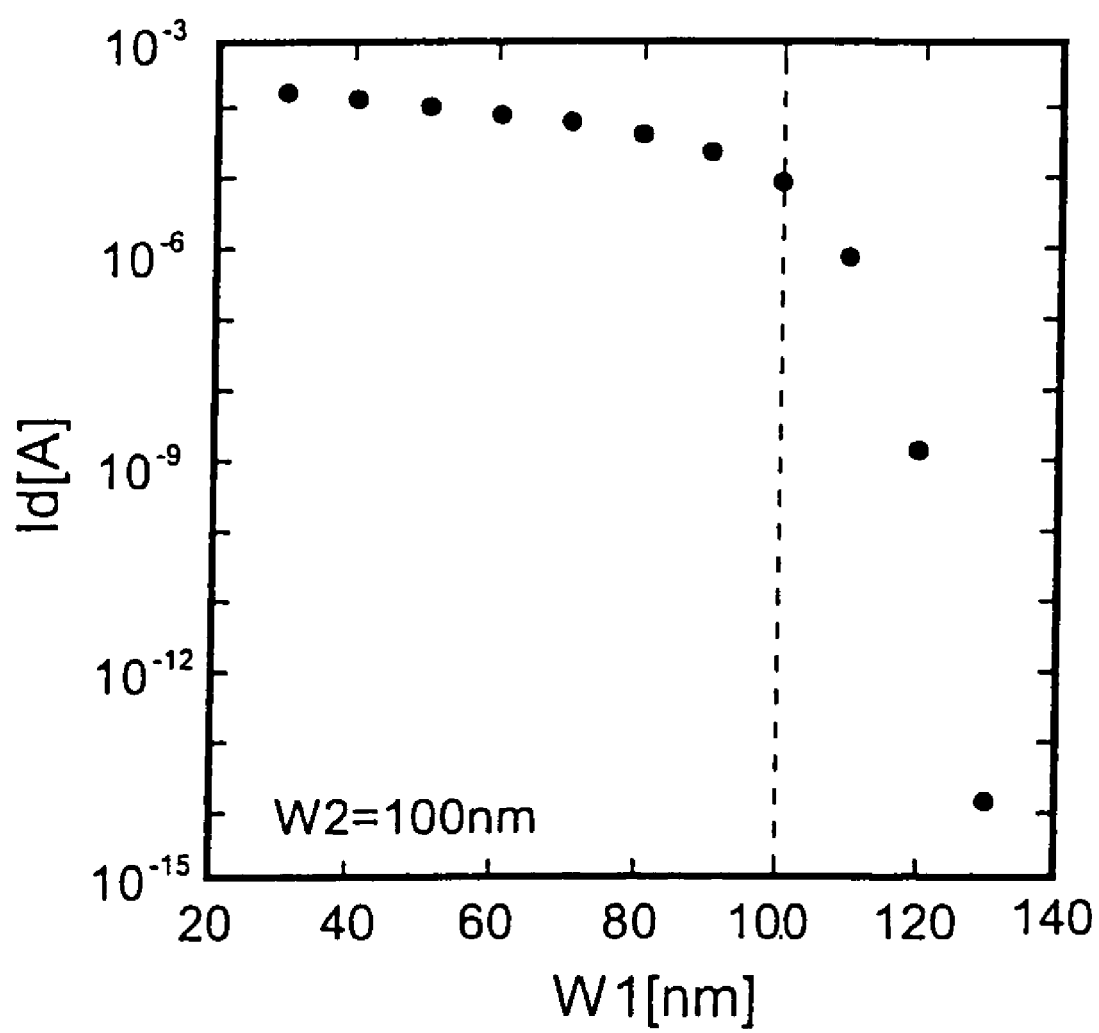
FIG. 27 is a graph showing electric characteristics of the semiconductor storage device (Embodiment 15) of the present invention.

FIG. 27 shows a drain current Id when, in the structure of FIG. 25, the width W2 of the memory functional element 162 is fixed to 100 nm and the offset amount W1 is changed. Herein, the drain current is obtained by device simulation on assumption that the memory functional element 162 is in an erased state (where holes are accumulated) and the diffusion regions 112 and 113 serve as a source electrode and a drain electrode.

As obvious from FIG. 27, when W1 is 100 nm or more (that is, the silicon nitride film 142 and the diffusion region 113 do not overlap with each other), the drain current rapidly decreases. Since the drain current value is almost proportional to reading operation speed, when W1 is 100 nm or more, the performance of the memory rapidly deteriorates. On the other hand, in the range in which the silicon nitride film 142 and the diffusion region 133 overlap with each other, decrease in the drain current is gentle. Therefore, it is preferable that at least a part of the silicon nitride film 142 as a film having the function of holding charges and the source/drain regions overlap with each other.

In consideration of the result of the above device simulation, memory cell arrays were fabricated by fixing W2 to 100 nm and setting W1 to 60 nm and 100 nm as design values. In the case where W1 is 60 nm, the silicon nitride film 142 and the diffusion regions 112 and 113 overlap with each other by 40 nm as a design value. In the case where W1 is 100 nm, there is no overlap as a design value. Read time of the memory cell arrays were measured. As a result, worst cases considering variations were compared with each other. Read access time of the memory cell array fabricated by setting W1 to 60 nm as a design value is 100 times as fast as that of the other case. In practice, the read access time is preferably 100 nano seconds or less per one bit. It was however found that when W1=W2, the condition cannot be achieved at all. In the case where manufacture variations are also considered, it was found that W2−W1>10 nm is more preferable.

Preferably, information stored in the memory functional element 161 (region 181) is read out by, in a manner similar to Embodiment 6, setting the diffusion region 112 as a source electrode, setting the diffusion region 113 as a drain region, and forming a pinch-off point on the side close to the drain region in the channel region. Specifically, at the time of reading information stored in one of two memory functional elements, it is preferable to form the pinch-off point in a region close to the other memory functional element in the channel region. With the configuration, irrespective of the storage state of the memory functional element 162, stored information in the memory functional element 161 can be detected with high sensitivity, and it is a big factor to enable 2-bit operation.

On the other hand, in the case of storing information only one of two memory functional elements or in the case where two memory functional elements are used in the same storage state, it is not always necessary to form a pinch-off point at the time of reading.

Although not shown in FIG. 24, it is preferable to form a well region (a P-type well in the case of an N-channel device) in the surface of the semiconductor substrate 111. By forming the well region, while optimizing the impurity concentration of the channel region for memory operations (rewriting operation and reading operation), the other electric characteristics (withstand voltage, junction capacitance, and short-channel effect) can be easily controlled.

From the viewpoint of improving the retention characteristic of the memory, preferably, the memory functional element includes a charge holding film having the function of holding charges and an insulation film. In the embodiment, the silicon nitride film 142 having a level of trapping charges is used as the charge holding film, and the silicon oxide films 141 and 143 having the function of preventing dissipation of charges accumulated in the charge holding film are used as the insulation films. When the memory functional element includes the charge holding film and the insulation film, dissipation of charges is prevented and the retention characteristic can be improved. Further, as compared with the case where the memory functional element is constituted only by the charge holding film, the volume of the charge holding film can be properly reduced. By properly reducing the volume of the charge holding film, movement of charges in the charge holding film is limited, so that occurrence of a change in the characteristics by movement of charges during storage holding can be suppressed.

Figure 28:
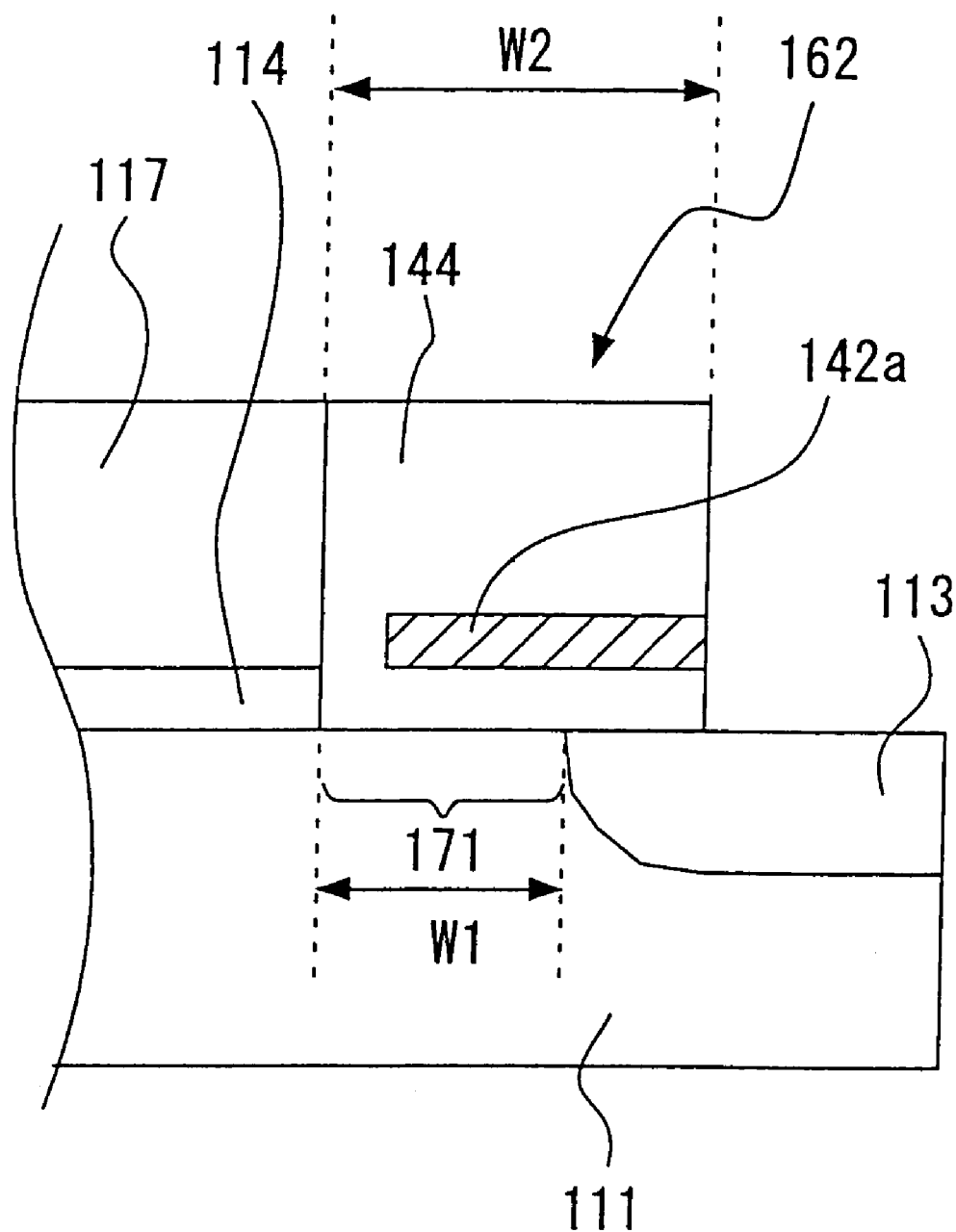
FIG. 28 is a schematic sectional view of a main part of a modification of the semiconductor storage device (Embodiment 15) of the present invention.

The memory functional element preferably includes a charge holding film which is disposed almost in parallel with the surface of the gate insulation film, in other words, the top face of the charge holding film in the memory functional element is positioned in an equal distance from the top face of the gate insulation film. Concretely, as shown in FIG. 28, the charge holding film 142a of the memory functional element 162 has a face almost parallel with the surface of the gate insulation film 114. In other words, it is preferable that a charge holding film 142a is formed so that its level is the same as that of the surface of the gate insulation film 114. By existence of the charge holding film 142a almost parallel with the surface of the gate insulation film 114 in the memory functional element 162, it can be efficiently controlled that an inversion layer is formed in the offset region 171 in accordance with the amount of charges accumulated in the charge holding film 142a and, moreover, the memory effect can be increased. By setting the charge holding film 142a almost parallel with the surface of the gate insulation film 114, even in the case where the offset amount (W1) various, a change in the memory effect can be kept relatively small and variations in the memory effect can be suppressed. Moreover, movement of charges to the upper part of the charge holding film 142a is suppressed, and occurrence of a change in characteristics by movement of charges during storage holding can be suppressed.

Further, the memory functional element 162 preferably includes an insulation film (for example, a portion above the offset region 171 in the silicon oxide film 144) which partitions between the charge holding film 142a almost parallel with the surface of the gate insulation film 114 and a channel region (or a well region). By the insulation film, dissipation of charges accumulated in the charge holding film is suppressed. A semiconductor storage device having a better retention characteristic can be obtained.

By controlling the thickness of the charge holding film 142a and controlling the thickness of the insulation film (the portion above the offset region 171 in the silicon oxide film 144) under the charge holding film 142a to be constant, the distance from the surface of the semiconductor substrate to a charge accumulated in the charge holding film can be maintained to be almost constant. Specifically, the distance from the surface of the semiconductor substrate to charges accumulated in the charge holding film can be controlled to be in a range from the minimum thickness value of the insulation film under the charge holding film 142a to a sum of the maximum film thickness value of the insulation film under the charge holding film 142a and the maximum film thickness value of the charge holding film 142a. Consequently, the density of electric line of force generated by the charges accumulated in the charge holding film 142a can be almost controlled, and variations in the memory effects of the memory device can be reduced very much.

Embodiment 16

Figure 29:
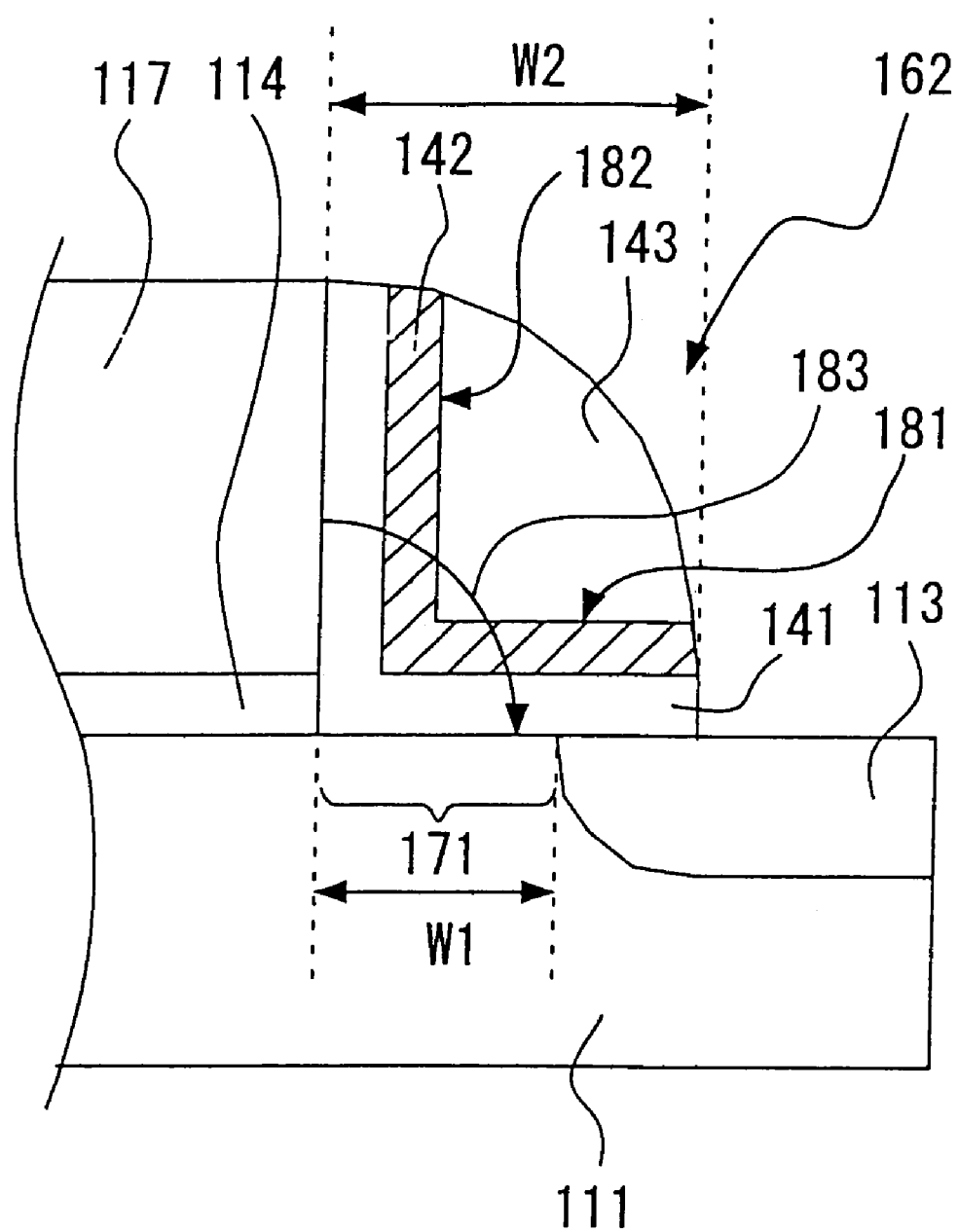
FIG. 29 is a schematic sectional view of a main part of a semiconductor storage device (Embodiment 16) of the present invention.

In Embodiment 16, the charge holding film 142 in the memory functional element 162 has an almost even thickness, disposed almost parallel with the surface of the gate insulation film 114 (arrow 181) and, further, has a shape disposed almost parallel with the side face of the gate electrode 117 (arrow 182) as shown in FIG. 29.

In the case where a positive voltage is applied to the gate electrode 117, an electric line of force in the memory functional element 162 passes through the silicon nitride film 142 twice as shown by an arrow 183 (the portions indicated by the arrows 182 and 181). When a negative voltage is applied to the gate electrode 117, the direction of the electric line of force is reversed. Herein, the dielectric constant of the silicon nitride film 142 is about 6 and that of the silicon oxide films 141 and 143 is about 4. Therefore, the effective dielectric constant of the memory functional element 162 in the direction of the electric line 183 of force becomes higher than that in the case where only the charge holding film shown by the arrow 181 exists, and the potential difference at both ends of the electric line of force can be further reduced. Specifically, a large portion of the voltage applied to the gate electrode 117 is used to enhance the electric field in the offset region 171.

The reason why charges are injected into the silicon nitride film 142 in the rewriting operation is because the generated charges are attracted by the electric field in the offset region 171. Therefore, by including the charge holding film indicated by the arrow 182, in the rewriting operation, charges injected into the memory functional element 162 increase and rewriting speed increases.

In the case where the portion of the silicon oxide film 143 is also a silicon nitride film, that is, the level of the charge holding film is not uniform with the height of the surface of the gate insulation film 114, upward movement of charges in the silicon nitride film becomes conspicuous and the retention characteristic deteriorates.

More preferably, in place of the silicon nitride film, the charge holding film is made of a high dielectric such as hafnium oxide having very high dielectric constant.

Further, the memory functional element preferably includes an insulation film (the portion above the offset region 171 in the silicon oxide film 141) which partitions between the charge holding film almost parallel with the surface of the gate insulation film and a channel region (or a well region). By the insulation film, dissipation of charges accumulated in the charge holding film is suppressed and the retention characteristic can be further improved.

Further, the memory functional element preferably includes an insulation film (the portion in contact with the gate electrode 117 in the silicon oxide film 141) which partitions between the gate electrode and the charge holding film extending in the direction almost parallel with the side face of the gate electrode. By the insulation film, the electric characteristics can be prevented from being changed by injection of charges from the gate electrode to the charge holding film, and reliability of the semiconductor storage device can be improved.

Further, in a manner similar to Embodiment 15, it is preferable to control the thickness of the insulation film under the charge holding film 142 (the portion above the offset region 171 in the silicon oxide film 141) to be constant and to control the thickness of the insulation film disposed on the side face of the gate electrode (the portion in contact with the gate electrode 117 in the silicon oxide film 141) to be constant. Thus, the density of the electric line of force generated by the charges accumulated in the charge holding film 142 can be mostly controlled and charge leak can be prevented.

Embodiment 17

Embodiment 17 relates to optimization of the distances among the gate electrode, the memory functional element and the source/drain regions.

Figure 30:
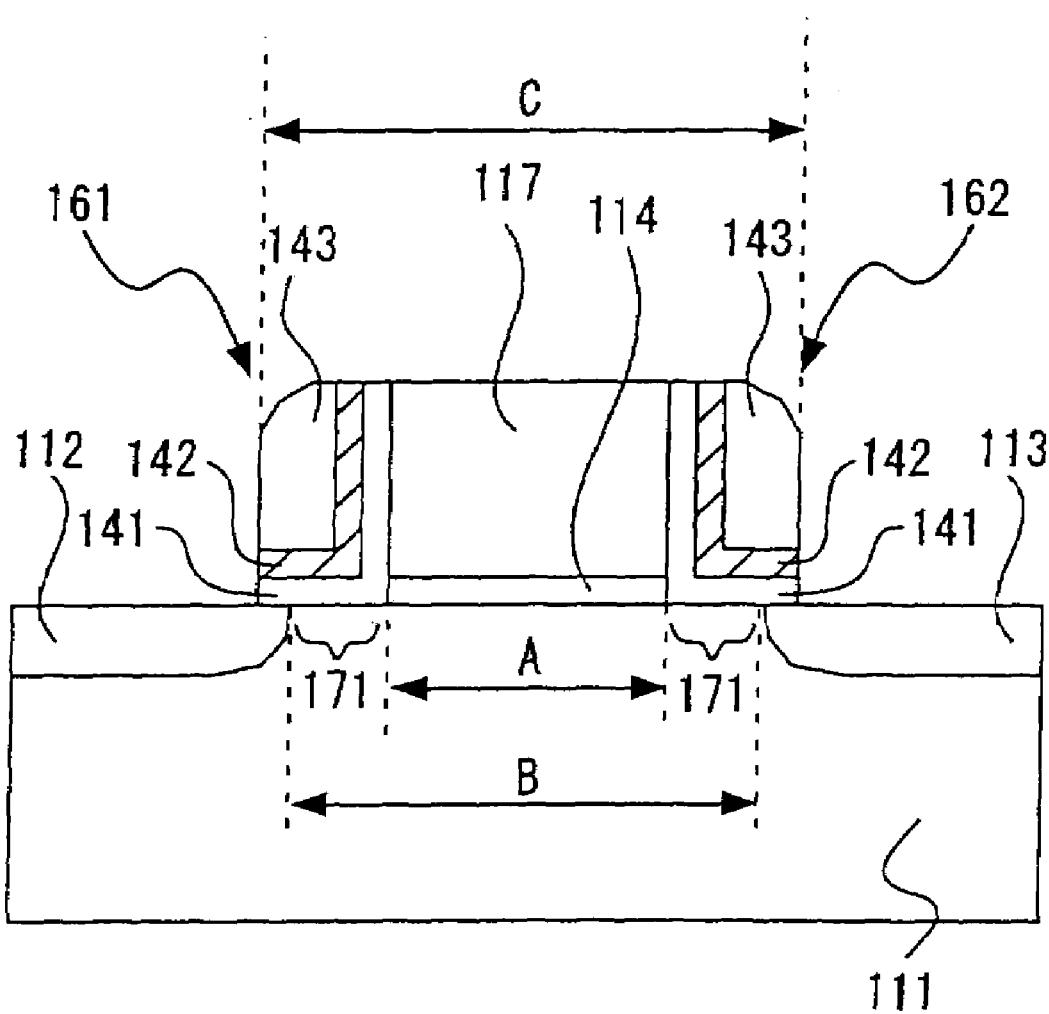
FIG. 30 is a schematic sectional view of a main part of a semiconductor storage device (Embodiment 17) of the present invention.

As shown in FIG. 30, symbol A denotes length of the gate electrode in a cut plane in the channel length direction. Symbol B denotes distance (channel length) between the source and drain regions. Symbol C indicates distance from an end of one of memory functional elements to an end of the other memory functional element, specifically, distance between an end (on the side far from the gate electrode) of a film having the function of holding charges in one of memory functional elements in a cut plane in the channel length direction and an end (on the side far from the gate electrode) of a film having the function of holding charges in the other memory functional element.

First, it is preferable that B<C. Between the portion under the gate electrode 117 in the channel region and the source/drain regions 112 and 113, the offset regions 171 exist. Since B<C, by charges accumulated in the memory functional elements 161 and 162 (silicon nitride film 142), easiness of inversion in the whole offset region 171 is effectively fluctuated. Therefore, the memory effect increases and, particularly, higher speed of the reading operation is realized.

In the case where the gate electrode 117 and the source/drain regions 112 and 113 are offset from each other, that is, when the relation of A<B is satisfied, easiness of inversion of the offset region when a voltage is applied to the gate electrode largely changes according to the amount of charges accumulated in the memory functional element, the memory effect increases, and the short channel effect can be reduced. As long as the memory effect appears, the offset region 171 does not always have to exist. Also in the case where the offset region 171 does not exist, if the impurity concentration in the source/drain regions 112 and 113 is sufficiently low, the memory effect can appear in the memory functional elements 161 and 162 (silicon nitride film 142).

Therefore, A<B<C is the most preferable.

Embodiment 18

Figure 31:
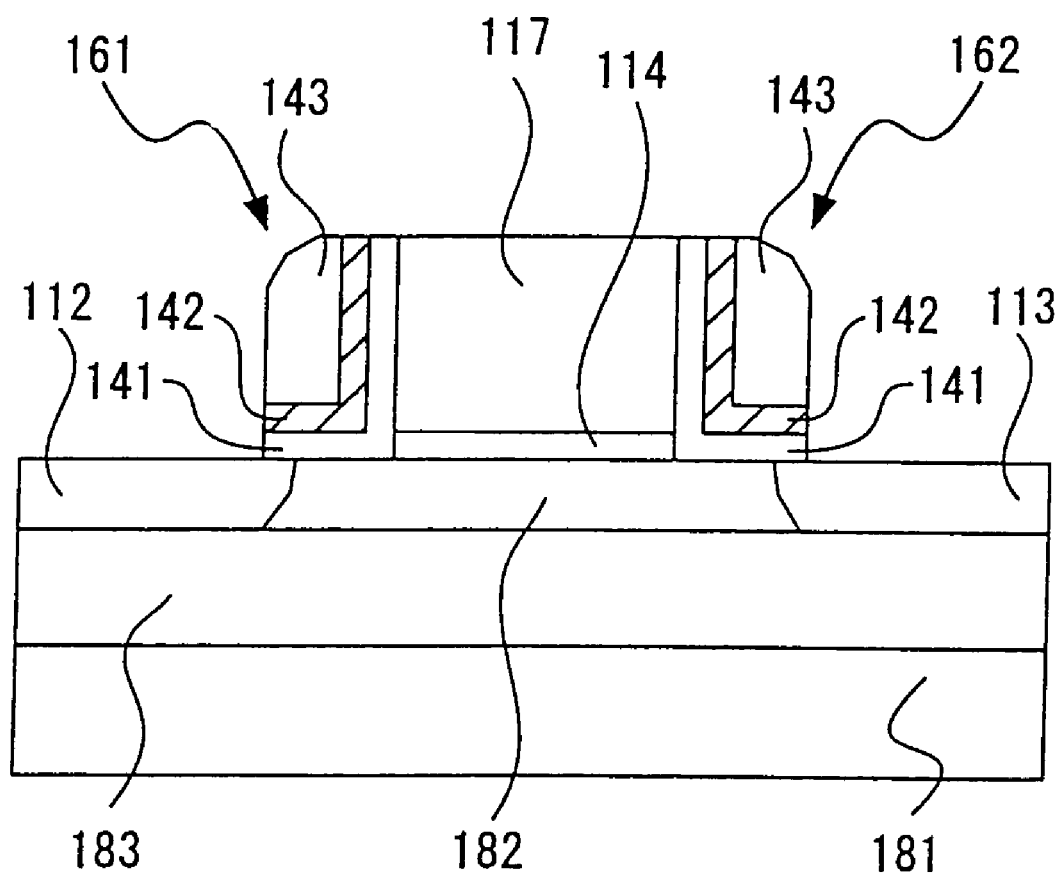
FIG. 31 is a schematic sectional view of a main part of a semiconductor storage device (Embodiment 18) of the present invention.

A semiconductor storage device of Embodiment 18 has a configuration substantially the same as that in Embodiment 15 except that the semiconductor substrate is replaced with an SOI substrate as shown in FIG. 31.

In the semiconductor storage device, a buried oxide film 183 is formed on a semiconductor substrate 181 and, further, an SOI layer is formed on the buried oxide film 183. In the SOI layer, the diffusion regions 112 and 113 are formed and the other region serves as a body region 182.

The semiconductor storage device also produces effects similar to those of the semiconductor storage device of Embodiment 15. Further, the junction capacitance between the diffusion regions 112 and 113 and the body region 182 can be considerably reduced, so that higher speed of the device and lower power consumption can be realized.

Embodiment 19

Figure 32:
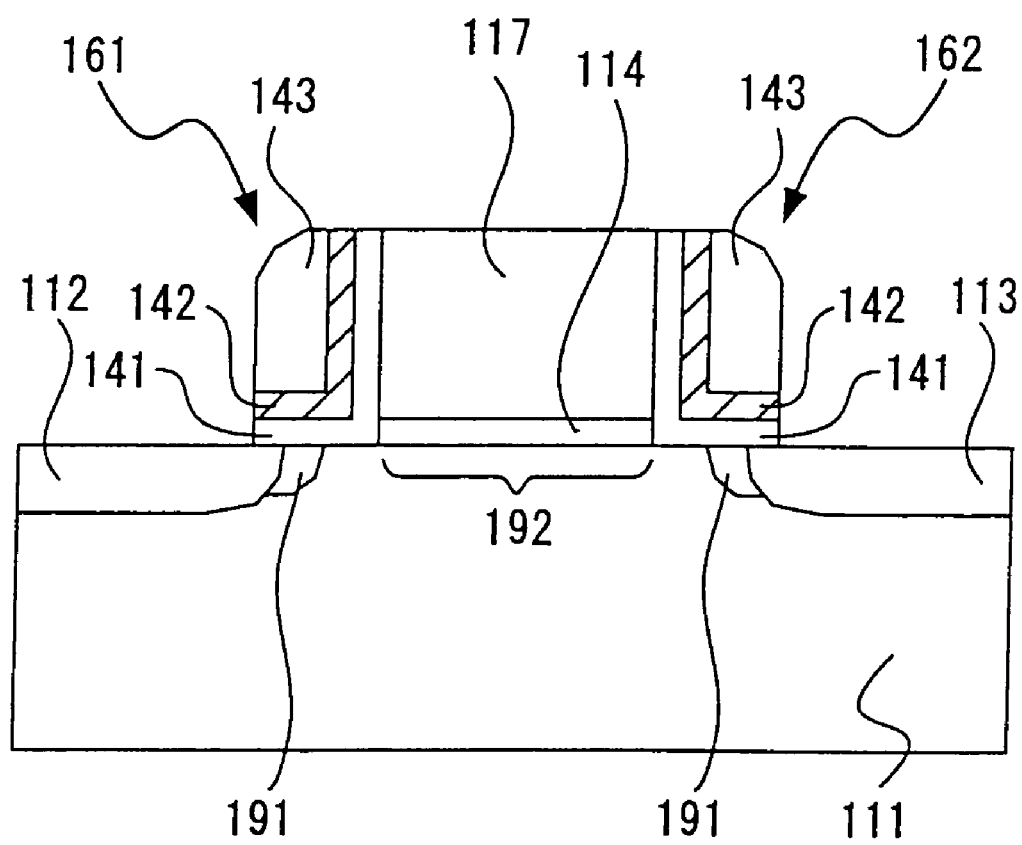
FIG. 32 is a schematic sectional view of a main part of a semiconductor storage device (Embodiment 19) of the present invention.

A semiconductor storage device of Embodiment 19 has, as shown in FIG. 32, substantially the same configuration as that in Embodiment 15 except that a P-type high-concentration region 191 is additionally provided adjacent to the channel sides of the N-type source/drain regions 112 and 113.

Specifically, the concentration of a P-type impurity (for example, boron) in the P-type high-concentration region 191 is higher than that in a region 192. Proper concentration of the P-type impurity in the P-type high-concentration region 191 is, for example, about $5\times10^{17}$ to $1\times10^{19}$ cm$^{-3}$. The concentration of the P-type impurity in the region 192 can be set to, for example, $5\times10^{16}$ to $1\times10^{18}$ cm$^{-3}$.

As described above, by providing the P-type high-concentration region 191, the junctions between the diffusion regions 112 and 113 and the semiconductor substrate 111 becomes sharp just below the memory functional elements 161 and 162. Consequently, hot carriers are easily generated in the writing and erasing operations, voltages in the writing and erasing operations are dropped, or the writing and erasing operations can be performed at higher speed. Further, since the concentration of the impurity in the region 192 is relatively low, when the memory in the erased state, a threshold is low, and the drain current is large. Consequently, reading speed is increased. Therefore, the semiconductor storage device realizing a low rewriting voltage, high-rewriting speed, and high reading speed can be obtained.

By providing the P-type high-concentration regions 191 in the vicinity of the source/drain regions and below the memory functional elements (that is, not immediately below the gate electrode) in FIG. 32, the threshold of the whole transistor considerably increases. The degree of increase is much higher than that in the case where the P-type high-concentration region 191 is provided immediately below the gate electrode. When write charges (electrons in the case where the transistor is of the N-channel type) are accumulated in the memory functional element, the difference becomes larger. On the other hand, when sufficient erase charges (positive holes in the case where the transistor is of the N-channel type) are accumulated in the memory functional element, the threshold of the whole transistor decreases to a threshold determined by the impurity concentration of the channel region (region 192) under the gate electrode. To be specific, the threshold at the time of erase does not depend on the impurity concentration of the P-type high-concentration region 191. On the other hand, the threshold at the time of writing is largely influenced by the impurity concentration. Therefore, by disposing the P-type high-concentration region 191 under the memory functional element and in the vicinity of the source/drain regions, only the threshold at the time of writing largely fluctuates, and a memory effect (the difference between the threshold at the time of writing and the threshold at the time of erasing) can be considerably increased.

Embodiment 20

Figure 33:
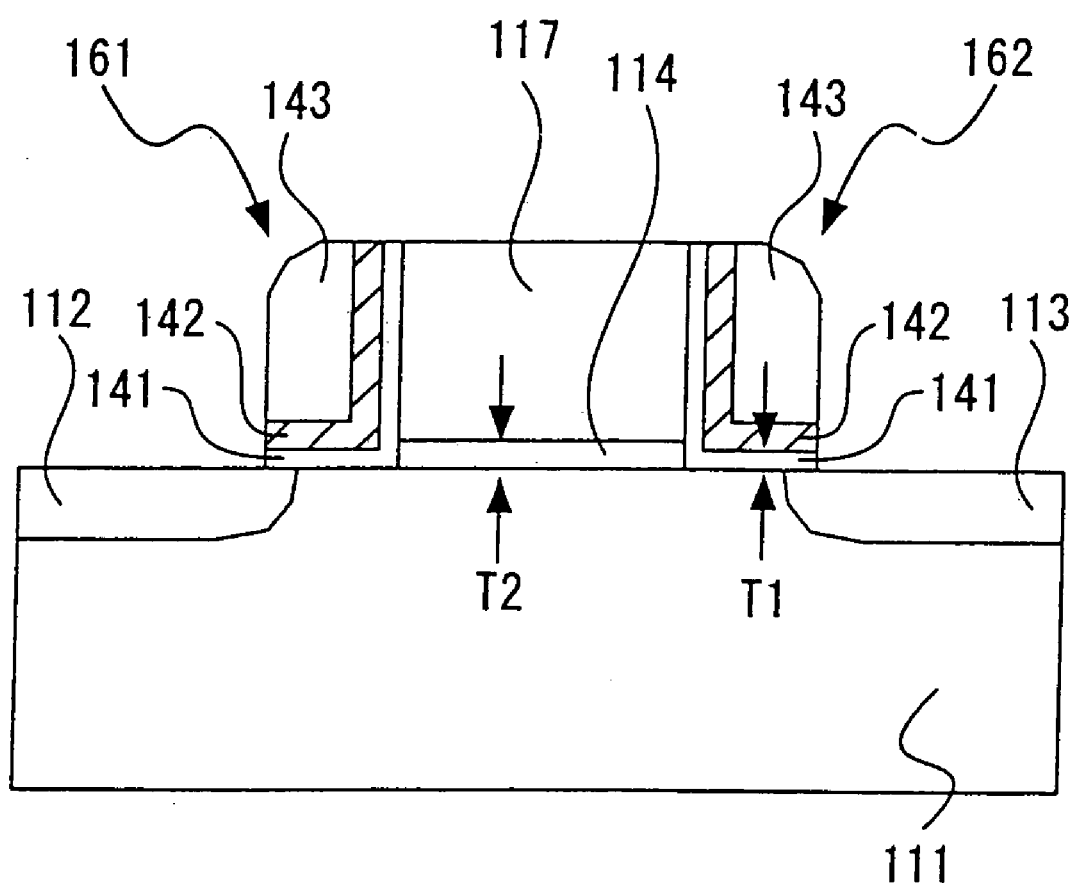
FIG. 33 is a schematic sectional view of a main part of a semiconductor storage device (Embodiment 20) of the present invention.

A semiconductor storage device of Embodiment 20 has, as shown in FIG. 33, a configuration substantially the same as that in Embodiment 15 except that the thickness (T1) of the insulation film which partitions between the charge holding film (silicon nitride film 142) and the channel region or well region is thinner than the thickness (T2) of the gate insulation film.

There is a lower limit value in the thickness T2 of the gate insulation film 114 due to a demand for withstand voltage in an operation of rewriting the memory. However, the thickness T1 of the insulation film can be made smaller than T2 irrespective of the demand for withstand voltage. By reducing T1, injection of charges to the memory functional element is facilitated, the voltage in the writing operation and the erasing operation is dropped or the writing and erasing operations can be performed at higher speed. Since an amount of charges induced by the channel or well region increases when charges are accumulated in the silicon nitride film 142, the memory effect can be increased.

Therefore, by satisfying T1<T2, without deteriorating the withstand voltage performance of the memory, the voltage in the writing and erasing operations can be decreased or the writing and erasing operations can be performed at higher speed and, further, the memory effect can be increased.

The thickness T1 of the insulation film is more preferably 0.8 nm or higher which allows the consistency in the manufacturing process and a predetermined level of the film quality maintained and which is as a limit to prevent an extreme deteriorate of the retention characteristics.

Embodiment 21

Figure 34:
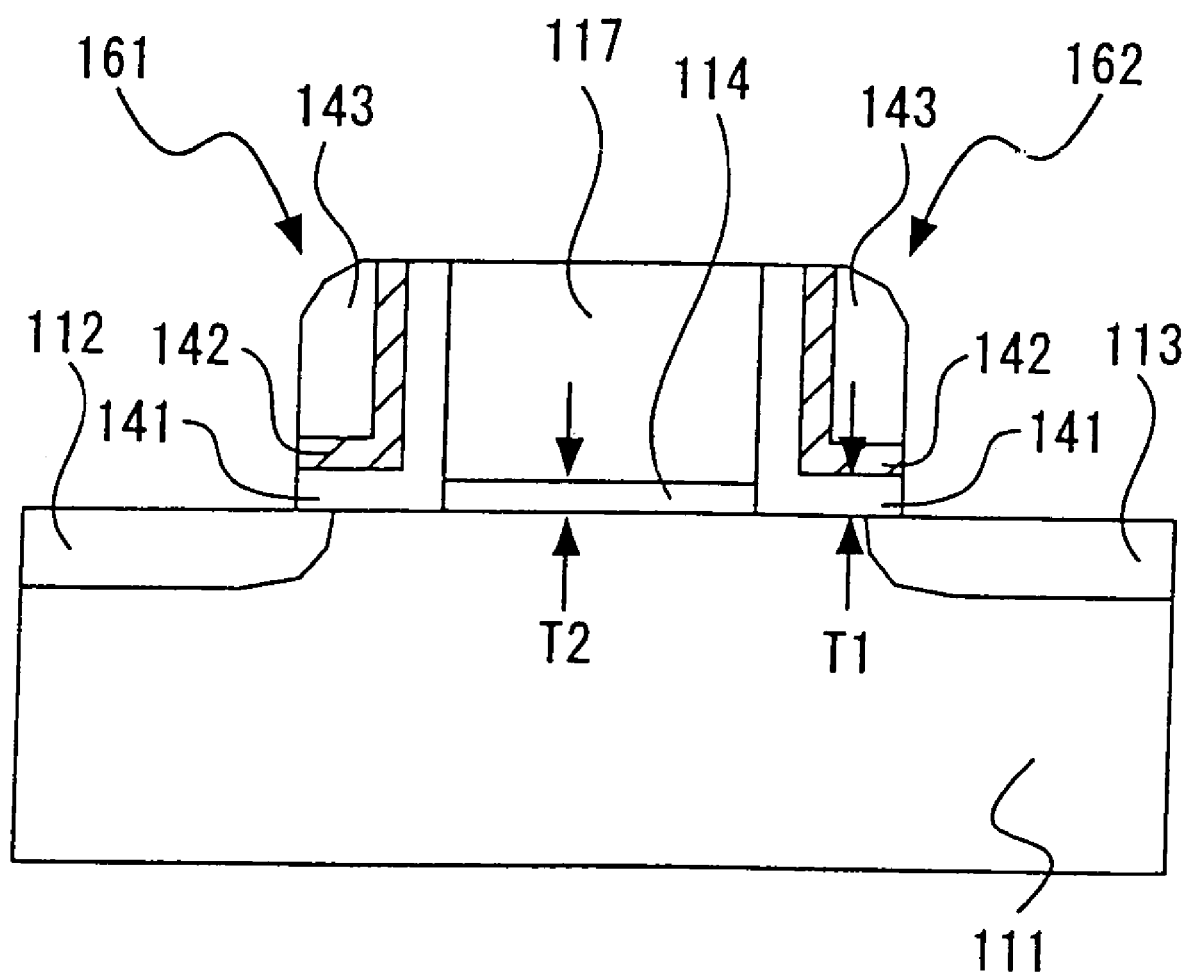
FIG. 34 is a schematic sectional view of a main part of a semiconductor storage device (Embodiment 21) of the present invention.

A semiconductor storage device of Embodiment 21 has, as shown in FIG. 34, a configuration which is substantially the same as that of Embodiment 15 except that the thickness (T1) of the insulation film partitioning between the charge holding film (silicon nitride film 142) and the channel region or well region is larger than the thickness (T2) of the gate insulation film.

There is an upper limit value for the thickness T2 of the gate insulation film 114 due to demand for preventing the short channel effect of the device. However, irrespective of the demand for preventing the short channel effect, the thickness T1 of the insulation film can be set to be larger than T2. By making T1 thicker, dissipation of charges accumulated in the memory functional element is prevented and the memory retention characteristic can be improved.

Therefore, by setting T1>T2, without deteriorating the short channel effect of the memory, the retention characteristic can be improved.

The thickness T1 of the insulation film is preferably 20 nm or less in consideration of decrease in rewriting speed.

Embodiment 22

Figure 35:
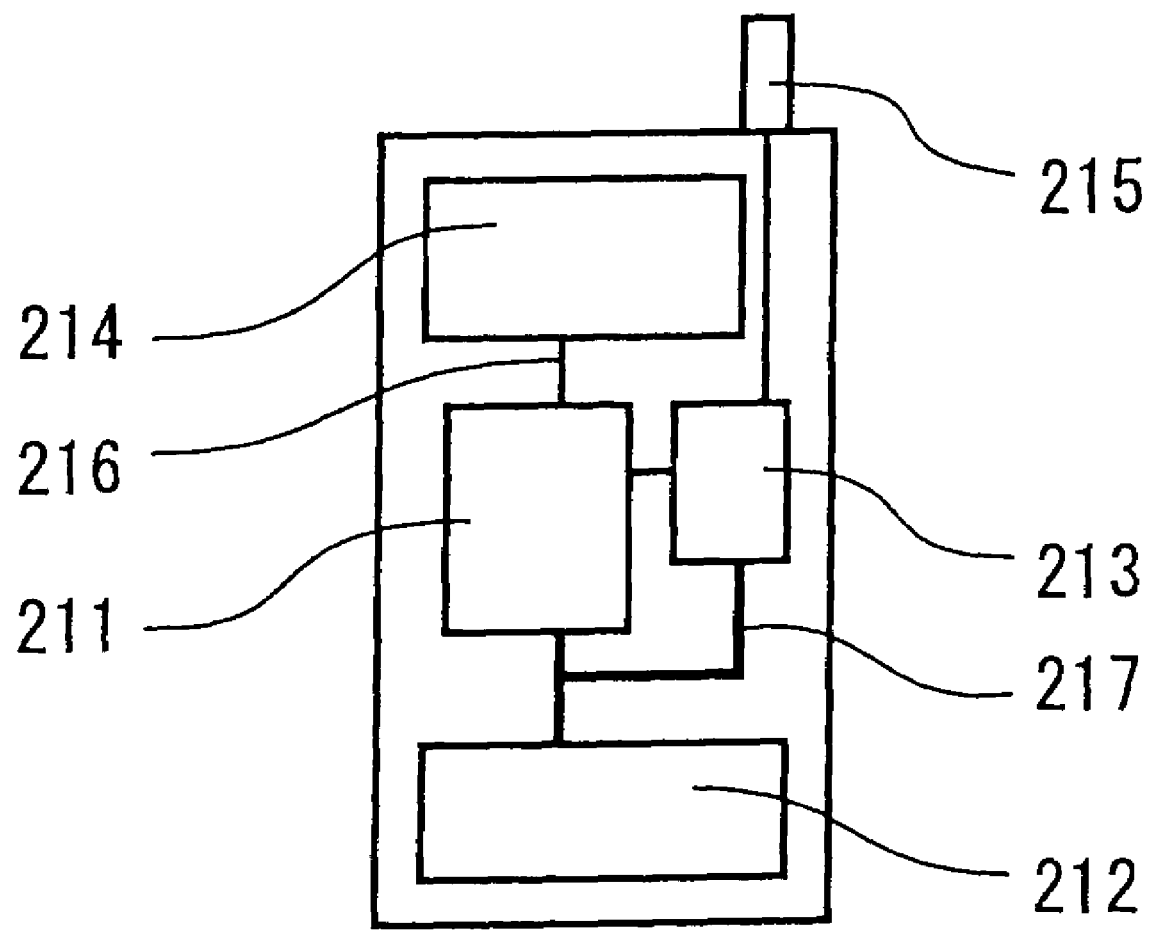
FIG. 35 is a schematic sectional view of a portable electronic apparatus in which the semiconductor storage device of the present invention is assembled.
Figure 36:
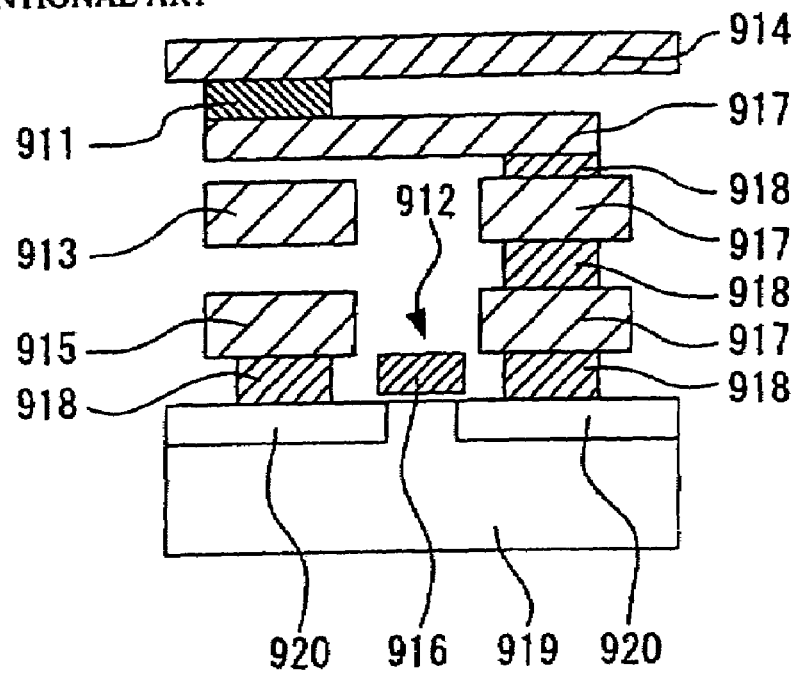
FIG. 36 is a schematic sectional view of a main part showing a conventional semiconductor storage device.
Figure 36B:
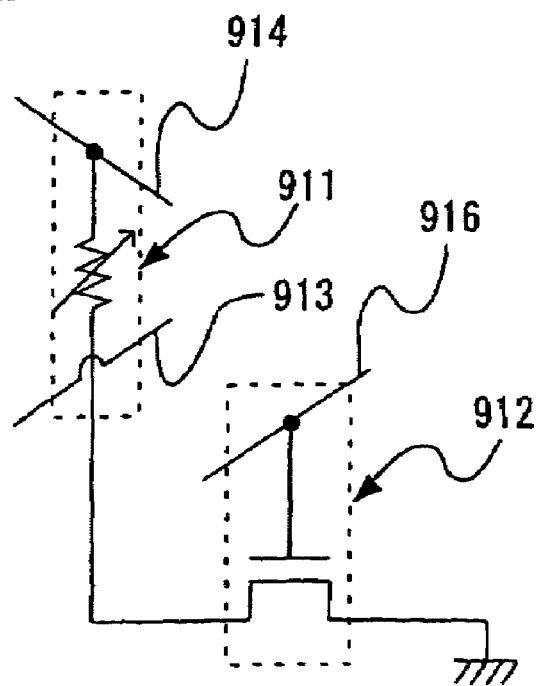

FIG. 35 shows a portable telephone as a portable electronic apparatus in which the above-described semiconductor storage device is assembled.

The portable telephone is constituted mainly by a control circuit 211, a battery 212, an RF (Radio Frequency) circuit 213, a display 214, an antenna 215, a signal line 216, a power source line 217 and the like. In the control circuit 211, the above-described semiconductor storage device of the present invention is assembled. The control circuit 211 is preferably an integrated circuit in which devices having the same structure as described in Embodiment 10 are used as a memory circuit device and a logic circuit device. With the configuration, manufacture of the integrated circuit is facilitated, and the manufacturing cost of the portable electronic apparatus can be particularly reduced.

As described above, by using the semiconductor storage device capable of storing two bits per one transistor, which can be easily formed finely, for a portable electronic apparatus, the function and operating speed of the portable electronic apparatus are improved and the manufacturing cost can be reduced.

The semiconductor storage device of the present invention is constituted either mainly by a first conductivity type region and a second conductivity type region as diffusion regions, a memory functional element disposed across the boundary of the first and second conductivity type regions, and an electrode provided via an insulation film, or mainly by a gate insulation film, a gate electrode formed on the gate insulation film, memory functional elements formed on both sides of the gate electrode, source/drain regions (diffusion regions) each disposed on the side opposite to the gate electrode of the memory functional element, and a channel region disposed under the gate electrode.

The semiconductor storage device functions as a memory device for storing information of four or more values by storing binary or more information in a single charge holding film and also functions as a memory cell having both the function of a selection transistor and the function of a memory transistor by a variable resistance effect produced by the memory functional elements.

The semiconductor device of the present invention is preferably formed on the semiconductor substrate, preferably, on the first conductivity type well region formed in the semiconductor substrate.

The semiconductor substrate is not particularly limited as long as it can be used for a semiconductor device, and an example thereof includes a bulk substrate made of an element semiconductor such as silicon or germanium or a compound semiconductor such as silicon germanium, GaAs, InGaAs, ZnSe or GaN. As a substrate having a semiconductor layer on its surface, any of various substrates such as an SOI (Silicon on Insulator) substrate and a multilayer SOI substrate and a glass or plastic substrate on which a semiconductor layer is formed may be used. Particularly, a silicon substrate, an SOI substrate on which a silicon layer is formed, and the like are preferable. Although depending on the amount of current flowing therein, the semiconductor substrate or semiconductor layer may be single crystal (obtained by, for example, epitaxial growth), polycrystal, or amorphous.

Preferably, a device isolation region is formed on the semiconductor substrate or semiconductor layer. Further, the device may be formed by a single or multilayer structure obtained by combining elements such as a transistor, a capacitor and a resistor, circuits formed by the elements, a semiconductor device, and an interlayer insulation film. The device isolation region can be formed by any of various device isolation films such as an LOCOS film, a trench oxide film and an STI film. The semiconductor substrate may be of a P-type or N-type conductivity type. In the semiconductor substrate, preferably, at least one first conductivity type (P-type or N-type) well region is formed. An impurity concentration of the semiconductor substrate and the well region can be set within a range which is known in the art. In the case of using an SOI substrate as the semiconductor substrate, a well region may be formed in a surface semiconductor layer or a body region may be provided under a channel region.

The gate insulation film or insulation film is not particularly limited as long as it is usually used for a semiconductor device. For example, a single layer or a lamination film of, an insulation film such as a silicon oxide film or a silicon nitride film, or a high-dielectric-constant film such as an aluminum oxide film, a titanium oxide film, a tantalum oxide film or a hafnium oxide film can be used. Particularly, a silicon oxide film is preferable. Proper thickness of the gate insulation film is, for example, about 1 to 20 nm and, preferably, about 1 to 6 nm. The gate insulation film may be formed only under the gate electrode or formed larger (wider) than the gate electrode.

The gate electrode or electrode is formed on the gate insulation film in a shape which is usually used for a semiconductor device or a shape in which a recess is provided in a lower end portion. The single gate electrode denotes a gate electrode formed in an integral shape which is not separated by one or more conductive films as a gate electrode. The gate electrode may have a sidewall insulation film on its sidewall. The gate electrode is not particularly limited as long as it is usually used for a semiconductor device, which may be formed by a conductive film made of, for example, a single film or a lamination film of, polysilicon, a metal such as copper or aluminum, or a refractory metal such as tungsten, titanium or tantalum, or silicide of a refractory film or the like. Proper thickness of the gate electrode is, for example, about 50 to 400 nm. Under the gate electrode, the channel region is formed.

The memory functional element includes a film or region having at least the function of holding charges, or accumulating and holding charges, or the function of trapping charges or holding a charge polarized state. Examples of having the functions include silicon nitride, silicon, silicate glass containing impurity such as phosphorus or boron, silicon carbide, alumina, a high dielectric such as hafnium oxide, zirconium oxide or tantalum oxide, zinc oxide, ferroelectric, a metal and the like. The memory functional element can be formed by, for example a single layer or a lamination layer of: an insulation film including a silicon nitride film; an insulation film having therein a conductive film or a semiconductor layer; an insulation film having therein one or more dots made of a conductor or a semiconductor; or an insulation film including a ferroelectric film in which internal charges are polarized by an electric field and its state is held. Among them, the silicon nitride film is preferable because it can obtain a large hysteresis characteristic since a number of levels of trapping charges exist, charge retention time is long, a retention characteristic is good since a problem such as charge leakage caused by occurrence of a leak path does not occur, and the materials are used normally in an LSI process.

By using the insulation film including therein an insulation film having the charge holding function such as a silicon nitride film as a memory functional element, the reliability of holding storage can be increased. Since the silicon nitride film is an insulator, even if a leak of charges occurs in a part thereof, the charges of the whole silicon nitride film are not lost immediately. In order to further increase the reliability, the insulation film having the function of holding charges is not necessarily in a film shape. Preferably, insulators having the function of holding charges exist discretely in an insulation film. Concretely, it is preferable that the insulators in the form of dots be spread in a material which does not easily hold charges such as a silicon oxide.

By using the insulation film including therein a conductive film or a semiconductor layer as the memory functional element, an injection amount of charges into the conductor or semiconductor can be freely controlled, so that an effect of realizing multiple values is produced.

Further, by using an insulator film including one or more dots made of a conductor or semiconductor as the memory functional element, writing and erasing is easily performed by charge direct tunneling, so that an effect of lower power consumption is obtained.

As the memory functional element, a ferroelectric film made of PZT, PLZT or the like in which a polarization direction changes according to an electric field may be used. In this case, in the surface of the ferroelectric film, charges are substantially generated by polarization and the state is held. Therefore, a hysteresis characteristic similar to that of a film for trapping charges supplied from the outside of a film on which the memory function is provided can be obtained. In addition, charge holding of the ferroelectric film does not require injection of charges from the outside and a hysteresis characteristic can be obtained only by polarization of the charges in the film. Thus, an effect that writing and erasing can be performed at high speed is produced.

Consequently, it is preferable that the memory functional element further include a region which suppresses escape of charges or a film having the function of suppressing escape of charges. Examples of a film having the function of suppressing escape of charges include a silicon oxide film and the like.

The charge holding film included in the memory functional element is formed on both sides of the gate electrode directly or via an insulation film and is disposed on the semiconductor substrate (the well region, body region or source/drain region, or diffusion region) directly or via a gate insulation film or an insulation film. Preferably, the charge holding films on both sides of the gate electrode are formed so as to cover all of or a part of the sidewall of the gate electrode directly or via the insulation film. As an example of application, in the case where the gate electrode has a recess in its lower end portion, the charge holding film may be formed so as to completely or partly bury the recess directly or via an insulation film. In this case, however, the manufacturing process is complicated. Consequently, from the industrial viewpoint, preferably, the memory functional element covers only the sidewalls of the gate electrode and the gate electrode does not cover the top portion of the memory functional element. In the case of using a conductive film as the charge holding film, it is preferable to dispose the conductive film via the insulation film so that the charge holding film is not in direct contact with the semiconductor substrate (well region, body region or source/drain region, or diffusion region) or the gate electrode. For example, a lamination structure of a conductive film and an insulation film, a structure in which a conductive film is dispersed in the form of dots in the insulation film, a structure in which the conductive film is disposed in a part of a sidewall insulation film formed on the sidewalls of the gate, and the like can be employed.

The diffusion region or source/drain region is disposed, as a diffusion region of a conductivity type different from that of the semiconductor substrate or well region, on the side opposite to the gate electrode of the charge holding film. In the junction between the source/drain region and the semiconductor substrate, the memory functional element or the well region, the impurity concentration is preferably sharp. This is because hot electrons or hot holes are generated efficiently at low voltage, so that operation can be performed at higher speed with a lower voltage. The junction depth of the source/drain regions is not particularly limited but can be properly adjusted in accordance with the performances of a semiconductor storage device to be obtained. In the case of using an SOI substrate as a semiconductor substrate, the source/drain regions may have a junction depth smaller than the thickness of a surface semiconductor layer. However, preferably, the source/drain regions have a junction depth which is almost the same as the thickness of the surface semiconductor layer.

The source/drain region may be disposed so as to overlap with an end of the gate electrode, so as to be aligned with an end of the gate electrode, or so as to be offset from an end of the gate electrode. Particularly, in the case where the source/drain region is offset from an end of the gate electrode, it is preferable since easiness of inversion of an offset region under the charge holding film when voltage is applied to the gate electrode largely changes according to an amount of charges accumulated in the memory functional element, a memory effect is increased, and a short channel effect is reduced. However, when the source/drain region is offset too much, drive current between the source and drain decreases considerably. Therefore, it is preferable that the offset amount, that is, distance between ends of the gate electrodes to a nearer source/drain region in the gate length direction be shorter than the thickness of the charge holding film in the direction parallel with the gate length direction. It is particularly important that at least a part of the charge accumulation region in the memory functional element overlaps with a part of the source/drain region as a diffusion region. This is because the essence of the memory of the present invention is to rewrite stored information by an electric field across the memory functional element in accordance with the voltage difference between the gate electrode existing only in the sidewall portion of the memory functional element and the source/drain region.

A part of the source/drain region may be extended at a level higher than the surface of the channel region, that is, the lower face of the gate insulation film. In this case, it is proper to laminate a conductive film integrated with the source/drain region on a source/drain region formed in the semiconductor substrate. The conductive film is preferably made of a semiconductor such as polysilicon or amorphous silicon, silicide, the above metals, and refractory metals, and the like. Among them, polysilicon is preferred. The impurity diffusion speed of polysilicon is much higher than that of the semiconductor substrate, so that it is easy to make the junction of the source/drain regions in the semiconductor substrate shallow and a short channel effect is easily suppressed. In this case, it is preferable to dispose a part of the source/drain regions so as to sandwich at least a part of the memory functional element together with the gate electrode.

The semiconductor storage device of the present invention can be formed by, for example, a method similar to a method of forming a sidewall spacer having a single-layered or lamination-layered structure on a sidewall of the gate electrode by a normal semiconductor process. Concrete methods are: a method of forming a gate electrode or an electrode, after that, forming a single-layered film or lamination-layered film including a charge holding film such as a charge holding film, charge holding film/insulation film, insulation film/charge holding film, insulation film/charge holding film/insulation film, or the like and etching back the film under proper conditions, thereby leaving the film in a sidewall spacer shape; a method of forming an insulation film or charge holding film, etching back the film under proper conditions so as to be left in a sidewall spacer shape, further forming a charge holding film or insulation film, and similarly etching back the film so as to be left in a sidewall spacer shape; a method of dispersing particles of a charge holding material into an insulation film material, applying or depositing the resultant material onto a semiconductor substrate including a gate electrode, and etching back the insulation film material under proper conditions so as to be left in a sidewall spacer shape; and a method of forming a gate electrode, after that, forming the single-layered film or lamination-layered film, and patterning the film with a mask. There is also provided a method of forming a charge holding film, charge holding film/insulation film, insulation film/charge holding film, insulation film/charge holding film/insulation film, or the like before formation of a gate electrode or an electrode, forming an opening in a region which becomes a channel region in the film, forming a gate electrode material film on the whole surface, and patterning the gate electrode material film in a shape including an opening and larger than the opening.

A semiconductor storage device of the present invention can be used for a portable electronic apparatus driven on a battery and, particularly, a portable information terminal. Examples of the portable electronic apparatus include a portable information terminal, a portable telephone, a game apparatus and the like.

According to the present invention, in contrast to a memory cell of an MRAM as prior art which is constituted by two devices, a memory cell can be constituted by substantially one device, so that further scale-down and high-integration can be realized.

The configuration of one device is simple. A device can be constituted by: a first conductivity type region formed in a semiconductor layer; a second conductivity type region adjacent to the first conductivity type region; a memory functional element disposed across the boundary of the first and second conductivity type regions in the surface of the semiconductor layer; and an electrode provided in contact with the memory functional element and on the first conductivity type region via an insulation film. Thus, further reduction in size of an occupied area can be achieved and reading speed of the semiconductor storage device can be improved.

Further, the device has: a first conductivity type region formed in a semiconductor layer; two second conductivity type regions adjacent to the first conductivity type region; two memory functional elements each disposed across the boundary of the first and second conductivity type regions in the surface of the semiconductor layer; and an electrode provided in contact with each of the memory functional elements and on the first conductivity type region via an insulation film. Thus, reading speed of the semiconductor storage device can be improved and high-integration can be improved.

In the case of storing information of two or more bits by accumulating charges independently in each of the two memory functional elements, the device area per one bit can be reduced. Thus, manufacturing cost of the semiconductor storage device can be reduced.

According to another aspect, by providing: a channel region; variable resistance regions provided on both sides of the channel region; diffusion regions provided on both sides of the channel region via the variable resistance regions; a gate electrode provided on the channel region via a gate insulation film; and two memory functional elements disposed on both sides of the gate electrode each across the variable resistance region and a part of the diffusion region, reading operation speed of the semiconductor storage device can be improved.

At the time of reading out information stored in one of the two memory functional elements, a pinch-off point is formed in a region close to the other memory functional element in the channel region. Irrespective of the storage state of the other memory functional element, stored information of the one of memory functional elements can be detected with high sensitivity. This is a big factor which enables 2-bit operation.

Further, the memory functional elements are disposed, not under the gate electrode but, on both sides of the gate electrode. Consequently, it is unnecessary to make the gate insulation film function as a memory functional element, and the gate insulation film can be used simply only for the function of the gate insulation film separately from the memory functional element. Designing according to a scaling rule of an LSI can be made. Therefore, it is unnecessary to insert a floating gate between a channel and a control gate unlike a flash memory and, further, it is unnecessary to employ an ONO film having the memory function by the gate insulation film. Thus, the gate insulation film according to scale-down can be employed, an influence of the electric field of the gate electrode on a channel increases, and a semiconductor storage device having a memory function and resistive to a short channel effect can be realized. Therefore, the scale-down can be achieved, high-integration can be improved, and an inexpensive semiconductor storage device can be provided.

Since the functions of a conventional selection transistor and a memory cell transistor can be achieved by providing only one word line connected to a gate electrode or having the function itself of the gate electrode necessary for one memory cell, further high-integration of the semiconductor storage device can be realized.

Further, by detecting the amount of charges in the memory functional element on the basis of a change in the amount of current flowing from one of the source/drain regions to the other source/drain region, a slight change in charges in the memory functional element can be determined as a large current difference.

When the resistance value of the variable resistance part positioned below the memory functional element changes according to an amount of charges in the charge memory functional element and the presence/absence of charges in the memory functional element is detected by a change in an amount of current flowing from one of source/drain regions to the other source/drain region, a slight change in the charges in the memory functional element can be determined as a large current difference.

Further, the structure in which a single gate electrode is sandwiched between two memory functional elements formed on both sides of the signal gate electrode per one memory cell changes a charge amount of the memory functional element, so that the number of electrodes can be minimized. Therefore, the memory cell occupation area can be reduced.

The number of electrodes necessary for a detection method of detecting an amount of charges in each of two memory functional elements on the basis of a change in an amount of current flowing from one of source/drain regions to the other source/drain region in a structure in which a single gate electrode is sandwiched between two memory functional elements formed on both sides of the gate electrode per one memory cell, that is, a detection method capable of determining a slight change in charges as a large current difference is minimized. Therefore, the memory cell occupation area can be reduced.

Further, the number of electrodes necessary for a detection method of changing a resistance value of a variable resistance part positioned under each of two memory functional elements formed on both sides of a single gate electrode while sandwiching the single gate electrode per one memory cell in accordance with the presence/absence of charges in the memory functional element and detecting an amount of charges in the memory functional element on the basis of a change in an amount of current flowing from one of source/drain regions to the other source/drain region, that is, a detection method capable of determining a slight change in charges as a large current difference is minimized. Therefore, the memory cell occupation area can be reduced.

The minimum terminals necessary for a memory cell, capable of selecting one memory cell from a plurality of memory cells and performing writing, erasing, and reading are constituted by one terminal connected to the semiconductor substrate, the well region or the semiconductor layer disposed on the insulation film, two terminals connected to source/drain regions, and one terminal connected to the gate electrode. Therefore, one memory cell can be constituted by the smallest number of terminals.

Further, in an operating method of performing either reading, writing or erasing a memory cell by applying only four kinds of voltages: a voltage applied to the substrate, the well region or the semiconductor layer disposed on the insulator; a voltage applied to the single gate electrode; and voltages respectively applied to the two source/drain electrodes, a memory cell can be operated with the smallest number of nodes.

Since a gate electrode sidewall insulation film formed on both sides of the single gate electrode functions as memory functional elements, it is facilitated to form both a circuit constituted by a logic transistor and a memory storage device.

Further, at least a part of the gate electrode sidewall insulation film having the function of holding charges overlap with the source/drain region, so that decrease in read current is suppressed. Therefore, the reading operation speed of the semiconductor storage device can be increased.

By a single semiconductor storage device, 2-bit information can be stored. Moreover, the memory functional elements disposed on both sides of one gate electrode are completely isolated from each other by the gate electrode. Thus, electric interference between the memory functional elements can be avoided, so that the semiconductor storage device for storing information of multiple values can be realized while realizing further scale-down.

In addition, the semiconductor storage device of the present invention can be used as it is as a transistor constituting a logic circuit. A process of forming both a logic circuit and a memory circuit can be therefore made very easy.

When a part of the source/drain region is extended at a level higher than the surface of the channel region or the lower face of the gate insulation film, and at least a part of the memory functional element is sandwiched between the gate electrode and a part of the source/drain region, a shallower junction of the source/drain regions can be realized and a sharp impurity concentration profile in the junction portion can be realized. Therefore, the short channel effect can be suppressed extremely effectively, further scale-down of the device can be realized, the drain withstand voltage can be decreased, and a write/erase voltage by injection of electrons or holes can be reduced.

By sandwiching the memory functional element by the gate electrode and the source/drain region, an electric field can be directly applied across the gate electrode and the source/drain region and injection of electrons or holes and movement of electrons and holes can be performed between selected two nodes. Consequently, the writing/erasing efficiency can be improved as compared with injection of hot electrons or hot holes.

In the case where the source/drain region is disposed so as to be offset from an end of the gate electrode, parasitic resistance in the offset region under the memory functional element when a voltage is applied to the gate electrode can be largely changed according to an amount of charges accumulated in the memory functional element. Thus, the memory effect can be increased.

In the present invention, when the source/drain regions are made of an N-type semiconductor, one of the source/drain regions is set to a reference voltage, and the other source/drain region and the gate electrode are set to a voltage higher than the reference voltage, or one of the source/drain regions is set to a reference voltage, the other diffusion region is set to a voltage higher than the reference voltage, and the gate electrode is set to a voltage lower than the reference voltage, that is, only relative potentials of three electrodes are set, thereby enabling electrons or holes to be selectively injected into the memory functional element. Consequently, the number of electrodes per memory cell in the semiconductor storage device can be reduced and further reduction in size of the cell area can be realized.

Similarly, in the case where the source/drain regions are made of a P-type semiconductor, one of the source/drain regions is set to a reference voltage, and the other source/drain region and the gate electrode are set to a voltage lower than the reference voltage, or one of the source/drain regions is set to a reference voltage, the other source/drain region is set to a voltage lower than the reference voltage, and the gate electrode is set to a voltage higher than the reference voltage, thereby enabling holes or electrons to be selectively injected into the memory functional element. Thus, further reduction in the cell area can be realized.

In the case where a charge holding film is formed on the well region or the diffusion region at both ends of the gate electrode directly or via an insulation film, an inversion layer can be controlled in accordance with an amount of charges in the charge holding film. Therefore, a large hysteresis (change in threshold) can be obtained, and a semiconductor storage device of excellent characteristics can be obtained.

In the case where the semiconductor substrate is an SOI substrate having a surface semiconductor layer, and the first conductivity type well region is formed as a body region in the surface semiconductor layer, the junction capacitance between the diffusion region and the body region can be reduced considerably, so that higher speed of the device and lower power consumption can be realized.

In the case where the charge holding film is in contact with the diffusion region and/or the well region or the body region via the insulation film in the vicinity of an end of the gate electrode, leakage of held charges can be suppressed. Thus, the charge retention characteristic can be improved.

When a lower end portion of the gate electrode has a recess, and at least a part of the charge holding film is buried in the recess directly or via an insulation film, at least a part of the charge holding film is covered with the gate electrode, so that efficiency of injecting hot carries can be improved particularly at the time of erasing. Thus, higher-speed erasing operation can be realized.

When the gate electrode has a sidewall insulation film on a sidewall, and a part of the sidewall insulation film is formed as a charge holding film, by performing ion implantation for forming a diffusion region with the sidewall insulation film as a mask, control on the position of an end of the diffusion region is facilitated. Therefore, while preventing the diffusion region from reaching a portion below the gate electrode, a region in which the well region or body region is in contact with the charge holding film directly or via the insulation film can be formed. Therefore, the semiconductor storage device having excellent characteristics can be obtained.

According to a manufacturing method of a semiconductor storage device of the present invention, a semiconductor storage device realizing high-performance and high-integration can be manufactured by simple processes.

When the well region or body region of the semiconductor device of the present invention has a P-type conductivity type, one of the diffusion regions is set to a reference voltage, the gate electrode is set to a voltage lower than the reference voltage, the well region or body region is set to a voltage higher than the reference voltage, and the other diffusion region is set to a voltage higher than the voltage of the well region or body region, thereby passing current in the forward direction from the P-type well region or body region to the diffusion region fixed to the reference voltage. Consequently, even in the case where only a voltage difference which is insufficient to generate hot holes by interband tunnel is applied in the junction between the P-type well region or body region and the other diffusion region, hot holes can be generated by electrons injected from the diffusion region fixed to the reference voltage to the well region or body region. Therefore, an effect of injecting holes into the memory functional element adjacent to the other diffusion region is increased, and the voltage at the time of hole injecting operation can be decreased.

In the case where the well region or body region of the semiconductor device of the present invention has an N-type conductivity type, current in the forward direction flows from the N-type well region or body region to the diffusion region fixed to the reference voltage. Consequently, even in the case where only a voltage difference which is insufficient to generate hot electrons by interband tunnel is applied in the junction between the well region or body region and the other diffusion region, hot electrons can be generated by holes injected from the diffusion region fixed to the reference voltage to the well region or body region. Therefore, an effect of injecting electrons into the memory functional element adjacent to the other diffusion region is increased, and the voltage at the time of electron injecting operation can be decreased.

The above-described memory functional element is formed by a single-layered or multi-layered structure such as a film having the function of accumulating or trapping charges or holding a charge polarized state, which is for example, an insulation film including a silicon nitride film, an insulation film including therein a conductor film or semiconductor film, or an insulation film including one or more dots made of conductor or semiconductor. In the case of the insulation film including the silicon nitride film, a number of levels for trapping charges exists, so that a large hysteresis characteristic can be obtained. Since the charge retention time is long and a problem of charge leakage due to generation of a leak path does not occur, the retention characteristics are excellent. Further, since the material is a material which is normally used in an LSI process, there is an effect that the memory functional element can be easily introduced to a mass production factory. In the case of the insulation film including therein a conductive film or semiconductor layer, an injection amount of charges into the conductor or semiconductor can be freely controlled, so that an effect of realizing multiple values is produced. In the case of the insulation film including one or more dots made of a conductor or semiconductor, writing and erasing is easily performed by charge direct tunneling, so that an effect of lower power consumption is obtained. Further, as an embodiment of the charge holding film, a ferroelectric film made of PZT, PLZT or the like in which a polarization direction changes according to an electric field may be used. In this case, in the surface of the ferroelectric film, charges are substantially generated by polarization and its state is held. Therefore, a hysteresis characteristic similar to that of a film for trapping charges supplied from the outside of a film on which the memory function is provided can be obtained. In addition, charge holding of the ferroelectric film does not require injection of charges from the outside and a hysteresis characteristic can be obtained only by polarization of the charges in the film. Thus, an effect that writing and erasing can be performed at high speed is produced.

Since the memory functional element includes the film having the function of holding charges and at least a part of the film having the function of holding charges overlap with the source/drain region, decrease in read current is suppressed. Therefore, the reading operation speed of the semiconductor storage device can be increased.

Further, in the case where the gate insulation film, the gate electrode and the memory functional element are formed on the semiconductor layer made by an SOI layer, the junction capacitance between the diffusion region and the body region can be reduced considerably, and higher speed of the device and lower power consumption can be realized.

In the case of using the semiconductor layer including the well region, while optimizing the impurity concentration immediately below the gate insulation film to memory operations (rewriting operation and reading operation), control of the other electric characteristics (withstand voltage, junction capacitance and short channel effect) is facilitated.

Further, when the memory functional element includes the charge holding film having the function of holding charges and the insulation film, dissipation of charges is prevented and the retention characteristic can be improved. As compared with the case where the memory functional element is constituted only by the charge holding film, the volume of the charge holding film can be properly reduced. By properly reducing the volume of the charge holding film, movement of charges in the charge holding film is limited and occurrence of a characteristic change due to movement of charges during storage holding can be suppressed. Therefore, the retention characteristic of the memory can be improved. By providing the charge holding film almost parallel with the surface of the gate insulation film in the memory functional element, easiness of formation of an inversion layer in an offset region according to an amount of charges accumulated in the charge holding film can be effectively controlled. Consequently, the memory effect can be increased. Since the charge holding film is disposed almost parallel with the surface of the gate insulation film, even when the offset amount varies, a change in the memory effect can be held relatively small. Thus, variations in the memory effect can be suppressed. Further, since the charge holding film is a film disposed almost parallel with the surface of the gate insulation film, upward movement of charges is suppressed. Therefore, occurrence of a characteristic change by movement of charges during storage holding can be suppressed. Therefore, a semiconductor storage device producing a high memory effect, with small variations, and having an excellent retention characteristic can be obtained.

In the case where the memory functional element further includes the charge holding film extended almost parallel with a side face of the gate electrode, the rewriting speed can be increased while preventing deterioration in the retention characteristic of the semiconductor storage device.

Further, in the case where the insulation film which partitions between the gate electrode and the charge holding film extending almost parallel with a side face of the gate electrode is included, movement of charges between the charge holding film extending almost parallel with a side face of the gate electrode and the gate electrode can be suppressed. Therefore, reliability of the semiconductor storage device can be increased.

Further, in the case where the insulation film which partitions between the charge holding film extending almost parallel with the gate insulation film surface and the channel region or the semiconductor layer is included, dissipation of charges accumulated in the charge holding film almost parallel with the surface of the gate insulation film is suppressed. Thus, the semiconductor storage device having a better retention characteristic can be obtained.

In the case where the insulation film partitioning between the charge holding film and the channel region or the semiconductor layer is thinner than the gate insulation film, without deteriorating the withstand voltage performance of the memory, the voltage of the writing and erasing operations can be decreased or the writing and erasing operations can be performed at higher speed, and the memory effect can be increased.

In the case where the insulation film partitioning between the charge holding film and the channel region or the semiconductor layer is thicker than the gate insulation film, without deteriorating the short channel effect of the memory, the retention characteristic can be improved.

Further, the first conductivity type semiconductor layer has a region having concentration of the impurity which gives the first conduction type, higher than that of a portion in the vicinity of the surface of the first conductivity type semiconductor layer under the gate electrode, below the memory functional element and in the vicinity of the source/drain region. Consequently, the junction between the diffusion region and the semiconductor layer is sharp immediately under the memory functional element. Therefore, hot carries are easily generated in the writing and erasing operations, voltages of the writing and erasing operations decrease or the writing operation and erasing operation can be performed at high speed. Further, since the impurity concentration immediately below the gate insulating film is relatively low, the threshold when the memory is in an erase state is low and the drain current is large. Consequently, reading speed improves. Thus, the semiconductor storage device having a low rewriting voltage or high rewriting speed and high reading speed can be obtained.

When a length of the gate electrode in a cut plane in a channel length direction is A, a channel length between the source/drain regions is B, and a distance from an end of one of the memory functional elements to an end of the other memory functional element is C, a relation of A<B<C is satisfied. Consequently, increase in the memory effect, increase in speed of reading operation, and reduction in the short channel effect are realized.

Further, in the case where each of the source/drain regions disposed on the side opposite to the gate electrode of the memory functional element are of the N type (P type), magnitude of a voltage applied to one of the source/drain regions and magnitude of a voltage applied to the other region are reversed between the time of changing a storage state by injecting electrons (holes) into the memory functional element and the time of reading the storage state of the memory functional element. Consequently, the storage state of a desired memory functional element can be detected with high sensitivity. Further, resistance to read disturbance is improved.

By providing a portable electronic apparatus with the semiconductor storage device of the invention, the function and operation speed can be improved. As the manufacturing cost is reduced, an inexpensive portable electronic apparatus can be obtained.

The invention claimed is:

1. A semiconductor storage device comprising:
a first conductivity type region formed in a semiconductor layer; a second conductivity type region formed in the semiconductor layer in contact with the first conductivity type region;
a memory functional element disposed on said semiconductor layer across the boundary of said first and second conductivity type regions; and
an electrode provided in contact with the memory functional element and on the first conductivity type region via an insulation film, wherein
the memory functional element or the sidewall insulation film is a film having the function of accumulating or trapping charges or the function of holding a charge polarized state, which is an insulator film including a silicon nitride film;
an insulator film having therein a conductor film or a semiconductor layer;
an insulator film having therein one or more dots made of a conductor or a semiconductor; or
a single layer or a lamination layer of an insulator film including a ferroelectric film in which internal charges are polarized by an electric field and its state is held.

2. A portable electronic apparatus comprising the semiconductor storage device to claim 1.

3. A semiconductor storage device comprising:
a first conductivity type region formed in a semiconductor layer;

two second conductivity type regions formed on both sides of the first conductivity type region in the semiconductor layer;

two memory functional elements each disposed on said semiconductor layer across the boundaries of said first and second conductivity type regions; and electrodes provided in contact with each of the memory functional elements and on the first conductivity type region via an insulation film, wherein the memory functional element or the sidewall insulation film is a film having the function of accumulating or trapping charges or the function of holding a charge polarized state, which is an insulator film including a silicon nitride film;

an insulator film having therein a conductor film or a semiconductor layer;

an insulator film having therein one or more dots made of a conductor or a semiconductor; or a single layer or a lamination layer of an insulator film including a ferroelectric film in which internal charges are polarized by an electric field and its state is held.

4. The semiconductor storage device according to claim 2, wherein charges are accumulated independently in each of the two memory functional elements, thereby storing information of two bits or more.

5. A semiconductor storage device comprising:

a channel region formed in a semiconductor layer;

variable resistance regions provided on both sides of the channel region;

two diffusion regions provided on both sides of the channel region via the variable resistance regions;

a gate electrode provided on the channel region via a gate insulation film; and two memory functional elements disposed on both sides of the gate electrode each across the variable resistance regions and a part of the diffusion regions, wherein the memory functional element or the sidewall insulation film is a film having the function of accumulating or trapping charges or the function of holding a charge polarized state, which is an insulator film including a silicon nitride film;

an insulator film having therein a conductor film or a semiconductor layer;

an insulator film having therein one or more dots made of a conductor or a semiconductor; or a single layer or a lamination layer of an insulator film including a ferroelectric film in which internal charges are polarized by an electric field and its state is held.

6. The semiconductor storage device according to claim 5, wherein the variable resistance region is set to be of a conductivity type different from a conductivity type of the diffusion region.

7. The semiconductor storage device according to claim 5, wherein a pinch-off point is formed in a region close to one of the memory functional elements in the channel region, thereby reading out information stored in the other memory functional element.

8. A semiconductor storage device comprising:

a gate electrode formed on a semiconductor layer via a gate insulation film;

a channel region provided under the gate electrode;

diffusion regions provided on both sides of the channel region and having a conductivity type different from the conductivity type of the channel region; and memory functional elements, for holding charges, formed on both sides of the gate electrode so as to overlap with said diffusion regions, wherein the memory functional element or the sidewall insulation film is a film having the function of accumulating or trapping charges or the function of holding a charge polarized state, which is an insulator film including a silicon nitride film;

an insulator film having therein a conductor film or a semiconductor layer;

an insulator film having therein one or more dots made of a conductor or a semiconductor; or a single layer or a lamination layer of an insulator film including a ferroelectric film in which internal charges are polarized by an electric field and its state is held.

9. A semiconductor storage device comprising at least one memory cell including:

a semiconductor layer disposed on a semiconductor substrate or a well region or an insulator provided in the semiconductor substrate;

a single gate electrode formed on the semiconductor substrate or the semiconductor layer via a gate insulation film;

a channel region provided under the gate electrode; two diffusion regions formed on both sides of the channel region; and two memory functional elements formed on both sides of said gate electrode so as to overlap with said diffusion regions, wherein the memory functional element or the sidewall insulation film is a film having the function of accumulating or trapping charges or the function of holding a charge polarized state, which is an insulator film including a silicon nitride film;

an insulator film having therein a conductor film or a semiconductor layer;

an insulator film having therein one or more dots made of a conductor or a semiconductor; or a single layer or a lamination layer of an insulator film including a ferroelectric film in which internal charges are polarized by an electric field and its state is held.

10. The semiconductor storage device according to claim 8 or 9, wherein the memory functional element changes at least resistance of the diffusion region positioned under said memory functional element to thereby change an amount of current flowing from one of the diffusion regions to the other diffusion region by applying a voltage to the gate electrode in accordance with the amount of charges held in said memory functional element.

11. The semiconductor storage device according to claim 8 or 9, wherein the memory functional element depletes at least a part of the diffusion region positioned under the memory functional element or inverts the conductivity type in accordance with the amount of charges held in said memory functional element.

12. A semiconductor storage device comprising at least one memory cell including:

a semiconductor layer disposed on a semiconductor substrate or a well region or an insulator provided in the semiconductor substrate;

a single gate electrode formed on the semiconductor substrate or the semiconductor layer via a gate insulation film;

a channel region provided under the gate electrode; two diffusion regions formed on both sides of the channel region; and two memory functional elements formed on both sides of said gate electrode so as to overlap with said diffusion regions, wherein one memory cell is constituted by only four terminals: one terminal connected to the semiconductor substrate or the well region provided in the semiconductor substrate or the semiconductor layer disposed on the insulator; two terminals connected to the two diffusion regions; and one terminal connected to the gate electrode.

13. A semiconductor storage device comprising at least one memory cell including:
a semiconductor layer disposed on a semiconductor substrate or a well region or an insulator provided in the semiconductor substrate;
a single gate electrode formed on the semiconductor substrate or the semiconductor layer via a gate insulation film;
a channel region provided under the gate electrode; two diffusion regions formed on both sides of the channel region; and
two memory functional elements formed on both sides of said gate electrode so as to overlap with said diffusion regions, wherein
any of reading, writing or erasing operation on one memory cell is performed by application of only four kinds of voltages: a voltage applied to the semiconductor substrate or the well region provided in the semiconductor substrate or said semiconductor layer disposed on insulator; a voltage applied to the gate electrode; and voltages respectively applied to the two diffusion regions.

14. A semiconductor storage device comprising at least one memory cell including:
a semiconductor layer disposed on a semiconductor substrate or a well region or an insulator provided in the semiconductor substrate;
a gate insulation film formed on the semiconductor layer which is disposed on the semiconductor substrate or the well region or insulator provided in the semiconductor substrate;
a single gate electrode formed on the gate insulation film;
a channel region provided just below the gate electrode;
two diffusion regions provided on both sides of the channel region; and
sidewall insulation films formed on both sides of said gate electrode so as to overlap with the diffusion regions,
wherein said sidewall insulation films have the function of holding charges, and
wherein
the memory functional element or the sidewall insulation film is a film having the function of accumulating or trapping charges or the function of holding a charge polarized state, which is an insulator film including a silicon nitride film;
an insulator film having therein a conductor film or a semiconductor layer;
an insulator film having therein one or more dots made of a conductor or a semiconductor; or
a single layer or a lamination layer of an insulator film including a ferroelectric film in which internal charges are polarized by an electric field and its state is held.

15. The semiconductor storage device according to claim 14, wherein the sidewall insulation film depletes at least a part of the diffusion region positioned below said sidewall insulation film or inverts the conductivity type in accordance with an amount of charges held in said sidewall insulation film.

16. The semiconductor storage device according to any one of claims 5,6,7,8,9,12,13,14 or 15, wherein information of four values is stored per one memory cell by the two memory functional elements.

17. The semiconductor storage device according to any one of claims 5,6,7,8,9,12,13,14 or 15, wherein a part of the diffusion region is extended at a level higher than the surface of the channel region, and at least a part of the memory functional element is sandwiched between the gate electrode and a part of said diffusion region.

18. The semiconductor storage device according to any one of claims 5,6,7,8,9,12,13,14 or 15, wherein an electrode wiring terminal is connected to the diffusion region, and at least a part of the memory functional element is sandwiched between the gate electrode and a part of the electrode wiring terminal connected to said diffusion region.

19. The semiconductor storage device according to any one of claims 5,6,7,8,9,12,13,14 or 15, wherein the diffusion region is disposed so as to be offset from an end of the gate electrode.

20. The semiconductor storage device according to any one of claims 5,6,7,8,9,12,13,14 or 15, wherein the diffusion region is disposed so as to overlap with the gate electrode or so that an end portion of the diffusion region is aligned with an end of the gate terminal.

21. The semiconductor storage device according to any one of claims 5,6,7,8,9,12,13,14 or 15, wherein the diffusion regions are made of an N-type semiconductor, one of the diffusion regions is set to a reference voltage, and the other diffusion region and the gate electrode are set to a voltage higher than the reference voltage, thereby enabling electrons to be injected into the memory functional element.

22. The semiconductor storage device according to any one of claims 5,6,7,8,9,12,13,14 or 15, wherein the diffusion regions are made of an N-type semiconductor, one of the diffusion regions is set to a reference voltage, the other diffusion region is set to a voltage higher than the reference voltage, and the gate electrode is set to a voltage lower than the reference voltage, thereby enabling holes to be injected into the memory functional element.

23. The semiconductor storage device according to any one of claims 5,6,7,8,9,12,13,14 or 15, wherein the diffusion regions are made of a P-type semiconductor, one of the diffusion regions is set to a reference voltage, and the other diffusion region and the gate electrode are set to a voltage lower than the reference voltage, thereby enabling holes to be injected into the memory functional element.

24. The semiconductor storage device according to any one of claims 5,6,7,8,9,12,13,14 or 15, wherein the diffusion regions are made of a P-type semiconductor, one of the diffusion regions is set to a reference voltage, the other diffusion region is set to a voltage lower than the reference voltage, and the gate electrode is set to a voltage higher than the reference voltage, thereby enabling electrons to be injected into the memory functional element.

25. A semiconductor storage device comprising:
a semiconductor substrate;
a first conductivity type well region formed in the semiconductor substrate;
a gate insulation film formed on the well region;
a plurality of word lines formed on the gate insulation film;
a plurality of second conductivity type diffusion regions formed on both sides of each of the word lines;
charge holding films having the function of accumulating or trapping charges, formed on both sides of said plurality of word lines on said word lines, said well region and said diffusion regions directly or via an insulation film on at least a part of the diffusion region or so as to extend on a part of said well region to a part of the diffusion region; and
a plurality of bit lines connected to said diffusion regions and extending in a direction which crosses said word lines, wherein
the memory functional element or the sidewall insulation film is a film having the function of accumulating or trapping charges or the function of holding a charge polarized state, which is an insulator film including a silicon nitride film;
an insulator film having therein a conductor film or a semiconductor layer:
an insulator film having therein one or more dots made of a conductor or a semiconductor; or
a single layer or a lamination layer of an insulator film including a ferroelectric film in which internal charges are polarized by an electric field and its state is held.

26. A semiconductor storage device comprising:
a semiconductor substrate;
a first conductivity type well region formed in the semiconductor substrate;
a gate insulation film formed on the well region;
a plurality of word lines formed on the gate insulation film;
a plurality of second conductivity type diffusion regions formed on both sides of each of the word lines;
charge holding films having the function of accumulating or trapping charges, formed on both sides of said plurality of word lines on said word lines, said well region and said diffusion regions directly or via an insulation film on at least a part of the diffusion region or so as to extend on a part of said well region to a part of the diffusion region; and
a plurality of bit lines connected to said diffusion regions and extending in a direction which crosses said word lines, wherein
the semiconductor substrate is an SOI substrate having a surface semiconductor layer, and the first conductivity type well region is formed as a body region in said surface semiconductor layer.

27. The semiconductor storage device according to claim 25 or 26, wherein the charge holding film is in contact with the diffusion region and/or the well region or the body region via the insulation film in the vicinity of an end of the word line.

28. The semiconductor storage device according to any one of claims 25 or 26, wherein the word line has a sidewall insulation film on a sidewall, and a part of the sidewall insulation film is formed as a charge holding film.

29. A manufacturing method of the semiconductor storage device according to claim 28, comprising the steps of:
forming a gate insulation film and a gate electrode on a semiconductor substrate;
depositing an insulation film having the function of accumulating or trapping charges on the whole surface of the obtained substrate; and
forming a sidewall insulation film on a sidewall of the gate electrode by selectively etching the insulation film.

30. A semiconductor storage device comprising:
a semiconductor substrate;
a first conductivity type well region formed in the semiconductor substrate;
a gate insulation film formed on the well region;
a plurality of word lines formed on the gate insulation film;
a plurality of second conductivity type diffusion regions formed on both sides of each of the word lines;
charge holding films having the function of accumulating or trapping charges, formed on both sides of said plurality of word lines on said word lines, said well region and said diffusion regions directly or via an insulation film on at least a part of the diffusion region or so as to extend on a part of said well region to a part of the diffusion region; and
a plurality of bit lines connected to said diffusion regions and extending in a direction which crosses said word lines, wherein
a lower end portion of the word line has a recess, and at least a part of the charge holding film is buried in said recess directly or via an insulation film.

31. A semiconductor storage device comprising:
a semiconductor substrate;
a first conductivity type well region formed in the semiconductor substrate;
a gate insulation film formed on the well region;
a plurality of word lines formed on the gate insulation film;
a plurality of second conductivity type diffusion regions formed on both sides of each of the word lines;
charge holding films having the function of accumulating or trapping charges, formed on both sides of said plurality of word lines on said word lines, said well region and said diffusion regions directly or via an insulation film on at least a part of the diffusion region or so as to extend on a part of said well region to a part of the diffusion region; and
a plurality of bit lines connected to said diffusion regions and extending in a direction which crosses said word lines, wherein
a part of the diffusion region is extended at a level higher than the under face of the gate insulation film and at least a part of the charge holding film is sandwiched between the word line and a part of said diffusion region.

32. An operating method of a semiconductor storage device comprising:
a single gate electrode formed on a P-type semiconductor layer disposed on a P-type semiconductor substrate, a P-type well region formed in the semiconductor substrate, or an insulator;
a channel region disposed under the single gate electrode;
two N-type source/drain regions positioned on both sides of the channel region; and
a memory functional element existing in the vicinity of the source/drain regions, wherein
one of the source/drain regions is set to a reference voltage, said gate electrode is set to a voltage lower than the reference voltage, said semiconductor layer formed on said semiconductor substrate, said well region formed in the semiconductor substrate, or the insulator is set to a voltage higher than the reference voltage, and the other source/drain region is set to a voltage higher than said semiconductor layer formed on said semiconductor substrate, said well region formed in the semiconductor substrate, or said insulator, thereby injecting holes into said memory functional element, and wherein
a memory functional element or a sidewall insulation film is a film having the function of accumulating or trapping charges or the function of holding a charge polarized state, which is a single layer or a lamination film of, an insulator film including a silicon nitride film;

an insulator film having therein a conductor film or a semiconductor layer;

an insulator film having therein one or more dots made of a conductor or a semiconductor; or an insulation film including a ferroelectric film in which internal charges are polarized by an electric field and its state is held.

33. An operating method of a semiconductor storage device comprising:

a single gate electrode formed on an N-type semiconductor layer disposed on an N-type semiconductor substrate, an N-type well region formed in the semiconductor substrate, or an insulator;

a channel region under the single gate electrode;

two P-type source/drain regions positioned on both sides of the channel region; and a memory functional element existing in the vicinity of the source/drain regions, wherein one of the source/drain regions is set to a reference voltage, said gate electrode is set to a voltage higher than the reference voltage, said semiconductor layer disposed on said semiconductor substrate, said well region formed in the semiconductor substrate, or the insulator is set to a voltage lower than the reference voltage, and the other source/drain region is set to a voltage lower than said semiconductor layer disposed on said semiconductor substrate, said well region formed in the semiconductor substrate, or the insulator, thereby injecting electrons into said memory functional element, and wherein a memory functional element or a sidewall insulation film is a film having the function of accumulating or trapping charges or the function of holding a charge polarized state, which is a single layer or a lamination film of, an insulator film including a silicon nitride film;

an insulator film having therein a conductor film or a semiconductor layer;

an insulator film having therein one or more dots made of a conductor or a semiconductor; or an insulation film including a ferroelectric film in which internal charges are polarized by an electric field and its state is held.

* * * * *